(12) United States Patent
Ehsan et al.

(10) Patent No.: US 11,761,102 B2
(45) Date of Patent: *Sep. 19, 2023

(54) ELECTROCHEMICAL WATER SPLITTING CELL

(71) Applicant: KING FAHD UNIVERSITY OF PETROLEUM AND MINERALS, Dhahran (SA)

(72) Inventors: Muhammad Ali Ehsan, Dhahran (SA); Abdul Rehman, Dhahran (SA)

(73) Assignee: KING FAHD UNIVERSITY OF PETROLEUM AND MINERALS, Dhahran (SA)

(*) Notice: Subject to any disclaimer, the term of this patent is extended or adjusted under 35 U.S.C. 154(b) by 0 days.

This patent is subject to a terminal disclaimer.

(21) Appl. No.: 17/938,417

(22) Filed: Oct. 6, 2022

(65) Prior Publication Data

US 2023/0051138 A1    Feb. 16, 2023

Related U.S. Application Data

(63) Continuation of application No. 16/401,793, filed on May 2, 2019, now Pat. No. 11,519,086.

(51) Int. Cl.
    *C25B 11/077*    (2021.01)
    *C25B 1/04*    (2021.01)
    (Continued)

(52) U.S. Cl.
    CPC ...... *C25B 11/0773* (2021.01); *C23C 16/4486* (2013.01); *C25B 1/04* (2013.01);
    (Continued)

(58) Field of Classification Search
    CPC .................................................... C25B 1/55
    See application file for complete search history.

(56) References Cited

U.S. PATENT DOCUMENTS 9,469,908 B2    10/2016    Rappe et al.
11,519,086 B2 *    12/2022    Ehsan ................ C25B 11/087
(Continued)

FOREIGN PATENT DOCUMENTS

| AU | 2009/261128 A1 | 12/2009 |
| KR | 20160107723 A | 9/2016 |
| WO | WO 2010/012488 A1 | 2/2010 |

OTHER PUBLICATIONS

M. Ehsan, et al. "Fabrication of CoTiO3—TiO2 composite films from a heterobimetallic single source precursor for electrochemical sensing of dopamine" Dalton Transactions, vol. 45, 2016, pp. 10222-10232.

(Continued)

*Primary Examiner* — Harry D Wilkins, III
(74) *Attorney, Agent, or Firm* — Oblon, McClelland, Maier & Neustadt, L.L.P.

(57) ABSTRACT

A $CaTiO_3$—$TiO_2$ composite electrode and method of making is described. The composite electrode comprises a substrate with an average 2-12 μm thick layer of $CaTiO_3$—$TiO_2$ composite particles having average diameters of 0.2-2.2 μm. The method of making the composite electrode involves contacting the substrate with an aerosol comprising a solvent, a calcium complex, and a titanium complex. The $CaTiO_3$—$TiO_2$ composite electrode is capable of being used in a photoelectrochemical cell for water splitting.

10 Claims, 38 Drawing Sheets

(51) Int. Cl.
    C25B 1/55        (2021.01)
    C25B 9/50        (2021.01)
    C23C 16/448      (2006.01)
    C25B 11/087      (2021.01)
    C25B 11/052      (2021.01)

(52) U.S. Cl.
    CPC .......... C25B 1/55 (2021.01); C25B 9/50 (2021.01); C25B 11/052 (2021.01); C25B 11/087 (2021.01)

(56) References Cited

U.S. PATENT DOCUMENTS

| | | |
|---|---|---|
| 2003/0137797 A1 | 7/2003 | Kimoto et al. |
| 2008/0137264 A1 | 6/2008 | Suzuki |
| 2010/0307593 A1 | 12/2010 | Thimsen |
| 2013/0168228 A1 | 7/2013 | Ozin |
| 2018/0369861 A1 | 12/2018 | Katori |

OTHER PUBLICATIONS

M. Ehsan, et al. "Fabrication of photoactive CaTiO3—TiO2 composite thin film electrodes via facile single step aerosol assisted chemical vapor deposit" Journal of Materials Science: Materials in Electronics, Nov. 17, 2018, pp. 1-14.

J. Lin, et al. "In situ hydrothermal etching fabrication of CaTiO3 on TiO2 nanosheets with heterojunction effects to enhance CO adsorption and photocatalytic reduction" Catalysis Science & Technology, 2019, pp. 1-2 (Abstract Only).

L. Ruan, et al. "The Transfer Direction of Photogenerated Electrons in BaTiO3/TiO2 and CaTiO3 /TiO2" Australian Journal of Chemistry, vol. 71, Issue 12, 2018, pp. 1-2 (Abstract Only).

D. Wei, et al. "Formation of CaTiO3/TiO2 Composite Coating on Titanium Alloy for Biomedical Applications" Journal of Biomedical Materials Research Part B: Applied Biomaterials, vol. 84, Issue 2, 2007, pp. 444-451.

X. Yan, et al. "Synthesis of Rodlike CaTiO3 with Enhanced Charge Separation Efficiency and High Photocatalytic Activity" International Journal of Electrochemical Science, Apr. 29, 2014, pp. 5155-5163.

C. Han, et al. "Photocatalytic activity of CaTiO3 synthesized by solid state, sol-gel and hydrothermal methods" J Sol-Gel Sci Technol, 2016, pp. 1-8.

Yang et al, The photoelectrochemical properties of N3 sensitized CaTiO3 modified TiO2 nanocrystalline electrodes, Electrochimica Acta, vol. 55, No. 1, Dec. 2009, pp. 305-310 (Year: 2009).

Bockute et al., The investigation of E-beam deposited titanium dioxide and calcium titanate thin films, Medziagotyra (Materials Science), Kaunas University of Technology, vol. 19, No. 3, Sep. 2013, pp. 245-249 (Year: 2013).

Cesconeto et al., Synthesis of CaTiO3 and CaTiO3/TiO2 nanoparticle compounds through Ca2+/TiO2 colloidal sols: Structural and photocatalytic characterization, Ceramics International, vol. 44, No. 1, Jan. 2018, pp. 301-309 (Year: 2018).

* cited by examiner

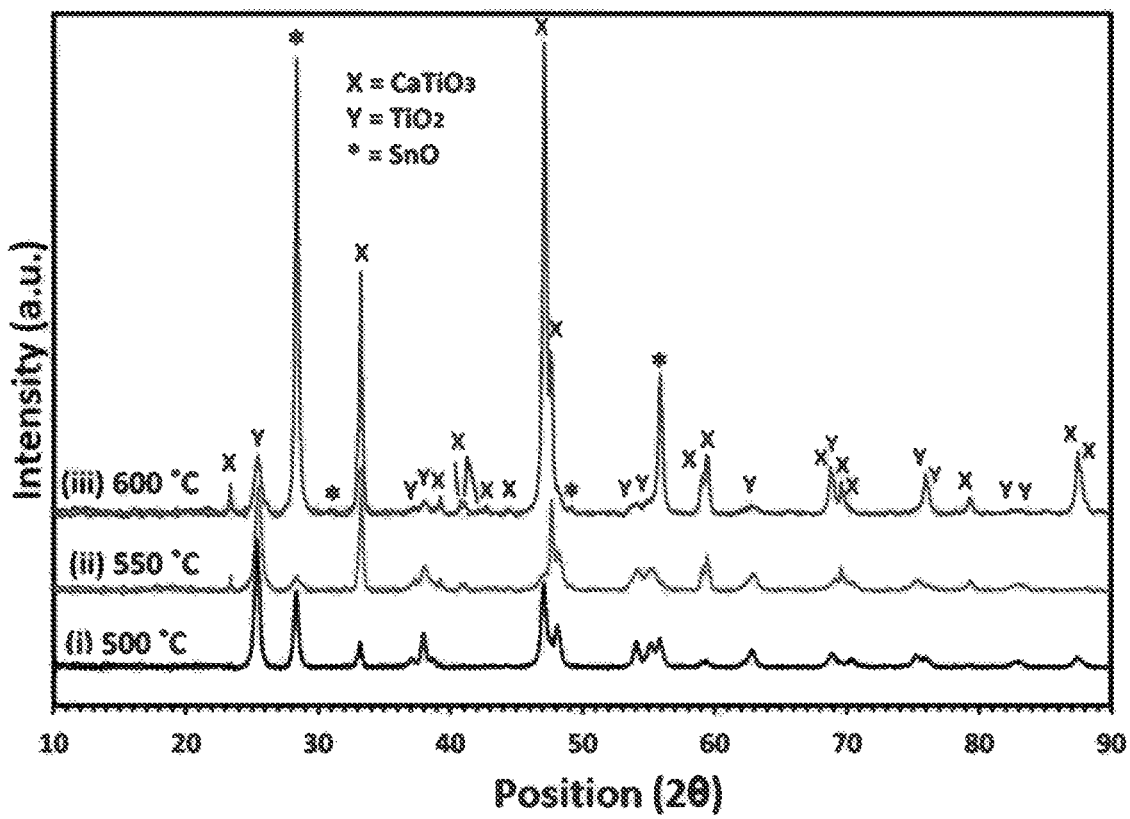
FIG. 4A
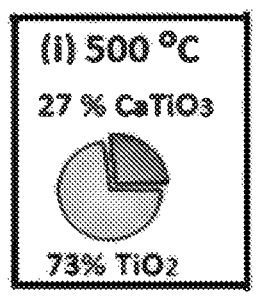 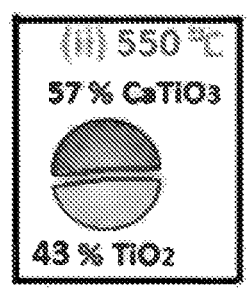 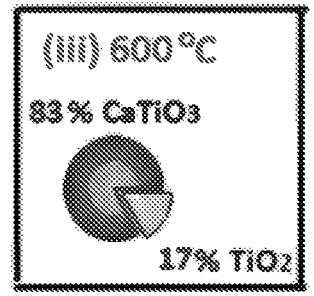
FIG. 4B          FIG. 4C          FIG. 4D

ELECTROCHEMICAL WATER SPLITTING CELL

CROSS-REFERENCE TO RELATED APPLICATIONS

The present application is a Continuation of U.S. application Ser. No. 16/401,793, now allowed, having a filing date of May 2, 2019.

STATEMENT REGARDING PRIOR DISCLOSURES BY THE INVENTORS

Aspects of this technology are described in an article "Fabrication of photoactive $CaTiO_3$—$TiO_2$ composite thin film electrodes via facile single step aerosol assisted chemical vapor deposition route" by Ehsan, M. A., Naeem, R., McKee, V., Rehman, A., Hakeem, A. S., and Mazhar, M. *J Mater Sci: Mater Electron* (2019) 30: 1411, doi: 10.1007/s10854-018-0411-4, which is incorporated herein by reference in its entirety.

STATEMENT OF ACKNOWLEDGEMENT

This project was prepared with financial support from the High-Impact Research scheme grant number: UM.C/625/1/HIR/242; FRGS grant number: FP039-2016; IPPP grant number: PG053-2016A; and HIR-MOHE grant number: UM.S/P/628/3SC21. AR acknowledges the start-up grant number: SR151005 from King Fand University of Petroleum & Minerals (KFUPM).

BACKGROUND OF THE INVENTION

Technical Field

The present invention relates to a method of making a composite thin film electrode that is capable of photocatalytic water splitting.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Photoelectrochemical (PEC) splitting of water for generating hydrogen is believed to be a safe and auspicious route for solar energy conversion. This technology relies on the sun, a long-lasting source of energy, while using ubiquitous water as a renewable energy resource. For the progression of PEC technology, efforts have been made to develop a robust and stable photocatalyst that can perform the water decomposition reaction at milder conditions to produce hydrogen, thus meeting industrial demands. See S. Chen, S. S. Thind, A. Chen, Electrochem. Commun. 63, 10-17 (2016); T. Hisatomi, J. Kubota, K. Domen, Chem. Soc. Rev. 43, 7520-7535 (2014); and X. Zou, Y. Zhang, Chem. Soc. Rev. 44, 5148-5180 (2015), each incorporated herein by reference in their entirety. In this regard, titanium dioxide ($TiO_2$) and various other Ti-based oxide semiconductors are extensively researched owing to their significant photocatalytic efficiency while being non-toxic, chemically stable, and low cost. See X. Chen, L. Liu and F. Huang, Chem. Soc. Rev. 44, 1861-1885 (2015); Y. Ma, X. Wang, Y. Jia, X. Chen, H. Han, C. Li, Chem. Rev. 114, 9987-10043 (2014); and E. Kalamaras, V. Dracopoulos, L. Sygellou, P. Lianos, Chem Eng J. 295, 288-294 (2016), each incorporated herein by reference in their entirety. Ti-based composites of alkaline earth metal titanates (e.g., $CaTiO_3$, $SrTiO_3$, and $BaTiO_3$) are considered better choices among them for splitting of water. The main reason of such popularity is their unique perovskite structure. See W. Wang, M. O. Tadé, Z. Shao, Chem. Soc. Rev. 44, 5371-5408 (2015); and S. S. Arbuj, R. R. Hawaldar, S. Varma, S. B. Waghmode, B. N. Wani, Sci. Adv. Mater. 4, 568-572 (2012), each incorporated herein by reference in their entirety. In such perovskite structures, the lowest part of the conduction band is mainly comprised of empty d orbitals of the transition-metal (e.g., $Ti^{4+}$) having a potential slightly negative than 0 V, which makes them capable of oxidizing water. See W. Wang, M. O. Tadé, Z. Shao, Chem. Soc. Rev. 44, 5371-5408 (2015), incorporated herein by reference in its entirety. However, a significant drawback of these perovskite photocatalyts is their limited light absorption capacity, which is linked to their poor charge separation efficiency. This is the result of their large band gap and high trapping density. See N. P. Dasgupta, J. Sun, C. Liu, S. Brittman, S. C. Andrews, J. Lim, H. Gao, R. Yan, P. Yang, Adv. Mater. 26, 2137-2184 (2014); O. A. Jaramillo-Quintero, M. S. de la Fuente, R. S. Sanchez, I. B. Recalde, E. J. Juarez-Perez, M. E. Rincon, I. Mora-Serb, Nanoscale 8, 6271-6277 (2016); and E. Grabowska, Appl. Catal. B. 186, 97-126 (2016), each incorporated herein by reference in their entirety. Two predominant strategies have been proposed in order to tackle these problems. See Dasgupta et al. (2014); and T. W. Kim, K.-S. Choi, Science 343, 990-994 (2014), each incorporated herein by reference in their entirety.

Firstly, the methods of bandgap engineering have been employed to have a band edge position alignment by the development of heterojunctions or by doping these materials with metal ions so as to configure these materials for spontaneous water splitting. See H. Zhang, G. Chen, Y. Li, Y. Teng, Int. J. Hydrogen Energy 35, 2713-2716 (2010); and A. Mumtaz, N. M. Mohamed, M. Mazhar, M. A. Ehsan, M. S. Mohamed Saheed, ACS Appl. Mater. Interfaces 2016, 8, 9037-9049, each incorporated herein by reference in their entirety. The perovskite-based photoanodes modified by this strategy (e.g., $SrTiO_3/Cu_2O$, $BaTiO_3/TiO_2$, and $CaTiO_3/Pt$) have shown enhanced photocatalytic activities, thereby utilizing the solar spectrum more successfully. See D. Sharma, S. Upadhyay, V. R. Satsangi, R. Shrivastav, U. V. Waghmare and S. Dass, J. Phys. Chem. C, 118, 25320-25329 (2014); W. Yang, Y. Yu, M. B. Starr, X. Yin, Z. Li, A. Kvit, S. Wang, P. Zhao, X. Wang, Nano letters 15, 7574-7580 (2015); and K. Shimura and H. Yoshida, Energy Environ. Sci. 3, 615-617 (2010), each incorporated herein by reference in their entirety. Secondly, synthetic strategies have been devised to enhance the separation of electron-hole pairs in photoanodes, both by crystal size reduction to the scale of the hole diffusion lengths and by increasing the carrier conductivity through morphological and crystallographic control. However, both approaches are confined by the limits of the fabrication method.

In this regard, aerosol assisted chemical vapor deposition (AACVD) has shown great promise in engineering the photoelectrodes with novel morphologies, high crystallinity, and controlled thickness. See A. A. Tahir, H. A. Burch, K. U. Wijayantha, B. G. Pollet, Tnt. J. Hydrogen Energy 38, 4315-4323 (2013); A. A. Tahir, M. Mat-Teridi, K. Wijayantha, Phys. Status Solidi Rapid Res. Lett. 8, 976-981 (2014);

and M. Mat-Teridi, A. A. Tahir, S. Senthilarasu, K. Wijayantha, M. Y. Sulaiman, N. Ahmad-Ludin, M. A. Ibrahim, K. Sopian, Phys. Status Solidi Rapid Res. Lett. 8, 982-986 (2014), each incorporated herein by reference in their entirety. AACVD is highly effective in constructing bi/multicomponent photoelectrodes with precise elemental stoichiometry, and it ensures the homogenous coupling of the bi or tri phases in a single step, leading to the reduction of the band gap of the material. See A. Mumtaz et al. (2016); M. A. Ehsan, H. Khaledi, A. Pandikumar, N. M. Huang, Z. Arifin, M. Mazhar J. Solid State Chem. 230, 155-162 (2015); and M. A. Mansoor, M. A. Ehsan, V. McKee, N.-M. Huang, M. Ebadi, Z. Arifin, W. J. Basirun, M. Mazhar J. Mater. Chem. A, 1, 5284-5292 (2013), each incorporated herein by reference in their entirety. The homogeneity and the size of the aerosol droplets can be tuned to have a control on the morphology of the resulting films. This is done by controlling the viscosity of the precursor solutions and the frequency of the aerosol generator during the AACVD process. See A. A. Tahir, K. U. Wijayantha, S. Saremi-Yarahmadi, M. Mazhar, V. McKee, Chem. Mater. 21, 3763-3772 (2009), incorporated herein by reference in its entirety. During deposition via AACVD, the particle growth and sintering processes simultaneously occur on the substrate surface to develop well interconnected morphological features and to produce adhesive film electrodes. This particle-particle or particle-conducting layer connection improves the electrical contacts and hence, the conductivity of the nanoparticle based thin films. The result is the enhanced charge transport properties of the resulting electrodes, thus exhibiting a better photocatalytic performance. See A. A. Tahir, T. Peiris, K. Wijayantha, Chem. Vap. Deposition 18, 107-111 (2012), incorporated herein by reference in its entirety. The demands of the AACVD technique are less stringent as compared to other film deposition methods; it only requires a metal-organic precursor which should be adequately soluble in any organic solvent.

Recently, magnesium dititanate ($MgTi_2O_5$) electrodes produced by AACVD showed enhanced PEC water splitting performance and prolonged electrochemical stability which motivated the development and assessment of the photo-electroactivity of $CaTiO_3$. See M. A. Ehsan, R. Naeem, V. McKee, A. S. Hakeem, M. Mazhar Sol. Energy Mater Sol. Cells 161, 328-337 (2017), incorporated herein by reference in its entirety. Calcium titanate ($CaTiO_3$), again having a perovskite structure, is actively involved in photocatalytic activities. See C. Han, J. Liu, W. Yang, Q. Wu, H. Yang, X. Xue, J. Sol-Gel Sci. Technol. 1-8 (2016), incorporated herein by reference in its entirety. It has a high reduction potential, which is even higher than that of the well-known $TiO_2$ photocatalyst. See J. Jang, P. Borse, J. S. Lee, K. Lim, 0. Jung, E. Jeong, J. Bae, H. Kim, Bull. Korean Chem. Soc. 32, 95-99 (2011), incorporated herein by reference in its entirety. This has led to significant recent research devoted to the photocatalytic performances of $CaTiO_3$ and its doped derivatives either for hydrogen production or photodecomposition of organic molecules. See X.-J. Huang, Y. Xin, H.-y. Wu, F. Ying, Y.-h. Min, W.-s. Li, S.-y. Wang, Z.-j. Wu, Trans. Nonferrous Met. Soc. China 26, 464-471 (2016); J. Shi and L. Guo, Pro. Nat. Sci-Mater. 22, 592-615 (2012); and H. Zhang, G. Chen, X. He, J. Xu, J. Alloys Compd. 516, 91-95 (2012), each incorporated herein by reference in their entirety. Recently a photocatalyst, $CaTiO_3$/Pt, was designed that demonstrated photocatalytic hydrogen production under a flow of water and methane. See K. Shimura et al. (2010). The photocatalytic activity of $CaTiO_3$ toward the degradation of organic pollutants is also well established. Yang et al. synthesized the nanocomposite of $CaTiO_3$-graphene and found an improved photocatalytic degradation of methyl orange. See T. Xian, H. Yang, Y. Huo, Phys. Scr. 89, 115801 (2014), incorporated herein by reference in its entirety.

Instead of metal titanates, other nanostructured mixed metal oxides have also shown great promise toward photocatalytic applications. Recently, nanostructured $YbVO_4$ and $YbVO_4/CuWO_4$ nanocomposites were successfully synthesized using a sonochemical method, and their behavior towards photo-destruction of methylene blue was evaluated. It has been observed that due to coupling of $CuWO_4$ into $YbVO_4$, photocatalytic and optical properties were improved which lead to improve photo-destruction efficiency for methylene blue from 65% to 100%, during 120 min irradiation. See M. Eghbali-Arani, A. Sobhani-Nasab, M. Rahimi-Nasrabadi, F. Ahmadi, S. Pourmasoud, Ultrason. Sonochem. 43, 120-135 (2018), incorporated herein by reference in its entirety. In a different study, $YbVO_4$ and nanocomposite $YbVO_4/NiWO_4$ in a variety of nano designs and sizes were produced by changing the polymeric capping agents. The resultant photo-catalysts efficiently performed photo-degradation of many organic dyes such as rhodamine B, methylene blue, methyl orange, and phenol red, under visible light. See S. Pourmasoud, A. Sobhani-Nasab, M. Behpour, M. Rahimi-Nasrabadi, F. Ahmadi, J. Mol. Struct. 1157, 607-615 (2018), incorporated herein by reference in its entirety. Moreover, different morphologies of novel $ZnLaFe_2O_4/NiTiO_3$ nanocomposites were fabricated using different surfactant agents such as cetrimonium bromide, sodium dodecyl sulfate, polyvinylpyrrolidone, polyvinyl alcohol, and oleic acid through a polyol assistant sol-gel method. This nanocomposite has antibacterial activity against Gram-negative *Escherchia coli* (ATCC 10536) and Gram-positive *Staphylococcus aureus* (ATCC 29737). Antibacterial results demonstrate that the nanocomposite significantly reduced the growth rate of *E. coli* bacteria and *S. aureus* after 120 min. See A. Sobhani-Nasab, Z. Zahraei, M. Akbari, M. Maddahfar, S. M. Hosseinpour-Mashkani, J. Mol. Struct. 1139, 430-435 (2017), incorporated herein by reference in its entirety.

In view of the forgoing, one objective of the present invention is the fabrication of $CaTiO_3$—$TiO_2$ electrodes by vaporizing a homogenous mixture of a self-designed Ca-precursor $[Ca_2(TFA)_3(OAc))(^iPrOH)(H_2O)(THF)_3]$, and $Ti(Pro)_4$ in methanol under AACVD conditions. The deposition of $CaTiO_3$—$TiO_2$ was conducted at three different temperatures of 500, 550, and 600° C. on fluorine doped tin oxide (FTO) coated conducting substrates in an air atmosphere. The composite oxide films were investigated by XRD, SEM, EDX, XPS, and UV-VIS spectrophotometry. The $CaTiO_3$—$TiO_2$ films are usable for photocatalytic water splitting applications.

BRIEF SUMMARY OF THE INVENTION

According to a first aspect, the present disclosure relates to a composite thin film electrode. The composite thin film electrode comprises a $CaTiO_3$—$TiO_2$ layer having an average thickness of 2-12 μm in contact with a substrate. The $CaTiO_3$—$TiO_2$ layer comprises crystalline $CaTiO_3$—$TiO_2$ particles having an average diameter of 0.2-2.2 μm, and the $CaTiO_3$—$TiO_2$ layer comprises 25-87 wt % $CaTiO_3$ and 13-75 wt % $TiO_2$, each relative to a total weight of the $CaTiO_3$—$TiO_2$ layer.

In one embodiment, the $CaTiO_3$—$TiO_2$ layer comprises 80-85 wt % $CaTiO_3$ and 15-20 wt % $TiO_2$, each relative to a total weight of the $CaTiO_3$—$TiO_2$ layer.

In one embodiment, the crystalline $CaTiO_3$—$TiO_2$ particles are substantially spherical.

In one embodiment, the $TiO_2$ is in anatase phase.

In one embodiment, the composite thin film electrode has a direct band gap value in a range of 2.5-3.5 eV.

In one embodiment, the substrate is a transparent conducting film selected from the group consisting of ITO, FTO, AZO, GZO, IZO, IZTO, IAZO, IGZO, IGTO, and ATO.

In one embodiment, the substrate has a sheet resistance in a range of 1-40 $\Omega sq^{-1}$.

According to a second aspect, the present disclosure relates to a method of making the composite thin film electrode of the first aspect. This method involves contacting an aerosol with a substrate to deposit a crystalline $CaTiO_3$—$TiO_2$ composite layer on the substrate to form the composite thin film electrode. The aerosol comprises a carrier gas and a calcium complex and a titanium complex dissolved in a solvent, and the substrate has a temperature in a range of 400-650° C. during the contacting.

In one embodiment, the calcium complex comprises trifluoroacetate ligands, acetate ligands, isopropanol ligands, and tetrahydrofuran ligands.

In a further embodiment, the calcium complex has a formula $[Ca_2(TFA)_3(OAc))(^iPrOH)(H_2O)(THF)_3]$.

In one embodiment, before the contacting, the aerosol consists essentially of the carrier gas, the calcium complex, the titanium complex, and the solvent.

In one embodiment, the calcium complex and the solvent are present in the aerosol at a weight ratio of 1:1,000-1:5.

In one embodiment, the titanium complex and the solvent are present in the aerosol at a weight ratio of 1:10,000-1:5.

In one embodiment, the aerosol is contacted with the substrate for a time period of 10-120 min.

In one embodiment, during the contacting, the carrier gas has a flow rate in a range of 20-250 mL/min.

According to a third aspect, the present disclosure relates to an electrochemical cell, which is made of the composite thin film electrode of the first aspect, a counter electrode, and an electrolyte solution in contact with both electrodes.

In one embodiment, the electrolyte solution comprises water and an inorganic base having a concentration of 0.5-1.5 M.

In one embodiment, the composite thin film electrode has a current density of 0.45-0.8 $mA/cm^2$ when the electrodes are subjected to a bias potential of 0.6-0.8 V and an illumination of 80-150 $mW/cm^2$.

In one embodiment, the composite thin film electrode has a charge transfer resistance in a range of 200-400$\Omega$ when the electrodes are subjected to an illumination of 80-150 $mW/cm^2$.

According to a fourth aspect, the present disclosure relates to a method of photocatalytic water splitting. This involves irradiating the electrochemical cell of the third aspect with sunlight.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 4A shows XRD peak patterns of $CaTiO_3$—$TiO_2$ composite oxide films deposited on FTO glass substrates at different temperatures via AACVD.

FIG. 4B shows the crystalline proportion of the phases involved in composite films formed at 500° C.

FIG. 4C shows the crystalline proportion of the phases involved in composite films formed at 550° C.

FIG. 4D shows the crystalline proportion of the phases involved in composite films formed at 600° C.

DETAILED DESCRIPTION OF THE EMBODIMENTS

Figure 1:
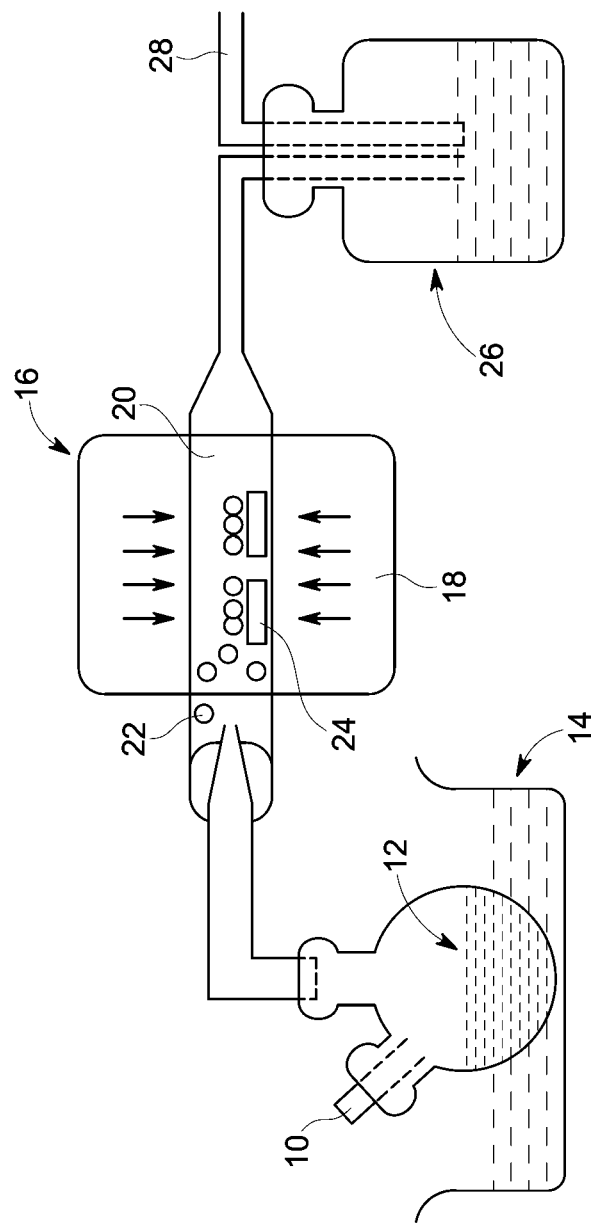
FIG. 1 is a schematic illustration of the AACVD setup used for synthesis of $CaTiO_3$—$TiO_2$ composite films.

Embodiments of the present disclosure will now be described more fully hereinafter with reference to the accompanying drawings, in which some, but not all embodiments of the disclosure are shown.

The present disclosure will be better understood with reference to the following definitions. As used herein, the words "a" and "an" and the like carry the meaning of "one or more." Within the description of this disclosure, where a numerical limit or range is stated, the endpoints are included unless stated otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the words "about," "approximately," or "substantially similar" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), +/−15% of the stated value (or range of values), or +/−20% of the stated value (or range of values). Within the description of this disclosure, where a numerical limit or range is stated, the endpoints are included unless stated otherwise. Also, all values and subranges within a numerical limit or range are specifically included as if explicitly written out.

As used herein, "compound" and "complex" are each intended to refer to a chemical entity, whether as a solid, liquid, or gas, and whether in a crude mixture or isolated and purified.

As used herein, "composite" refers to a combination of two or more distinct constituent materials into one. The individual components, on an atomic level, remain separate and distinct within the finished structure. The materials may have different physical or chemical properties, that when combined, produce a material with characteristics different from the original components. In some embodiments, a composite may have at least two constituent materials that comprise the same empirical formula but are distinguished by different densities, crystal phases, or a lack of a crystal phase (i.e. an amorphous phase).

The present disclosure is intended to include all hydration states of a given compound or formula, unless otherwise noted or when heating a material. For example, Ni(NO$_3$)$_2$ includes anhydrous $Ni(NO_3)_2$, $Ni(NO_3)_2 \cdot 6H_2O$, and any other hydrated forms or mixtures. $CuCl_2$ includes both anhydrous $CuCl_2$ and $CuCl_2 \cdot 2H_2O$.

In addition, the present disclosure is intended to include all isotopes of atoms occurring in the present compounds and complexes. Isotopes include those atoms having the same atomic number but different mass numbers. By way of general example, and without limitation, isotopes of hydrogen include deuterium and tritium. Isotopes of carbon include $^{13}C$ and $^{14}C$. Isotopes of nitrogen include $^{14}N$ and $^{15}N$. Isotopes of oxygen include $^{16}O$, $^{17}O$, and $^{18}O$. Isotopes of titanium include $^{44}Ti$, $^{46}Ti$, $^{47}Ti$, $^{48}Ti$, $^{49}Ti$, and $^{50}Ti$. Isotopes of calcium include $^{40}Ca$, $^{41}ca$, $^{42}Ca$, $^{43}Ca$, $^{44}Ca$, $^{45}Ca$, $^{46}Ca$, $^{47}Ca$, and $^{48}Ca$. Isotopically-labeled compounds of the disclosure may generally be prepared by conventional techniques known to those skilled in the art or by processes analogous to those described herein, using an appropriate isotopically-labeled reagent in place of the non-labeled reagent otherwise employed.

As defined here, an aerosol is a suspension of solid or liquid particles in a gas. An aerosol includes both the particles and the suspending gas. Primary aerosols contain particles introduced directly into the gas, while secondary aerosols form through gas-to-particle conversion. There are several measures of aerosol concentration. Environmental science and health fields often use the mass concentration (M), defined as the mass of particulate matter per unit volume with units such as $\mu g/m^3$. Also commonly used is the number concentration (N), the number of particles per unit volume with units such as $number/m^3$ or $number/cm^3$. The size of particles has a major influence on their properties, and the aerosol particle radius or diameter ($d_p$) is a key property used to characterize aerosols. Aerosols vary in their dispersity. A monodisperse aerosol, producible in the laboratory, contains particles of uniform size. Most aerosols, however, as polydisperse colloidal systems, exhibit a range of particle sizes. Liquid droplets are almost always nearly spherical, but scientists use an equivalent diameter to characterize the properties of various shapes of solid particles, some very irregular. The equivalent diameter is the diameter of a spherical particle with the same value of some physical property as the irregular particle. The equivalent volume diameter ($d_e$) is defined as the diameter of a sphere of the same volume as that of the irregular particle. Also commonly used is the aerodynamic diameter. The aerodynamic diameter of an irregular particle is defined as the diameter of the spherical particle with a density of $1000 \ kg/m^3$ and the same settling velocity as the irregular particle.

As defined here, an electrode is an electrically conductive material comprising a metal and is used to establish electrical contact with a nonmetallic part of a circuit. An "electrically-conductive material" as defined here is a substance with an electrical resistivity of at most $10^{-6}$ $\Omega \cdot m$, preferably at most $10^{-7}$ $\Omega \cdot m$, more preferably at most $10^{-8}$ $\Omega \cdot m$ at a temperature of 20-25° C. The electrically-conductive material comprise platinum-iridium alloy, iridium, titanium, titanium alloy, stainless steel, gold, cobalt alloy, copper, aluminum, tin, iron, and/or some other metal.

According to a first aspect, the present disclosure relates to a composite thin film electrode. The composite thin film electrode may also be called a photoactive composite thin film electrode, a $CaTiO_3$—$TiO_2$ composite thin film electrode, or a photoactive $CaTiO_3$—$TiO_2$ composite thin film electrode. The composite thin film electrode comprises a $CaTiO_3$—$TiO_2$ layer in contact with a substrate.

The $CaTiO_3$—$TiO_2$ layer comprises or is in the form of crystalline $CaTiO_3$—$TiO_2$ particles. In one embodiment, at least 80 wt %, preferably at least 85 wt %, more preferably at least 95 wt % of the $CaTiO_3$—$TiO_2$ is crystalline $CaTiO_3$ and crystalline $TiO_2$. Where the $CaTiO_3$—$TiO_2$ layer and/or particles comprise less than 100 wt % crystalline $CaTiO_3$ and crystalline $TiO_2$, the remaining $CaTiO_3$ and/or $TiO_2$ may be in an amorphous (non-crystalline) phase.

In one embodiment, the layer has an average thickness of 2-12 µm, preferably 5-11 µm, more preferably 7-10 µm, or about 9 µm. However, in some embodiments, the layer may have a thickness of less than 2 µm or greater than 12 µm. In one embodiment, the thickness of the layer may vary from location to location on the electrode by 1-30%, preferably 5-20%, relative to an average thickness of the layer.

In one embodiment, the $CaTiO_3$—$TiO_2$ layer comprises 25-87 wt % $CaTiO_3$ and 13-75 wt % $TiO_2$, each relative to a total weight of the $CaTiO_3$—$TiO_2$ layer. In other embodiments, the $CaTiO_3$—$TiO_2$ layer comprises 45-86.5 wt % $CaTiO_3$, preferably 65-86.0 wt % $CaTiO_3$, more preferably 75-85.5 wt % $CaTiO_3$, and 13.5-55 wt % $TiO_2$, preferably 14.0-35 wt % $TiO_2$, more preferably 14.5-25 wt % $TiO_2$, each relative to a total weight of the $CaTiO_3$—$TiO_2$ layer.

In one embodiment, the $CaTiO_3$—$TiO_2$ layer comprises 80-85 wt % $CaTiO_3$, preferably 81-84 wt % $CaTiO_3$, or about 83 wt % $CaTiO_3$, and 15-20 wt % $TiO_2$, preferably 16-19 wt % $TiO_2$, or about 17 wt % $TiO_2$, each relative to a total weight of the $CaTiO_3$—$TiO_2$ layer.

In one embodiment, the $CaTiO_3$—$TiO_2$ layer consists essentially of $CaTiO_3$ and $TiO_2$, meaning that the $CaTiO_3$—$TiO_2$ comprises at least 99.5 wt %, preferably at least 99.8 wt % $CaTiO_3$ and $TiO_2$, relative to a total weight of the $CaTiO_3$—$TiO_2$ layer.

The $CaTiO_3$—$TiO_2$ particles may leave pores or open spaces when packed in the $CaTiO_3$—$TiO_2$ layer. In one embodiment, the $CaTiO_3$—$TiO_2$ layer may have a porosity in a range of 10-70%, preferably 20-60%. In a related embodiment, the $CaTiO_3$—$TiO_2$ layer may have a surface area per mass $CaTiO_3$—$TiO_2$ of 80-350 $m^2/g$, preferably 100-250 $m^2/g$, even more preferably 120-220 $m^2/g$.

In one embodiment, the $CaTiO_3$—$TiO_2$ particles are substantially spherical, meaning that the distance from the particle centroid to anywhere on the outer surface varies by less than 30%, preferably less than 20%, or less than 10%. In alternative embodiments, one or more $CaTiO_3$—$TiO_2$ particles may be shaped like cylinders, boxes, spikes, flakes, plates, ellipsoids, toroids, stars, ribbons, discs, rods, granules, prisms, cones, flakes, platelets, sheets, or some other shape. In one embodiment, the individual $CaTiO_3$—$TiO_2$ particles comprise both $CaTiO_3$ and $TiO_2$. In an alternative embodiment, some $CaTiO_3$—$TiO_2$ particles may comprise some particles with a higher concentration of $CaTiO_3$ than the bulk average and may comprise other particles with higher concentration of $TiO_2$ than the bulk average. In one embodiment, individual $CaTiO_3$—$TiO_2$ particles may be considered nanocomposites, where the particle has regions of $CaTiO_3$ and $TiO_2$ interspersed throughout the particle. These regions maybe considered nanodomains, and may have an average diameter in a range of 10-100 nm, 15-90 nm, or 20-80 nm.

In one embodiment, the $CaTiO_3$—$TiO_2$ particles may have an average diameter or average longest dimension in a range of 0.2-2.2 µm, preferably 0.4-1.5 µm, more preferably 0.5-1.0 µm, or about 0.75 µm. However, in alternative embodiments, the $CaTiO_3$—$TiO_2$ particles may have an average diameter or average longest dimension of less than 0.2 µm or greater than 2.2 µm.

In one embodiment, the $CaTiO_3$—$TiO_2$ particles may have an average Wadell sphericity value in a range of 0.3 to 0.9, or 0.3 to 0.8. The Wadell sphericity of a particle is defined by the ratio of the surface area of a sphere (which has the same volume as the given particle) to the surface area of the particle. The values of Wadell sphericity range from 0 to 1, where a value of 1 is a perfect sphere, and particles become less spherical as their sphericity approaches a value of 0. The Wadell sphericity may be approximated by $$\Psi \approx \left(\frac{bc}{a^2}\right)^{1/3},$$

where a, b, and c are the lengths of the long, intermediate, and short axes, respectively of an individual particle.

In one embodiment, the $CaTiO_3$—$TiO_2$ particles are monodisperse, having a coefficient of variation or relative standard deviation, expressed as a percentage and defined as the ratio of the particle diameter standard deviation ($\sigma$) to the particle diameter mean ($\mu$), multiplied by 100%, of less than 25%, preferably less than 10%, preferably less than 8%, preferably less than 6%, preferably less than 5%. In a preferred embodiment, the $CaTiO_3$—$TiO_2$ particles are monodisperse having a particle diameter distribution ranging from 80% of the average particle diameter to 120% of the average particle diameter, preferably 85-115%, preferably 90-110% of the average particle diameter. In another embodiment, the $CaTiO_3$—$TiO_2$ particles are not monodisperse.

$CaTiO_3$ may be called calcium titanate or perovskite. $TiO_2$ exists in three crystalline phases: anatase, rutile, and brookite, which may be determined by XRD patterns. Mixtures of $TiO_2$ polymorphs may have different photocatalytic activities compared to those of the pure phases, because of variations in electron-hole separation properties. In one embodiment, the $TiO_2$ of the composite thin film electrode may be primarily anatase, for instance, at least 70 wt %, preferably at least 80 wt %, more preferably at least 90 wt %, even more preferably at least 95 wt % or about 100 wt % of the total $TiO_2$ weight is anatase phase $TiO_2$. In one embodiment, the $TiO_2$ comprises at least 90% anatase phase $TiO_2$. In one embodiment, the $TiO_2$ may be multiphasic. The term "multiphasic," as used herein, refers to a compound comprising two or more types of amorphous and/or crystalline phases. Biphasic compounds and triphasic compounds may be referred to as multiphasic compounds. In embodiments where the $TiO_2$ of the composite thin film electrode comprises less than 100 wt % anatase phase, the other phases may be rutile, brookite, or amorphous $TiO_2$. In a preferred embodiment, the $TiO_2$ is in anatase phase.

In one embodiment, the composite thin film electrode has a direct band gap value in a range of 2.5-3.5 eV, preferably 2.6-3.4 eV, more preferably 2.7-3.3 eV even more preferably 2.8-3.2 eV, or about 3.0 eV.

In one embodiment, the substrate is a transparent conducting film selected from the group consisting of ITO (indium tin oxide), FTO (fluorine-doped tin oxide), AZO (aluminum-doped zinc oxide), GZO (gallium-doped zinc oxide), IZO (indium zinc oxide), IZTO (indium zinc tin oxide), TAZO (indium aluminum zinc oxide), IGZO (indium gallium zinc oxide), IGTO (indium gallium tin oxide), and ATO (antimony tin oxide). In other embodiments, transparent conducting polymers (such as PEDOT) or carbon nanotubes may be used with or in place of the compounds previously mentioned. In a preferred embodiment, the substrate is FTO. The transparent conducting film may have an average thickness of 1 μm-1 mm, preferably 10 μm-900 μm, more preferably 200 μm-800 μm, or about 600 μm. Alternatively, the transparent conducting film may have an average thickness of 500 nm-200 μm, preferably 1-100 μm, more preferably 10 μm-50 μm. However, in some embodiments, the conductive layers may have an average thickness of less than 500 nm. For instance, the conductive layers may have an average thickness of 50-500 nm, 80-300 nm, or 100-250 nm. Preferably the transparent conducting film is attached to an additional support, such as a glass slide. However, in other embodiments, the substrate may be glass, quartz, ceramic, a metal, a composite material, or a polymeric material having temperature resistance at least up to the temperature of the substrate heating. Where the substrate comprises glass, the glass may be boro-aluminosilicate glass, sodium borosilicate glass, fused-silica glass, soda lime glass, or some other type of glass.

In one embodiment, the substrate has a sheet resistance in a range of 1-40 $\Omega sq^{-1}$, preferably 2-20 $\Omega sq^{-1}$, more preferably 4-12 $\Omega sq^{-1}$, or about 8 $\Omega sq^{-1}$. Preferably, the $CaTiO_3$—$TiO_2$ particles in contact with the substrate form an electrically-conductive material with the conductive layer. An "electrically-conductive material" as defined here is a substance with an electrical resistivity of at most $10^{-6}$ $\Omega \cdot m$, preferably at most $10^{-7}$ $\Omega \cdot m$, more preferably at most $10^{-8}$ $\Omega \cdot m$ at a temperature of 20-25° C.

According to a second aspect, the present disclosure relates to a method of making the composite thin film electrode of the first aspect. This method involves contacting an aerosol with a substrate to deposit a crystalline $CaTiO_3$—$TiO_2$ composite layer on the substrate to form the composite thin film electrode. As described here, "contacting an aerosol with a substrate" is considered to be synonymous with "contacting a substrate with an aerosol." Both phrases mean that the substrate is exposed to the aerosol, so that a portion of the suspended particles of the aerosol directly contact the substrate. Contacting may also be considered equivalent to "introducing" or "depositing," such as "depositing an aerosol on a substrate." In one embodiment, the contacting may be considered aerosol-assisted chemical vapor deposition (AACVD). In one embodiment, the method of making the composite thin film electrode may be considered a one-step method, as the formation of the $CaTiO_3$—$TiO_2$ composite layer takes place immediately following and/or during the contacting of the aerosol with the substrate.

In one embodiment, the temperature of the substrate during the contacting is in a range of 400-650° C., preferably 450-640° C., more preferably 500-630° C., even more preferably 570-620° C., or about 600° C. In one embodiment, the temperature of the substrate during the contacting never reaches a temperature of greater than 650° C., preferably 625° C., more preferably 610° C.

The aerosol comprises a carrier gas, a calcium complex, a titanium complex, and a solvent. In one embodiment, the aerosol consists of, or consists essentially of, a carrier gas, a calcium complex, a titanium complex, and a solvent before the contacting, preferably immediately before the contacting. Preferably, the calcium complex and titanium complex are dissolved or dispersed in the solvent. In some embodiments, the calcium complex and titanium complex are dissolved in the same aerosol droplets. In other embodiments, some aerosol droplets may consist of the calcium complex and solvent, and other aerosol droplets may consist of titanium complex and solvent.

In one embodiment, the calcium complex comprises trifluoroacetate (TFA) ligands, acetate ligands (OAc), isopropanol ($^i$PrOH) ligands, tetrahydrofuran (THF) ligands, and water ($H_2O$) ligands. In one embodiment, a molar ratio of TFA ligands to Ca in the calcium complex is in a range of 1:1-2:1, or about 3:2. In one embodiment, a molar ratio of acetate ligands to Ca in the calcium complex is in a range of 1:4-2:1, or about 1:2. In one embodiment, a molar ratio of isopropanol ligands to calcium is in a range of 1:4-2:1, or about 1:2. In one embodiment, a molar ratio of $H_2O$ ligands to calcium is in a range of 1:4-2:1, or about 1:2. In one embodiment, a molar ratio of THF ligands to calcium is in a range of 1:4-2:1, or about 3:2. In a further embodiment, the calcium complex has a formula $[Ca_2(TFA)_3(OAc))(^iPrOH)(H_2O)(THF)_3]$, which may also be represented as $C_{15}H_{21}Ca_2F_9O_{11}\cdot 2(C_4H_8O)$. In alternative embodiments, the calcium complex may not comprise one or more of the ligands trifluoroacetate, acetate, isopropanol, tetrahydrofuran, or water, and in other embodiments, one or more ligands may be substituted with other ligands, such as ethanol. In other alternative embodiments, calcium salts such as CaO, $CaCl_2$, or $CaC_2O_4$ may be used in place of or in addition to the calcium complex. In one embodiment, the calcium complex and the solvent are present in the aerosol at a calcium complex to solvent weight ratio of 1:1000-1:5, preferably 1:500-1:10, more preferably 1:200-1:15, even more preferably 1:100-1:20, or about 1:23.

In one embodiment, the titanium complex may be $TiB_2$, TiBr, TiC, $TiCl_4$, $Ti(ClO_4)_4$, $TiF_4$, $H_2\,TiF_6$, $TiH_4$, $TiI_4$, $Ti(NMe_2)_4$, $Ti(NO_3)_4$, $TiO_2$, $H_4TiO_4$, $Ti_4(OCH_2\,CH_3)_{16}$, $Ti(OCH_2CH_2CH_2CH_3)_4$, $KTiOPO_4$, $NiO \cdot Sb_2O_3 \cdot 20TiO_2$, $TiS_2$, $TiSe_2$, $TiSi_2$, titanium(IV) isopropoxide, or some other titanium compound. Preferably the titanium complex is titanium(IV) isopropoxide, and may be abbreviated as $Ti(Pro)_4$. In one embodiment, the titanium complex and the solvent are present in the aerosol at a titanium complex to solvent weight ratio of 1:10,000-1:5, preferably 1:1,000-1:20, more preferably 1:800-1:100, even more preferably 1:500-1:150, or about 1:206.

In an alternative embodiment, rather than a calcium complex and a titanium complex existing as separate molecules, a single molecule comprising both calcium and titanium may be used.

In one embodiment, the carrier gas is $N_2$, He, compressed air, and/or Ar. Preferably the carrier gas is compressed air.

In one embodiment, the solvent may be toluene, tetrahydrofuran, acetic acid, acetone, acetonitrile, butanol, dichloromethane, chloroform, chlorobenzene, dichloroethane, diethylene glycol, diethyl ether, dimethoxy-ethane, dimethyl-formamide, dimethyl sulfoxide, ethanol, ethyl acetate, ethylene glycol, heptane, hexamethylphosphoramide, hexamethylphosphorous triamide, methanol, methyl t-butyl ether, methylene chloride, pentane, cyclopentane, hexane, cyclohexane, benzene, dioxane, propanol, isopropyl alcohol, pyridine, triethyl amine, propandiol-1,2-carbonate, ethylene carbonate, propylene carbonate, nitrobenzene, formamide, γ-butyrolactone, benzyl alcohol, n-methyl-2-pyrrolidone, acetophenone, benzonitrile, valeronitrile, 3-methoxy propionitrile, dimethyl sulfate, aniline, n-methylformamide, phenol, 1,2-dichlorobenzene, tri-n-butyl phosphate, ethylene sulfate, benzenethiol, dimethyl acetamide, N,N-dimethylethaneamide, 3-methoxypropionnitrile, diglyme, cyclohexanol, bromobenzene, cyclohexanone, anisole, diethylformamide, 1-hexanethiol, ethyl chloroacetate, 1-dodecanthiol, di-n-butylether, dibutyl ether, acetic anhydride, m-xylene, o-xylene, p-xylene, morpholine, diisopropyl etheramine, diethyl carbonate, 1-pentandiol, n-butyl acetate, and/or 1-hexadecanthiol. In one embodiment, the solvent comprises pyridine, N,N-dimethylformamide (DMF), N,N-dimethylacetamide, N-methyl pyrrolidone (NMP), hexamethylphosphoramide (HMPA), dimethyl sulfoxide (DMSO), acetonitrile, tetrahydrofuran (THF), 1,4-dioxane, dichloromethane, chloroform, carbon tetrachloride, dichloroethane, acetone, ethyl acetate, pentane, hexane, decalin, dioxane, benzene, toluene, xylene, o-dichlorobenzene, diethyl ether, methyl t-butyl ether, methanol, ethanol, ethylene glycol, isopropanol, propanol, and/or n-butanol. In a preferred embodiment, the solvent is acetone, methanol, ethanol, and/or isopropanol. More preferably the solvent is methanol, and in another embodiment, the solvent consists essentially of methanol.

In one embodiment, the solvent may comprise water. The water used as a solvent or for other purposes may be tap water, distilled water, bidistilled water, deionized water, deionized distilled water, reverse osmosis water, and/or some other water. In one embodiment the water is bidistilled or treated with reverse osmosis to eliminate trace metals. Preferably the water is bidistilled, deionized, deionized distilled, or reverse osmosis water, and at 25° C. has a conductivity of less than 10 $\mu S \cdot cm^{-1}$, preferably less than 1 $\mu \cdot cm^{-1}$; a resistivity of greater than 0.1 $M\Omega \cdot cm$, preferably greater than 1 $M\Omega \cdot cm$, more preferably greater than 10 $M\Omega \cdot cm$; a total solid concentration of less than 5 mg/kg, preferably less than 1 mg/kg; and a total organic carbon concentration of less than 1000 μg/L, preferably less than 200 μg/L, more preferably less than 50 μg/L.

Preferably the solvent and the calcium complex and/or titanium complex are able to form an appropriately soluble solution that can be dispersed in the carrier gas as aerosol particles. For instance, the calcium complex and/or titanium complex may first be dissolved in a volume of solvent, and then pumped through a jet nozzle in order to create an aerosol mist. In other embodiments, the mist may be generated by a piezoelectric ultrasonic generator. Other nebulizers and nebulizer arrangements may also be used, such as concentric nebulizers, cross-flow nebulizers, entrained nebulizers, V-groove nebulizers, parallel path nebulizers, enhanced parallel path nebulizers, flow blurring nebulizers, and piezoelectric vibrating mesh nebulizers. In one embodiment, the mixtures of the calcium complex and solvent, and the titanium complex and solvent, are introduced as separate aerosols, for instance, produced by separate nozzles or nebulizers. Preferably, however, the calcium complex and titanium complex are mixed together in the same solvent prior to producing the aerosol.

In one embodiment, the aerosol may have a mass concentration M, of 10 $\mu g/m^3$-1,000 $mg/m^3$, preferably 50 $\mu g/m^3$-1,000 $\mu g/m^3$. In one embodiment, the aerosol may have a number concentration N, in a range of $10^3$-$10^6$, preferably $10^4$-$10^5$ $cm^{-3}$. In other embodiments, the aerosol may have a number concentration of less than $10^3$ or greater than $10^6$. The aerosol particles or droplets may have an equivalent volume diameter ($d_e$) in a range of 20 nm-100 μm, preferably 0.5-70 μm, more preferably 1-50 μm, though in some embodiments, aerosol particles or droplets may have an average diameter of smaller than 0.2 μm or larger than 100 μm.

In one embodiment, the aerosol and substrate do not comprise or contact hydrogen gas or a reducing agent during the contacting and/or depositing. In a related embodiment, the aerosol and substrate do not comprise or contact hydrogen gas or a reducing agent immediately prior to the contacting and/or depositing. In one embodiment, the reaction chamber where the depositing takes place is essentially free of hydrogen gas and a reducing agent immediately prior to the contacting. In one embodiment, an intermediate reducing agent is created during the contacting.

In a related embodiment, before the contacting and/or depositing, the aerosol consists essentially of the carrier gas, the solvent, the titanium complex, and the calcium complex, meaning that at least 99.9 wt %, preferably at least 99.99 wt %, or 100 wt % of the aerosol is carrier gas, solvent, titanium complex, or calcium complex, relative to a total weight of the aerosol.

In one embodiment, the aerosol is contacted with the substrate for a time period of 10-120 min, preferably 20-100 min, more preferably 30-90 min, even more preferably 45-75 min, or about 60 min. However, in some embodiments, the aerosol may be contacted with the substrate for a time period of less than 10 min or greater than 120 min.

In one embodiment, during the contacting of the aerosol, the carrier gas has a flow rate in a range of 0.1 to 10 mL/s, preferably 0.5 to 7.5 mL/s, more preferably 1.5 to 5.0 mL/s, even more preferably 2.0-4.0 mL/s, or about 2.5 mL/s (equivalently 150 cm$^3$/min). However, in some embodiments, the carrier gas flow rate may be less than 0.1 mL/s or greater than 10 mL/s. Preferably, the aerosol has a flow rate similar to the carrier gas, with the exception of the portion of aerosol that gets deposited on the substrate. In one embodiment, the aerosol may enter the chamber and the flow rate may be stopped, so that a portion of aerosol may settle on the substrate.

In one embodiment, the aerosol is contacted with the substrate in a reaction chamber. The flow of the carrier gas and aerosol may have a gas hourly space velocity in a range of 10-1,000 h$^{-1}$, preferably 50-500 h$^{-1}$, more preferably 100-130 h$^{-1}$.

The contacting and/or introducing may take place within a closed chamber or reactor, and the aerosol may be generated by dispersing a solution of the calcium complex and/or titanium complex and solvent. In one embodiment, this dispersing may be increased by fans, jets, or pumps. However, in another embodiment, an aerosol may be formed in a closed chamber with a substrate where the aerosol particles are allowed to diffuse towards or settle on the substrate. The substrate may have an area in a range of 0.5-4 cm$^2$, preferably 1.0-3 cm$^2$, more preferably 1.5-3 cm$^2$. In one embodiment, the closed chamber or reactor may have a length of 10-100 cm, preferably 12-30 cm, and a diameter or width of 1-10 cm, preferably 2-5 cm. In other embodiments, the closed chamber or reactor may have an interior volume of 0.2-100 L, preferably 0.3-25 L, more preferably 0.5-10 L. In one embodiment, the closed chamber or reactor may comprise a cylindrical glass vessel, such as a glass tube.

Being in a closed chamber, the interior pressure of the chamber (and thus the pressure of the aerosol) may be controlled. The pressure may be practically unlimited, but need not be an underpressure or an overpressure. Preferably the chamber and substrate are heated and held at a temperature prior to the contacting, so that the temperature may stabilize. The chamber and substrate may be heated for a time period of 5 min-1 hr, preferably 10-20 min prior to the contacting.

During the contacting of the aerosol, the CaTiO$_3$—TiO$_2$ composite layer may form at a rate of 0.1 to 20, 0.2 to 18, 0.4 to 16, 0.5 to 14, 0.6 to 12, 0.7 to 10, 0.8 to 9, 3 to 15, 1.0 to 8, 1.5 to 5, or 2 to 3 nm/s, and/or at least 0.01, 0.05, 0.1, 0.2, 0.4, 0.5, 0.6, 0.8, 1.0, 1.5, 1.75, 2, 2.5, 3.33, 3.5, 4, 4.5, 5, 6.5, 7, 7.5, 7.75, 8, 8.25, 8.5, 8.75, 9, or 10 nm/s.

In one embodiment, the method of making the composite thin film electrode may further comprise a step of cooling the composite thin film electrode after the contacting. The composite thin film electrode may be cooled to a temperature between 10 to 45° C., 20 to 40° C., or 25 to 35° C. under an inert gas (such as N$_2$ or Ar) over a time period of 0.5 to 5 h, 0.75 to 4 h, 1 to 3 h, 1.25 to 2.5 h, or 1.5 to 2 h.

In one embodiment, the method of making the composite thin film electrode may further comprise a step of preparing the calcium complex before the contacting. The calcium complex may be synthesized by methods described herein, or by mixing Ca(OAc)$_2$, Ti($^i$Pro)$_4$, and trifluoroacetic acid in THF to form a mixture. The mixture may be stirred for 0.5-6 h, preferably 1-3 h under an inert atmosphere of N$_2$ or Ar gas. The reaction mixture may then be dried to yield the calcium complex, or alternatively, the reaction mixture may be dried, resuspended in THF, and then dried a second time to yield the calcium complex.

An example AACVD setup is illustrated in FIG. 1. Here, a container of the Ca—Ti precursor solution 12 is connected to a carrier gas supply 10 and placed in an ultrasonic humidifier 14. Aerosol droplets 22 are carried into a reactor tube 20. The reactor tube 20 is positioned in a tube furnace 16 with heating zones 18. The aerosol droplets 22 deposit on substrate slides 24 within the reactor tube 20. To support a flow of aerosol, the reactor tube 20 is also connected to a gas trap 26 and an exhaust line 28.

According to a third aspect, the present disclosure relates to an electrochemical cell, which is made of the composite thin film electrode of the first aspect, a counter electrode, and an electrolyte solution in contact with both electrodes.

In one embodiment, the electrochemical cell is a vessel having an internal cavity for holding the electrolyte solution. The vessel may be cylindrical, cuboid, frustoconical, spherical, or some other shape. The vessel walls may comprise a material including, but not limited to, glass, polypropylene, polyvinyl chloride, polyethylene, and/or polytetrafluoroethylene, and the vessel walls may have a thickness of 0.1-3 cm, preferably 0.1-2 cm, more preferably 0.2-1.5 cm. The internal cavity may have a volume of 2 mL-100 mL, preferably 2.5 mL-50 mL, more preferably 3 mL-20 mL. In another embodiment, for instance, for small scale or benchtop anodization, the internal cavity may have a volume of 100 mL-50 L, preferably 1 L-20 L, more preferably 2 L-10 L. In another embodiment, for instance, for pilot plant anodization, the internal cavity may have a volume of 50 L-10,000 L, preferably 70 L-1,000 L, more preferably 80 L-2,000 L. In another embodiment, for instance, for industrial plant-scale anodization, the internal cavity may have a volume of 10,000 L-500,000 L, preferably 20,000 L-400,000 L, more preferably 40,000 L-100,000 L. In one embodiment, one or more electrochemical cells may be connected to each other in parallel and/or in series. In another embodiment, the electrolyte solution may be in contact with more than composite thin film electrode and/or more than one counter electrode.

The counter electrode may comprise platinum, gold, or some other metal. Preferably the counter electrode is a platinum wire. The counter electrode may also be called an auxiliary electrode. Unless otherwise noted, the phrase "the electrodes" refers to both the composite thin film electrode and the counter electrode.

In one embodiment, the counter electrode comprises gold, platinum, or carbon. In a further embodiment, the counter electrode comprises platinum. In one embodiment, the counter electrode may be in the form of a wire, a rod, a cylinder, a tube, a scroll, a sheet, a piece of foil, a woven mesh, a perforated sheet, or a brush. The counter electrode may be polished in order to reduce surface roughness or may be texturized with grooves, channels, divots, microstructures, or nanostructures.

In another further embodiment, where the counter electrode comprises platinum, the counter electrode is in the form of rod or wire. Alternatively, the counter electrode may comprise some other electrically-conductive material such as platinum-iridium alloy, iridium, titanium, titanium alloy, stainless steel, gold, cobalt alloy and/or some other electrically-conductive material, where an "electrically-conductive material" as defined here is a substance with an electrical resistivity of at most $10^{-6}$ Ω·m, preferably at most $10^{-7}$ Ω·m, more preferably at most $10^{-8}$ Ω·m at a temperature of 20-25° C.

In a preferred embodiment, the counter electrode has at least one outer surface comprising an essentially inert, electrically conducting chemical substance, such as platinum, gold, or carbon. In another embodiment, the counter electrode may comprise solid platinum, gold, or carbon. The form of the counter electrode may be generally relevant only in that it needs to supply sufficient current to the electrolyte solution to support the current required for electrochemical reaction of interest. The material of the counter electrode should thus be sufficiently inert to withstand the chemical conditions in the electrolyte solution, such as acidic or basic pH values, without substantially degrading during electrochemical or photoelectrochemical processes. The counter electrode preferably should not leach out any chemical substance that interferes with the electrochemical reaction or might lead to undesirable contamination of either electrode.

In a further embodiment, where the counter electrode comprises platinum, the counter electrode may be in the form of a mesh. In one embodiment, the counter electrode in the form of a mesh may have a nominal aperture or pore diameter of 0.05-0.6 mm, preferably 0.1-0.5 mm, more preferably 0.2-0.4 mm, and/or a wire diameter of 0.01-0.5 mm, preferably 0.08-0.4 mm, more preferably 0.1-0.3 mm. In other embodiments, the counter electrode may be considered a gauze with a mesh number of 40-200, preferably 45-150, more preferably 50-100. In other embodiments, the counter electrode may be in the form of a perforated sheet or a sponge. In one embodiment, the counter electrode may be in the form of a mesh with one or more bulk dimensions (length, width, or thickness) as previously described.

Preferably, the counter electrode is in the form of a rod or wire. The rod or wire may have straight sides and a circular cross-section, similar to a cylinder. A ratio of the length of the rod or wire to its width may be 1,500:1-1:1, preferably 500:1-2:1, more preferably 300:1-3:1, even more preferably 200:1-4:1. The length of the rod or wire may be 0.5-50 cm, preferably 1-30 cm, more preferably 3-20 cm, and a long wire may be coiled or bent into a shape that allows the entire wire to fit into an electrochemical cell. The diameter of the rod or wire may be 0.5-20 mm, preferably 0.8-8 mm, more preferably 1-3 mm. In some embodiments, a rod may have an elongated cross-section, similar to a ribbon or strip of metal.

Preferably the electrochemical cell also includes a reference electrode in contact with the electrolyte solution. A reference electrode is an electrode which has a stable and well-known electrode potential. The high stability of the electrode potential is usually reached by employing a redox system with constant (buffered or saturated) concentrations of each relevant species of the redox reaction. A reference electrode may enable a potentiostat to deliver a stable voltage to the working electrode or the counter electrode. The reference electrode may be a standard hydrogen electrode (SHE), a normal hydrogen electrode (NILE), a reversible hydrogen electrode (RHE), a saturated calomel electrode (SCE), a copper-copper(II) sulfate electrode (CSE), a silver chloride electrode (Ag/AgCl), a pH-electrode, a palladium-hydrogen electrode, a dynamic hydrogen electrode (DHE), a mercury-mercurous sulfate electrode, or some other type of electrode. In a preferred embodiment, a reference electrode is present and is a silver chloride electrode (Ag/AgCl).

In one embodiment, the electrolyte solution comprises water and an inorganic base The inorganic base may be NaOH, KOH, LiOH, $Mg(OH)_2$, $Ca(OH)_2$, $Ba(OH)_2$, $NH_4OH$, or some other inorganic base. Preferably the inorganic base is NaOH. In alternative embodiments, an organic base may be used, such as sodium carbonate or sodium acetate. The inorganic base may have a concentration of 0.5-1.5 M, preferably 0.75-1.25 M, more preferably 0.9-1.1 M, or about 1.0 M. In other embodiments, the electrolyte solution may comprise some other salt, in addition to or in place of the inorganic base. The salt may comprise at least one cation selected from the group consisting of $K^+$, $Na^+$, $Li^+$, $Cu^{2+}$, $Ag^+$, $Ni^{2+}$, $Co^{2+}$, $Co^{3+}$, $Zn^{2+}$, $Sn^{2+}$, $Pb^{2+}$, $Fe^{2+}$, $Fe^{3+}$, $Cr^{2+}$, and $Cr^{3+}$. The counter ion of the salt may be $SO_4^{2-}$, $Br^-$, $NO_3^-$, $OH^-$, $Cl^-$, acetate, or some other anion. The salt may have a concentration of 0.02-1.0 M, preferably 0.05-0.8 M, more preferably 0.08-0.5 M, or about 0.1 M, though in some embodiments, the concentration may be less than 0.02 M or greater than 1.0 M.

In a preferred embodiment, the electrolyte solution may have a total volume of 1 mL-10 L, preferably 5 mL-1 L, more preferably 10 mL-500 mL, even more preferably 15 mL-300 mL.

In one embodiment, the composite thin film electrode has a width and/or length in contact with the electrolyte solution of 0.1-5.0 cm, preferably 0.3-4.0 cm, more preferably 0.5-3.0. The composite thin film electrode may have a surface area of 0.5-10 $cm^2$, preferably 0.7-5 $cm^2$, more preferably 1-3 $cm^2$ in contact with the electrolyte solution.

In one embodiment, the composite thin film electrode has a current density of 0.45-0.80 $mA/cm^2$, preferably 0.50-0.70 $mA/cm^2$, more preferably 0.55-0.65 $mA/cm^2$, or about 0.61 $mA/cm^2$ when the electrodes are subjected to a bias potential of 0.6-0.8 V and an illumination power density of 80-150 $mW/cm^2$, 90-110 $mW/cm^2$, preferably 95-105 $mW/cm^2$, more preferably 98-102 $mW/cm^2$, or about 100 $mW/cm^2$.

The source of the illumination may be a solar simulator that may use a xenon arc lamp or a halogen lamp. In one embodiment, the radiation source may be fitted with a dichroic reflector and/or an optical filter in order to better reproduce solar light illumination, such as illumination having an AM1.5G spectrum, which may be known as the "global standard" spectrum.

As described here, the air mass coefficient (AM) defines the direct optical path length through the Earth's atmosphere, expressed as a ratio relative to the path length vertically upwards, i.e. at the zenith. The air mass coefficient can be used to help characterize the solar spectrum after solar radiation has traveled through the atmosphere. The air mass coefficient is commonly used to characterize the performance of solar cells under standardized conditions, and is often referred to using the syntax "AM" followed by a number. The air mass number is dependent on the Sun's elevation path through the sky and therefore varies with time of day and with the passing seasons of the year, and with the latitude of the observer. For characterizing terrestrial power-generating panels, the "AM1.5" standard is commonly used for illumination. "AM1.5" represents sunlight through a 1.5 atmosphere thickness, which corresponds to a solar zenith angle of 48.2°. The spectrum may be similar to those defined by ASTM G-173 and IEC 60904 standards. In other embodiments, the illumination may have an AM1.5D spectrum, which is known as the "direct standard" spectrum. In alternative embodiments, a different illumination standard may be used, such as AM0, AM1, AM2, AM3, or AM38.

In one embodiment, when the composite thin film electrode of the electrochemical cell is illuminated as above, the composite thin film electrode has a charge transfer resistance ($R_{ct}$) in a range of 200-400Ω, preferably 200-400Ω, more preferably 200-400Ω.

According to a fourth aspect, the present disclosure relates to a method of photocatalytic water splitting. In general, photocatalytic water splitting is an artificial photosynthesis process with photocatalysis in a photoelectrochemical cell used for the dissociation of water into its constituent parts, $H_2$ and $O_2$, using either artificial or natural light. Here, this method involves irradiating the electrochemical cell of the third aspect with sunlight. Alternatively, the electrochemical cell may be irradiated with light from a gas discharge lamp (such as a mercury vapor lamp, a xenon lamp, an argon lamp, or a metal halide lamp), a laser, an LED, and/or an incandescent bulb. In one embodiment, a lamp as a solar simulator may be used.

In one embodiment, the solar simulator output to the composite thin film electrode may be 40-160 mW/cm$^2$, preferably 50-150 mW/cm$^2$, more preferably 90-110 mW/cm$^2$, or about 100 mW/cm$^2$.

During the irradiating, a bias voltage of 0.5-0.9 V, preferably 0.6-0.8 V, or about 0.7 V may be applied to the composite thin film electrode and the counter electrode. Preferably the composite thin film electrode functions as the cathode, receiving a negative potential to reduce water into $H_2$ gas and $OH^-$, while the counter electrode functions as the anode, receiving a positive potential to oxidize $OH^-$ into $O_2$ gas and $H_2O$. This is summarized by the following reactions:

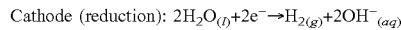

Cathode (reduction): $2H_2O_{(l)} + 2e^- \rightarrow H_{2(g)} + 2OH^-_{(aq)}$

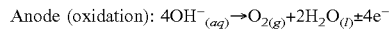

Anode (oxidation): $4OH^-_{(aq)} \rightarrow O_{2(g)} + 2H_2O_{(l)} \pm 4e^-$

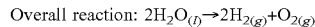

Overall reaction: $2H_2O_{(l)} \rightarrow 2H_{2(g)} + O_{2(g)}$

In another embodiment, the potentials may be switched, wherein the composite thin film electrode functions as the anode and receives a positive potential, and the counter electrode functions as the cathode and receives a negative potential. In an alternative embodiment, the electrodes may be subjected to an alternating current (AC) in which the anode and cathode roles are continually switched between the two electrodes.

In one embodiment, the potential may be applied to the electrodes by a battery, such as a battery comprising one or more electrochemical cells of alkaline, lithium, lithium-ion, nickel-cadmium, nickel metal hydride, zinc-air, silver oxide, and/or carbon-zinc. In another embodiment, the potential may be applied through a potentiostat or some other source of direct current, such as a photovoltaic cell. In one embodiment, a potentiostat may be powered by an AC adaptor, which is plugged into a standard building or home electric utility line. In one embodiment, the potentiostat may connect with a reference electrode in the electrolyte solution. Preferably the potentiostat is able to supply a relatively stable voltage or potential. For example, in one embodiment, the electrochemical cell is subjected to a voltage that does not vary by more than 5%, preferably by no more than 3%, preferably by no more than 1.5% of an average value throughout the subjecting. In another embodiment, the voltage may be modulated, such as being increased or decreased linearly, being applied as pulses, or being applied with an alternating current. Preferably, the composite thin film electrode may be considered the working electrode with the counter electrode being considered the auxiliary electrode. However, in some embodiments, the composite thin film electrode may be considered the auxiliary electrode with the counter electrode being considered the working electrode.

In one embodiment, the method further comprises the step of separately collecting $H_2$-enriched gas and $O_2$-enriched gas. In one embodiment, the space above each electrode may be confined to a vessel in order to receive or store the evolved gases from one or both electrodes. The collected gas may be further processed, filtered, or compressed. Preferably the $H_2$-enriched gas is collected above the cathode, and the $O_2$-enriched gas is collected above the anode. The electrolytic cell, or an attachment, may be shaped so that the headspace above the composite thin film electrode is kept separate from the headspace above the reference electrode. In one embodiment, the $H_2$-enriched gas and the $O_2$-enriched gas are not 100 vol % $H_2$ and 100 vol % $O_2$, respectively. For example, the enriched gases may also comprise $N_2$ from air, and water vapor and other dissolved gases from the electrolyte solution. The $H_2$-enriched gas may also comprise $O_2$ from air. The $H_2$-enriched gas may comprise greater than 20 vol % $H_2$, preferably greater than 40 vol % $H_2$, more preferably greater than 60 vol % $H_2$, even more preferably greater than 80 vol % $H_2$, relative to a total volume of the receptacle collecting the evolved $H_2$ gas. The $O_2$-enriched gas may comprise greater than 20 vol % $O_2$, preferably greater than 40 vol % $O_2$, more preferably greater than 60 vol % $O_2$, even more preferably greater than 80 vol % $O_2$, relative to a total volume of the receptacle collecting the evolved $O_2$ gas. In some embodiments, the evolved gases may be bubbled into a vessel comprising water or some other liquid, and higher concentrations of $O_2$ or $H_2$ may be collected. In one embodiment, evolved $O_2$ and $H_2$, or $H_2$-enriched gas and $O_2$-enriched gas, may be collected in the same vessel.

Several parameters for the method for decomposing water may be modified to lead to different reaction rates, yields, and other outcomes. These parameters include, but are not limited to, electrolyte type and concentration, pH, pressure, solution temperature, current, voltage, stirring rate, electrode surface area, size of $CaTiO_3$—$TiO_2$ particles, thickness of the $CaTiO_3$—$TiO_2$ layer, and exposure time. A variable DC current may be applied at a fixed voltage, or a fixed DC current may be applied at a variable voltage. In some instances, AC current or pulsed current may be used. A person having ordinary skill in the art may be able to adjust these and other parameters, to achieve different desired nanostructures. In other embodiments, the electrochemical cell may be used for other electrochemical reactions or analyses.

In an alternative embodiment, the composite thin film electrode may be used in the field of batteries, fuel cells, photochemical cells, water splitting cells, electronics, water purification, hydrogen sensors, semiconductors (such as field effect transistors), magnetic semiconductors, capacitors, data storage devices, biosensors (such as redox protein sensors), photovoltaics, liquid crystal screens, plasma screens, touch screens, OLEDs, antistatic deposits, optical coatings, reflective coverings, anti-reflection coatings, and/or reaction catalysis. Similarly, in one embodiment, the composite thin film electrode may be coated with another material. For example, the composite thin film electrode may be coated with a layer of gold. A gold-coated composite thin film electrode may then be used for analyte detection using surface enhanced Raman scattering (SERS).

The examples below are intended to further illustrate protocols for preparing, characterizing the composite thin film electrode, and uses thereof, and are not intended to limit the scope of the claims.

Example 1

Materials and Methods

All the reagents and chemicals were supplied by Sigma-Aldrich. All the chemicals were used as received except (THF), δ=2.12 [s, 1H, OH] (1PrOH), δ=1.12 ppm [d, 6H, $CH_3$] ($^i$PrOH), δ=1.83 ppm [s, 12H, $CH_2$] (THF), δ=1.96 ppm [s, 3H, $CH_3$] (OAc), $^{19}$F NMR (MeOH): δ=−76.94 ppm [s, 9F, $CF_3$]. IR: $v_{max}$/cm$^{-1}$ 3326 br, 2983w, 2886w, 1665s, 1452s, 1194s, 1141s, 1038s, 884s, 796s, 719s, 652s, 607s, 520w, 463w. TGA: 70-120° C. (3.0% wt. loss); 135-235° C. (28.0% wt. loss); 238-500° C. (51.0% wt. loss), (Residual mass of 18.0%); (Ca1. for CaO All characterization and analysis results are summarized in Table 1.

TABLE 1

Analysis and characterization of complex [$Ca_2(TFA)_3(OAc)$)($^i$PrOH)($H_2O$)($THF)_3$] (1)

| Single crystal analysis | $^1$H-NMR (ppm) | $^{19}$F-NMR (ppm) | IR (cm$^{-1}$) | TGA Temp. vs % wt. loss |
|---|---|---|---|---|
| Determination of chemical formula $C_{15}H_{21}Ca_2F_9O_{11}$•2 ($C_4H_8O$) | δ = 3.87 [m, H, CH] ($^i$PrOH) | δ = −76.94 [s, 9F, $CF_3$] | 3326 (O—H) 2983, 2886 | 1$^{st}$ step : 70-120° C. (3.0 % wt. loss) |
| | δ = 2.12 | | (C—H of $^i$PrOH) | 2$^{nd}$ step: 135-235° C. (28.0 % wt. loss) |
| | [s, 1H, OH] ($^i$PrOH) | | 1665, 1452 (C = O of $CF_3COO^-$) | 3$^{rd}$ step: 238-500° C. (51.0 % wt. loss) |
| | δ = 1.12 [d, 6H, $CH_3$] ($^i$PrOH) | | 1538, 1370 (C=O of $CH_3COO^-$) | Residual mass of 18.0% = CaO |
| | δ = 3.68 [t, 12H, $OCH_2$] (THF) | | 1194 (C—F) | |
| | δ =1.83 ppm [s, 12H, $CH_2$] (THF) | | 1141 (C—O) | |
| | δ =1.96 ppm [s, 3H, $CH_3$] (OAc) | | | | tetrahydrofuran, which was rigorously dried over sodium benzophenoate and distilled immediately before use. All the synthetic work was carried out in Schlenk tubes fitted with the vacuum lines, using hot plates for temperature control, and using dry argon for an inert atmosphere. The controlled thermal analyses were performed on a Perkin Elmer TGA 4000 thermogravimetric analyzer equipped with a computer interface. These high temperature measurements were carried out in ceramic crucibles under an inert atmosphere of flowing nitrogen (flow rate=25 mL min$^{-1}$) with a temperature ramping of 10° C. min$^{-1}$. The melting point determinations were made in a capillary tube using an electrothermal apparatus from Mitamura Riken Kogyo (Japan) Model: MP. D. Fourier transform infra-red (FT-IR) spectra were recorded using a single reflectance ATR instrument (4000-450 cm$^{-1}$, resolution 4 cm$^{-1}$). NMR spectra were obtained using a JEOL DELTA2 NMR spectrometer. These experiments were performed at a field strength of 400 MHz in Methanol-D4 as the solvent.

Example 2

Experimental—Synthesis of [$Ca_2(TFA)_3(OAc)(^iProH)(H_2O)(THF)_3$] (1)

In an effort to synthesize a heterobimetallic Ca—Ti complex, a mixture of $Ca(OAc)_2$·$2H_2O$ (0.5 g, 2.63 mmol), Ti($^i$Pro)$_4$ (1.55 mL, 5.26 mmol) and trifluoroacetic acid (0.58 mL, 7.90 mmol) in 20 mL THF was stirred for 2 h in a schlenk tube under an inert atmosphere of dry argon.

The reaction mixture was evaporated under vacuum which resulted in a white powder. This material was re-dissolved in THF. The transparent solution obtained was cannula-filtered and placed overnight at room temperature to obtain colourless block shaped crystals of complex (1) (75% yield).

Mp: 220° C. (decomposition) $^1$H NMR (MeOH): δ=3.87 ppm [m, H, CH] ($^i$PrOH), δ=3.68 ppm [t, 12H, $OCH_2$]

Example 3

Experimental—Single-Crystal X-Ray Crystallographic Analyses

Single crystal X-ray data was collected at 150(2) K on a SYNERGY, DUALFLEX, ATLASS2 Diffractometer using CuK$_\alpha$ radiation (λ=1.54184 Å) and was corrected for the effects of Lorentz-polarization and absorption. Using ShelXle, the structure of the resulting crystals was solved and refined by dual space methods (SHELXT) as an inversion twin, on F$^2$ using all the reflections (SHELXL-2014). See C. B. Hübschle, G. M. Sheldrick, B. Dittrich, J. Appl. Crystallogr. 44, 1281-1284 (2011); G. M. Sheldrick, Acta Crystallogr. A 71, 3-8 (2015); and G. M. Sheldrick, Acta Crystallogr. C 71, 3-8 (2015), each incorporated herein by reference in their entirety. During the refinement process, all non-hydrogen atoms were refined by anisotropic atomic displacement parameters whereas the hydrogen atoms were inserted at calculated positions using a riding model. The only exception was the hydrogen atoms coordinated with water molecule, which were located from difference maps and their coordinates were refined. The $CF_3$ groups on two of the $CF_3COO^-$ ions were disordered and modelled using two positions related by rotation; one of the uncoordinated THF molecules was also modelled as disordered over two overlapping conformations. All these parameters of data collection and refinement are briefly described in Table 2. CCDC 1531480 contains the supplementary crystallographic data for this work. These data can be obtained free of charge from The Cambridge Crystallographic Data Centre via www.ccdc.cam.ac.uk/data_request/cif.

TABLE 2

Crystal data and refinement parameters for
[Ca$_2$(TFA)$_3$(OAc))($^i$PrOH)(H$_2$O)THF)$_3$] (1)
Crystal data

| | |
|---|---|
| Chemical formula | C$_{15}$H$_{21}$Ca$_2$F$_9$O$_{11}$·2(C$_4$H$_8$O) |
| M$_r$ | 772.68 |
| Crystal system, space group | Orthorhombic, P2$_1$2$_1$2$_1$ |
| Temperature (K) | 150 |
| a, b, c (Å) | 13.4102 (3), 15.5099 (4), 16.8614 (4) |
| V (Å$^3$) | 3507.02(15) |
| Z | 4 |
| Radiation type | Cu Kα |
| μ (mm$^{-1}$) | 3.78 |
| Crystal size (mm) | 0.20 × 0.18 × 0.11 |
| T$_{min}$, T$_{max}$ | 0.512, 0.698 |

TABLE 2-continued

Crystal data and refinement parameters for
[Ca$_2$(TFA)$_3$(OAc))($^i$PrOH)(H$_2$O)THF)$_3$] (1)
Crystal data

| | |
|---|---|
| No. of measured, independent and observed [I > 2σ(I)] reflections | 20406, 7209, 6359 |
| R$_{int}$ | 0.037 |
| (sin θ/λ)$_{max}$ (Å$^{-1}$) | 0.631 |
| R[F$^2$ > 2σ(F$^2$)], wR(F$^2$), S | 0.050, 0.148, 1.07 |
| No. of reflections | 7209 |
| No. of parameters | 531 |
| No. of restraints | 1219 |
| Δ>$_{max}$, Δ>$_{min}$ (e Å$^{-3}$) | 1.44, −0.38 |
| Absolute structure parameter | 0.278 (13) |

Example 4

Experimental—Thin Film Fabrication by AACVD

1:1 ratio CaTiO$_3$:TiO$_2$ composite oxides films were grown on commercially available FTO glass substrates having a resistivity of 8 Ωsq$^{-1}$ using in-house built setup for aerosol-assisted chemical vapour deposition. The substrates with lateral dimensions 1×2 cm$^2$ were ultrasonically and sequentially cleaned with doubly distilled water, acetone and propan-2-ol, and stored in ethanol until further steps. When ready, the substrate slides were removed from ethanol and air dried before being transferred to the combustion chamber of AACVD (CARBOLITE, Model No. 10/25/130) (6" L×1" D). The substrates were then heated to the desired deposition temperature and kept at the same temperature for 10 minutes to get the thermal equilibrium. The AACVD setup is illustrated in FIG. 1.

During a typical deposition experiment, a homogeneous mixture of Ca-precursor [Ca$_2$(TFA)$_3$(OAc)($^i$PrOH)(H$_2$O)(THF)$_3$] (0.5 g, 0.65 mmol) and titanium (IV) isopropoxide (0.06 ml, 0.22 mmol) was prepared in 15 mL methanol as solvent. This mixture was utilized for the fabrication of CaTiO$_3$—TiO$_2$ composite thin films at three different temperatures of 500, 550, and 600° C. The deposition experiments were continued for a fixed time period of 60 min. at each temperature. Thin film deposition parameters are listed in Table 3. Visual examination indicated that films were white, uniform, and adhered strongly to FTO substrate as confirmed by the "SCOTCH tape test".

TABLE 3

Thin films deposition parameters involved in AACVD synthesis of CaTiO$_3$—TiO$_2$ composite film.

| Deposition temperature (° C.) | Concentration of precursors Ca-Complex + Ti($^i$Pro)$_4$ | Solvent (mL) | Deposition time (min.) | Substrate | Carrier Gas/ (mL/min.) | Resultant Material |
|---|---|---|---|---|---|---|
| 500 | (0.5 g, 0.65 mmol) + (0.06 ml, 0.22 mmol) | MeOH (15) | 60 | FTO | 150 | CaTiO$_3$—TiO$_2$ |
| 550 | (0.5 g, 0.65 mmol) + (0.06 ml, 0.22 mmol) | MeOH (15) | 60 | FTO | 150 | CaTiO$_3$—TiO$_2$ |
| 600 | (0.5 g, 0.65 mmol) + (0.06 ml, 0.22 mmol) | MeOH (15) | 60 | FTO | 150 | CaTiO$_3$—TiO$_2$ |

Example 5

Experimental—Thin Film Characterization

The UV-Vis absorption spectra of the thin films were recorded on a LAMBDA 35 Perkin-Elmer spectrophotometer in the wavelength range of 300-900 nm. Film thicknesses were measured by using a KLA TENCORE P-6 surface profiler. In order to verify the crystallinity of the formed composite oxide, the films were examined by X-ray powder diffraction (XRD) using a PANanalytical, X'Pert HighScore diffractometer with primary monochromatic high intensity CuK$^α$ (λ=1.5418 Å) radiation. Energy dispersive X-ray (EDX, INCA Energy 200, Oxford Inst.) spectroscopy was also carried out in order to determine the metallic ratio of Ca/Ti in the composite. The microstructure of the thin films were investigated using a Lyra 3 Tescan, field emission gun (FEG)-SEM at an accelerating voltage of 5 kV and a working distance of 10 mm. X-ray photoelectron spectroscopy (XPS) was undertaken using an ULVAC-PHI Quantera II instrument with a 32-channel Spherical Capacitor Energy Analyzer under vacuum pressure of 1×10$^{-6}$ Pa using Monochromated Al Kα radiation (1486.8 eV) and natural energy width of 680 meV. The carbonaceous C is line (284.6 eV) was used as a reference to calibrate the binding energies.

Example 6

Experimental—Photoelectrochemical Measurements

The photoelectrochemical responses of the resulting CaTiO$_3$—TiO$_2$ composite electrodes were measured using a conventional three-electrode cell configuration on a source of external potential bias (Princeton Applied Research PAR-VersaSTAT-3). Current-voltage characteristics were observed using the linear sweep voltammetry (LSV) technique for a potential range of −0.5 to +1.2 V at a scan rate of 10 mV s$^{-1}$. The CaTiO$_3$—TiO$_2$ thin films were used as the working electrode in these experiments while having platinum wire as a counter electrode and a Ag/AgCl reference electrode. The working electrodes (i.e., CaTiO$_3$—TiO$_2$ thin films) were dipped into 1 M NaOH electrolyte solutions for the calculations of the photocurrent, and irradiated with a 100 mW xenon lamp (Newport, Model 69907) containing a simulated AM 1.5G filter as a light source, during the entire length of the experiment.

Example 7

Results and Discussion—an Insight into Complex (1)

A polymeric complex of calcium [Ca$_2$(TFA)$_3$(OAc))($^i$P-rOH)(H$_2$O)(THF)$_3$] (1) (TFA=trifluoroacetato; OAc=acetato; $^i$Pro=isopropoxy) has been obtained as a result of efforts to synthesize a heterobimetallic Ca—Ti complex. The reactants Ca(OAc)$_2$·2H$_2$O and T (Pro)$_4$ were mixed in the molar ratio of 1:2 in tetrahydrofuran solvent followed by subsequent addition of triflouroacetic acid with the aim of achieving a Ca—Ti bimetallic compound to be implemented in AACVD for the fabrication of CaTiO$_3$—TiO$_2$ composite oxide photelectrodes for PEC water splitting. The synthetic pathway did not successfully produce our desired Ca—Ti bimetallic complex, but instead produced complex (1) which was still interesting with regard to AACVD application. Hence we utilized a homogenous methanolic solution of complex (1) and Ti($^i$Pro)$_4$ to fabricate CaTiO$_3$—TiO$_2$ oxide thin film electrodes. The complex (1) was produced in the form of transparent white crystals having a 75% yield. The obtained crystals were quite stable towards air and moisture while exhibiting appreciable solubility in routinely used organic solvents such as methanol, ethanol, acetonitrile, etc. The structural composition of the formed complex (1) was initially established by single crystal XRD and was further ascertained by AT-1R, $^1$H and $^{19}$F NMR, and thermogravimetry analyses (TGA). The IR spectra of complex (1) indicate that different functional moieties are attached to the calcium centers in (1). At 3326 cm$^{-1}$, a broad peak corresponding to OH functional group is present, and at 2983 and 2886 cm$^{-1}$, there are peaks to indicate the CH group of isopropanol. See X. Cai, Y. Wu, L. Wang, N. Yan, J. Liu, X. Fang, Y. Fang, Soft Matter 9, 5807-5814 (2013), incorporated herein by reference in its entirety. The symmetric and asymmetric ν(C═O) absorption signals of the acetato and trifluoroacetato ligands have also been observed at 1538 and 1370 cm$^{-1}$, and 1665 and 1452 cm$^{-1}$, respectively. The difference of 168 and 213 cm$^{-1}$ between these symmetric and asymmetric ν(C═O) vibrations reveals the bidentate characteristics of the carboxylate groups of the acetato and trifluoroacetato groups that are coordinated to different calcium atoms. See M. Veith, M. Haas and V. Huch, Chem. Mater. 17, 95-101 (2005), incorporated herein by reference in its entirety. In addition, the peaks at 1194 and 1141 cm$^{-1}$ authenticate the occurrence of C—F and C—O bonds in complex (1). $^1$H-NMR spectra measured from D-methanol solution displays three signals at, δ=3.87 ppm [p, 4H, CH] δ=2.12 ppm [s, 1H, OH] and 1.12 ppm [d, 6H, CH$_3$] due to the isopropanol, while two signals at δ=3.68 ppm [t, 12H, OCH$_2$] and δ=1.83 ppm [t, 12H, CH$_2$] are for the solvated THF and δ=1.96 ppm [s, 3H, CH$_3$] are for the acetato groups. Further, the $^{19}$F-NMR spectra recorded in methanol displays a singlet at δ=−76.94 ppm [s, 9F, CF$_3$] suggesting the presence of a trifluoroacetato moiety in the formed complex (1).

Example 8

Results and Discussion—Description of Molecular Structure of Complex (1)

Figure 2:
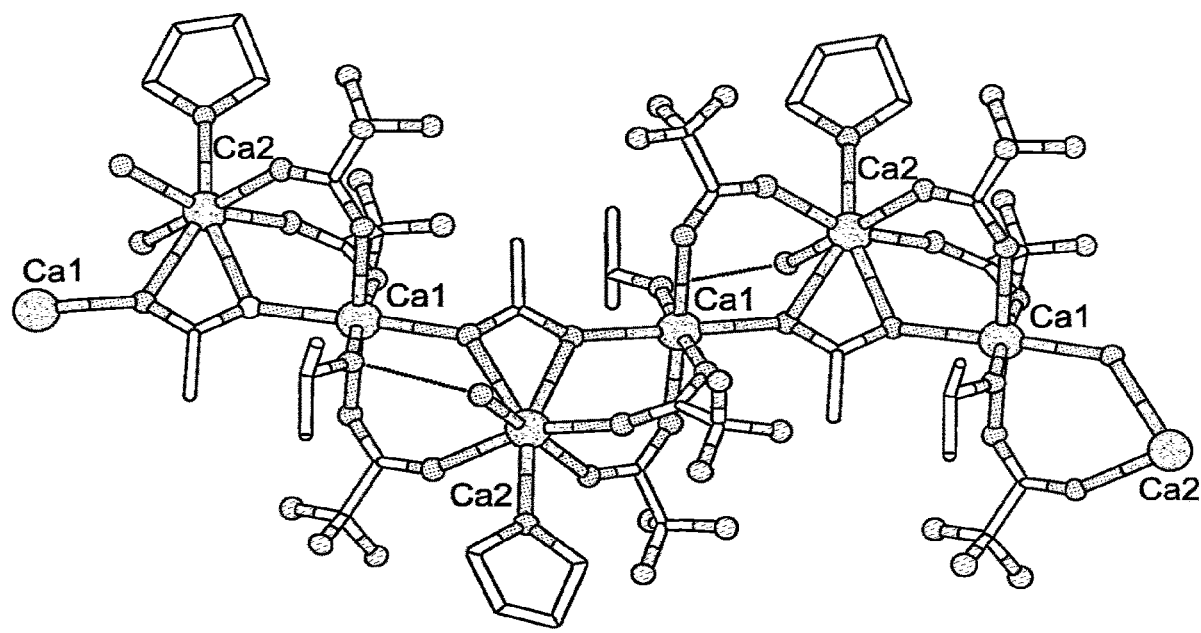
FIG. 2 shows a section of the polymeric chain structure.

The asymmetric unit contains two independent calcium ions linked by bridging acetate and trifluoroacetate groups as shown in FIG. 2, where H atoms and non-coordinated THF molecules are omitted; hydrogen bonding is shown as black dashed lines. Ca$^{2+}$ and Ti$^{4+}$ are isoelectronic, so cannot be readily distinguished only on the basis of X-ray data. However, the M-O bond length data with related assemblies in the CSD (v5.37 & updates) support assignment as Ca$^{2+}$ and are inconsistent with Ti$^{4+}$. See F. H. Allen, Acta Crystallogr. B 58, 380-388 (2002), incorporated herein by reference in its entirety. Furthermore, replacing even one of the Ca$^{2+}$ ions with Ti$^{4+}$ would present difficulties with charge balance, since there is only one ionisable proton remaining in the asymmetric unit (on the isopropanol).

The two calcium ions are linked on one side by two syn bridging bidentate CF$_3$COO$^-$ ions and by a single atom bridge from the acetate ligand; on the other by one syn bidentate CF$_3$COO$^-$ ion and a single oxygen donor from the acetate ligand. The acetate ligand acts as a syn bidentate ligand to Ca2 and as an anti bidentate bridge linking Ca1 to a symmetry equivalent atom (under synmmetry operation x−1/2, −y+3/2, −z+1). Ca1 is 6-coordinate, the coordination sphere completed by an isopropanol ligand while Ca2 is 7-coordinate, having water and THF ligands. Between the coordinated alcohol on Ca1 and the water molecule on Ca2 (under x−1/2, −y+3/2, −z+1), an intramolecular hydrogen bond is located whereas two hydrogen bonds are directed from the coordinated water molecule, one to each of the uncoordinated THF molecules (Table 4).

TABLE 4

Hydrogen-bond geometry (Å, °) for [Ca$_2$(TFA)$_3$(OAc))($^i$Pro) (H$_2$O) (THF)$_3$]

| D—H⋯A | D—H | H⋯A | D⋯A | D—H⋯A |
|---|---|---|---|---|
| O1—H2⋯O71 | 0.82 (8) | 1.88 (8) | 2.683 (6) | 169 (8) |
| O1—H1⋯O81 | 0.86 (8) | 1.92 (8) | 2.718 (14) | 155 (7) |
| O1—H1⋯O81' | 0.86 (8) | 1.81 (8) | 2.628 (13) | 159 (7) |
| O51—H5LA⋯O1$^i$ | 0.84 | 2.07 | 2.902 (6) | 179 |

Symmetry code: (i) x − 1/2, −y + 3/2, −z + 1.

Example 9

Results and Discussion—Pyrolysis of Complex (1)

Figure 3:
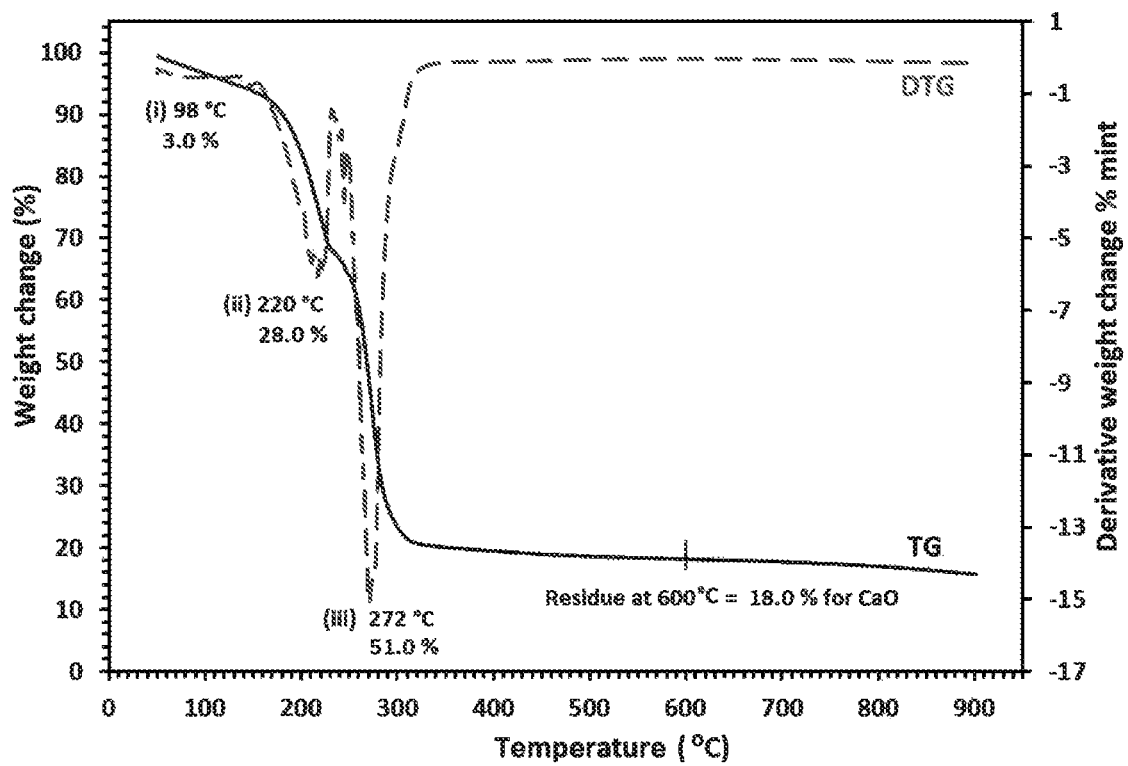
FIG. 3 shows TGA (black) and DTG (dotted red) profiles indicating pyrolysis of complex (1) against the increasing temperature under an inert nitrogen atmosphere and temperature ramping of 10° C. $min^{-1}$.

Simultaneous thermogravimetric analysis (TGA) and derivative thermogravimetric (DTG) analyses were performed under a flowing dinitrogen atmosphere (flow rate=25 cm$^3$ min$^{-1}$) and with a temperature ramping of 10° C. min$^{-1}$ in order to investigate the thermal stability of complex (1). The thermogram thus obtained (FIG. 3) illustrates that the decomposition of (1) proceeds into three discrete stages with a continuous weight loss of 3.0%, 28.0% and 51.0%, with the maximum heat intake steps at 98° C., 220° C. and 272° C., respectively. At 600° C., the amount of the residue obtained is ~18.0%, which suggest the formation of "n" moles of CaO (calculated percentage≈15.0%). Further heating of the residue up to 800° C. brought no significant change in mass, indicating complete decomposition of complex (1) yielding a stable residue of CaO. Quantitative pyrolysis of complex (1) has been indicated in the equation below, based on TGA information:

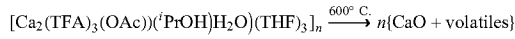

Example 10

Results and Discussion—XRD Analysis

FIG. 4A shows the XRD patterns of the films of CaTiO$_3$—TiO$_2$ composite formed at three different temperatures. The qualitative phase analysis via XRD indicates the formation of "perovskite CaTiO$_3$," ICSD [98-003-7263] and anatase TiO$_2$ (ICSD=98-000-9853) phases in all the composite oxide films. The diffraction peaks indicated by (X) at 2θ=23.2°, 32.9°, 33.0°, 33.3°, 39.0°, 39.1°, 40.6°, 41.0°, 47.4°, 47.5°, 58.8°, 59.0°, 59.2°, 59.3°, 68.9°, 69.4°, 79.0°, 79.2°, 88.0° and 88.9° correspond to the (101), (200), (121), (002), (031), (112), (220), (022), (202), (040), (321), (240), (042), (123), (400), (242), (323), (161), (440), (044) planes, respectively, in good agreement with the orthorhombic CaTiO$_3$ (FIG. 4A). The peaks labelled as (Y) at 2θ=25.2° (011), 36.9° (013), 37.7° (004), 38.5° (112), 48.0° (020), 53.8° (015), 55.0° (121), 62.6° (024), 68.6° (116), 70.2° (220), 75.0° (125) and 82.5° (224) are regarded as the attributive indicator of TiO$_2$ in the tetragonal anatase phase (ICSD=98-000-9853). The Peaks indicated by (*) are diffracted from crystalline tin oxide (ICSD=01-077-2296) of the FTO substrate. The XRD patterns do not show any sort of crystalline impurity peak such as from CaO or any other type of TiO$_2$.

Although all the films demonstrated similar XRD patterns and thus had a similar phase of perovskite CaTiO$_3$ and anatase TiO$_2$ in crystalline deposit in each case, however, it is perceived from these XRDs that the degree of crystallinity of CaTiO$_3$ and TiO$_2$ phases are influenced by the temperature during the deposition. For example, the film deposited at 500° C., TiO$_2$ peak situated at 25.2° appears as highest intensity peak while the characteristic CaTiO$_3$ peaks centered at 47.4° and 47.5° remain low and various other peaks are absent. With rise in the deposition temperature the intensity of TiO$_2$ peak (25.2°) is reduced and CaTiO$_3$ peaks become sharp and various other peaks are quite visible in the film specimen developed at 600° C.

To confirm this observation, quantitative phase analysis was applied on each XRD pattern and crystalline proportions of perovskite CaTiO$_3$ and anatase TiO$_2$ phases were measured in each film and are shown in the form of pie-charts (FIGS. 4B-4D).

The XRD quantitative phase analysis reveals that the film deposited at 500° C. contains higher percentage of crystalline anatase TiO$_2$ (73%) as compared to perovskite CaTiO$_3$ (27%). The crystalline contents of TiO$_2$ are observed to decrease with increase in deposition temperature and CaTiO$_3$—TiO$_2$ composite prepared at 550° C. is poised at 43% of anatase TiO$_2$ and 57% of perovskite CaTiO$_3$. The crystalline content of anatase TiO$_2$ further reduces to 17% and perovskite CaTiO$_3$ with 83% becomes as major phase in the crystalline CaTiO$_3$—TiO$_2$ product obtained at 600° C. Worth mentioning here is that the films produced at three different temperatures differ in terms of their percentage crystalline composition of the two phases, however, the total crystalline plus non-crystalline phases of CaTiO$_3$: TiO$_2$ remain at 1:1 ratio and can be further ascertained from elemental (EDX and XPS) analyses of the films. The variation in crystalline contents of the films as a result of change in deposition temperature is a common aspect of AACVD where the reactions between precursor gaseous intermediates and substrate surface are profoundly influenced by the deposition temperature and thus lead to the formation of oxide products with different level crystalline phases. See M. A. Ehsan, H. Khaledi, A. Pandikumar, P. Rameshkumar, N. M. Huang, Z. Arifin, M. Mazhar, New J. Chem. 39, 7442-7452 (2015); and A. A. Tahir, M. A. Ehsan, M. Mazhar, K. U. Wijayantha, M. Zeller, A. Hunter, Chem. Mater. 22, 5084-5092 (2010), each incorporated herein by reference in their entirety.

Example 11

Results and Discussion—SEM/EDX Analysis

Figure 5A:
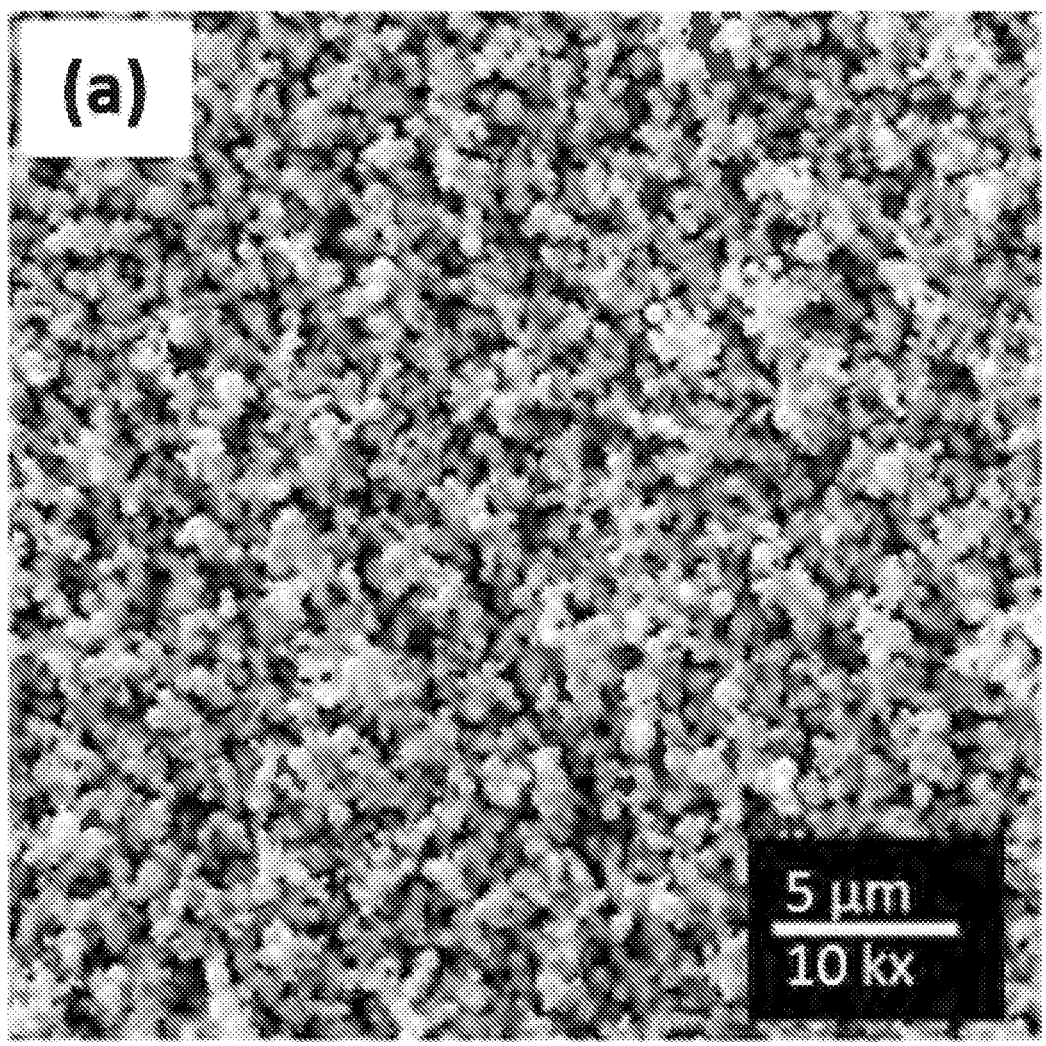
FIG. 5A shows a low resolution (10Kx) surface FESEM image of a $CaTiO_3$—$TiO_2$ thin film deposited on an FTO glass substrate at a temperature of 500° C.
Figure 5B:
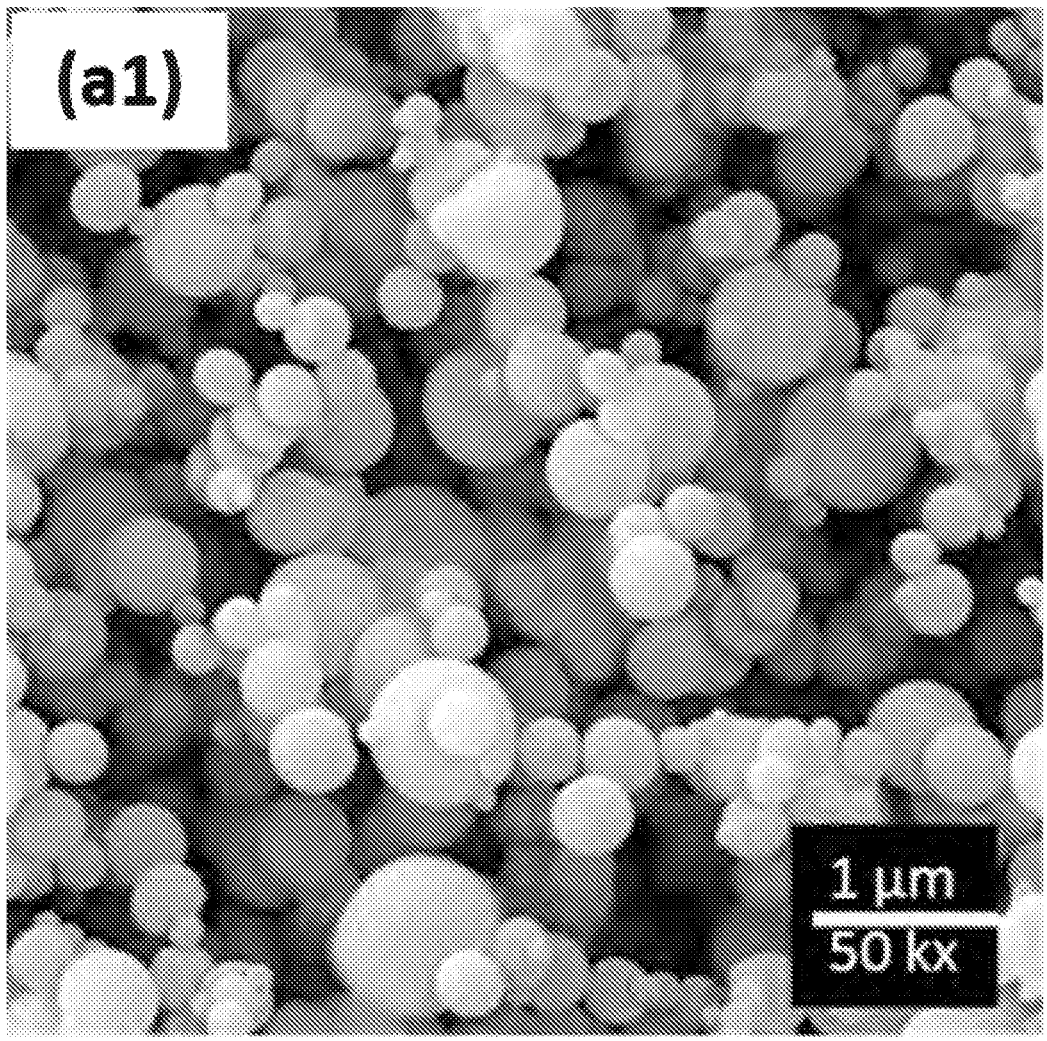
FIG. 5B shows a high resolution (50Kx) surface FESEM image of a $CaTiO_3$—$TiO_2$ thin film deposited on an FTO glass substrate at a temperature of 500° C.
Figure 6A:
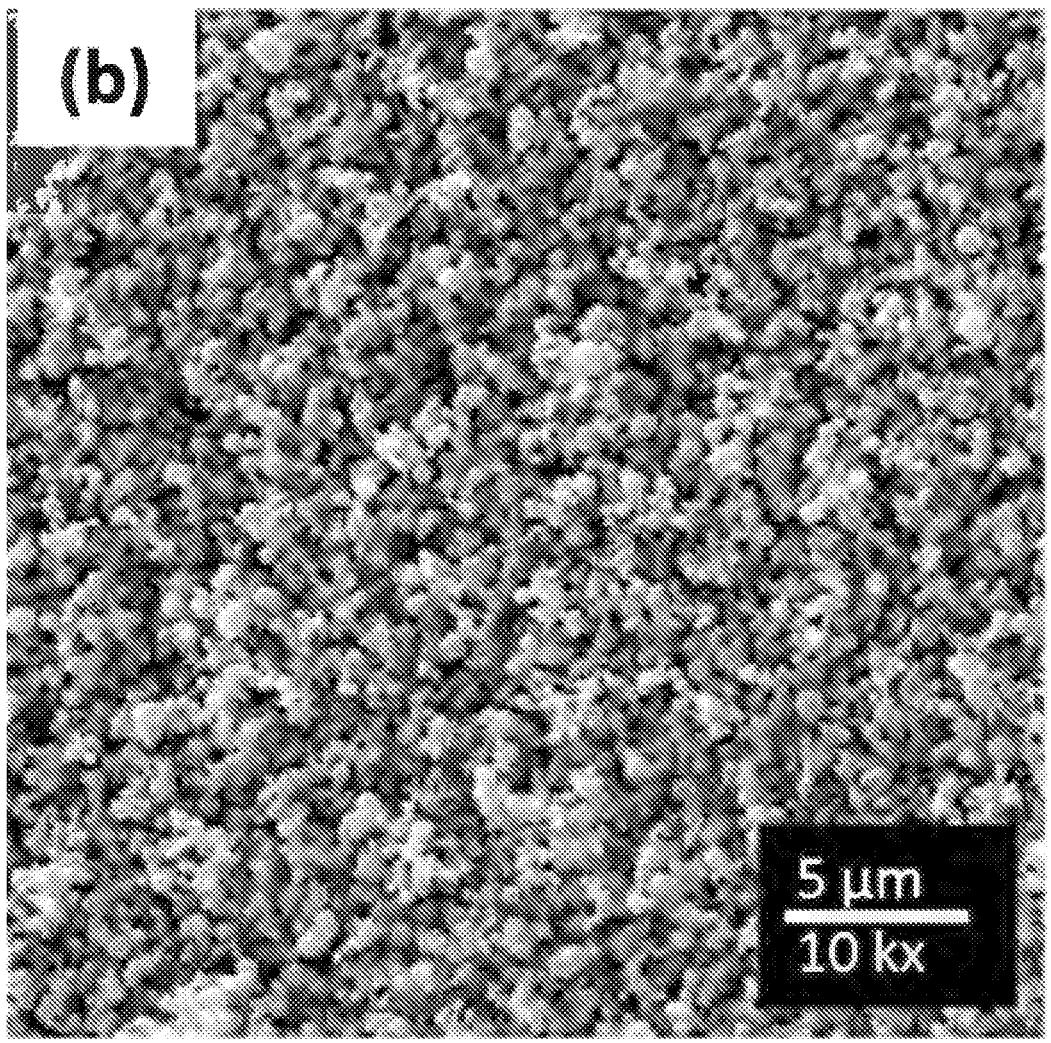
FIG. 6A shows a low resolution (10Kx) surface FESEM image of a $CaTiO_3$—$TiO_2$ thin film deposited on an FTO glass substrate at a temperature of 550° C.
Figure 6B:
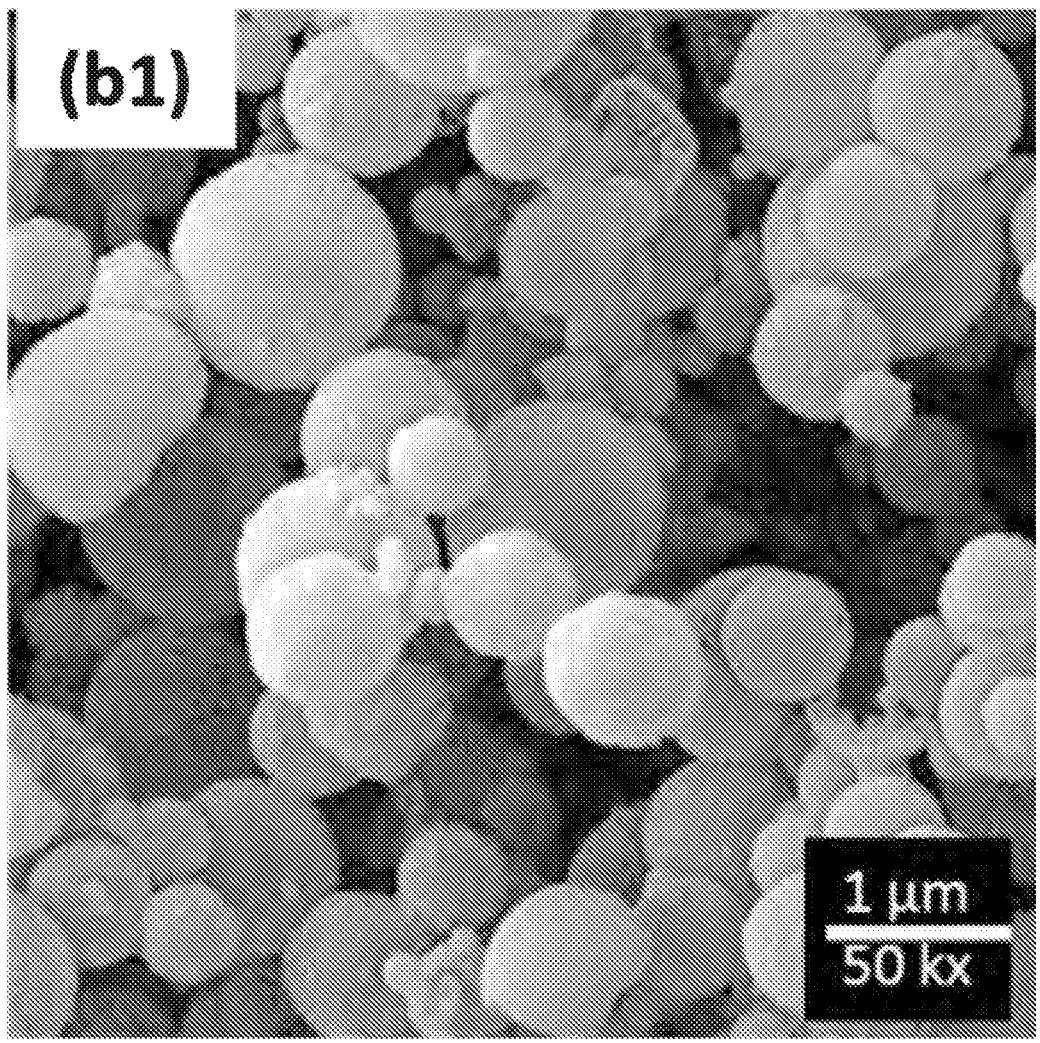
FIG. 6B shows a high resolution (50Kx) surface FESEM image of a $CaTiO_3$—$TiO_2$ thin film deposited on an FTO glass substrate at a temperature of 550° C.
Figure 7A:
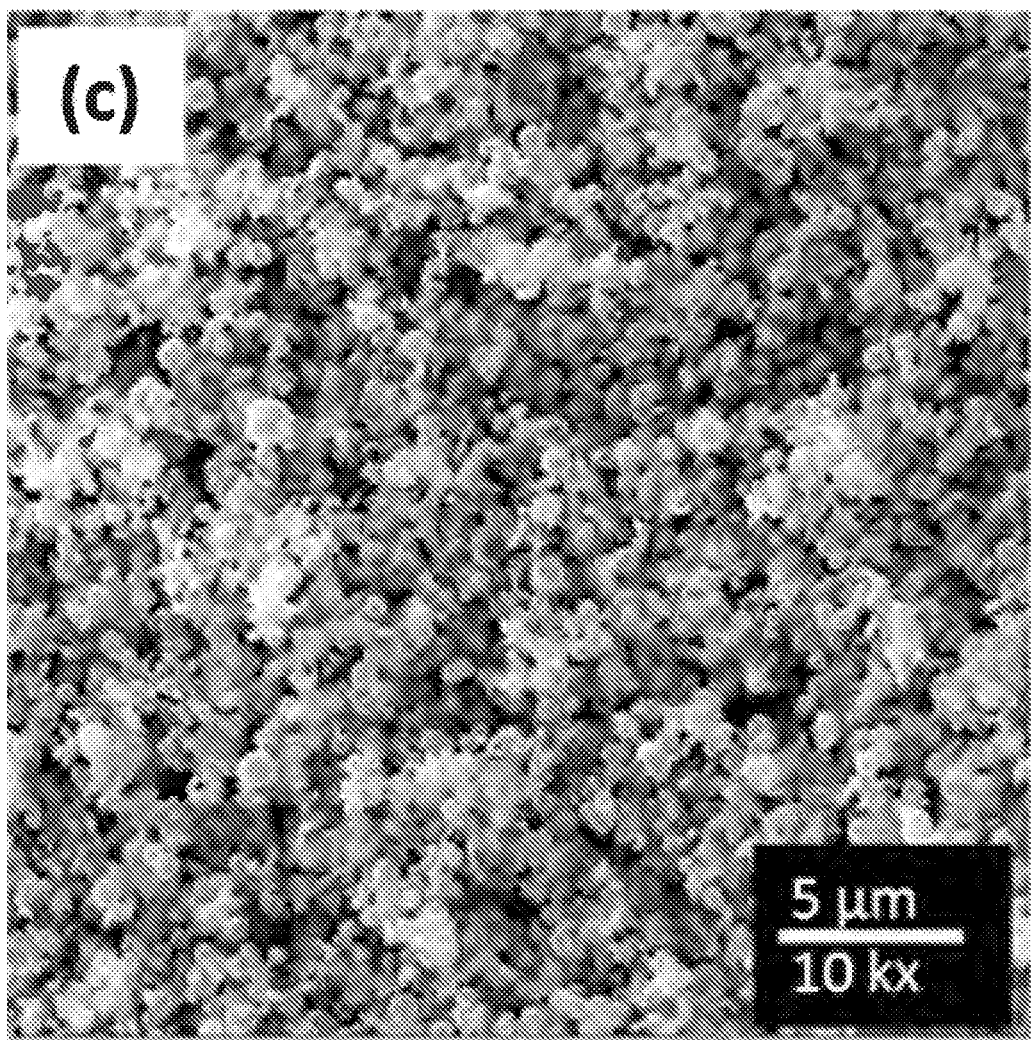
FIG. 7A shows a low resolution (10Kx) surface FESEM image of a $CaTiO_3$—$TiO_2$ thin film deposited on an FTO glass substrate at a temperature of 600° C.
Figure 7B:
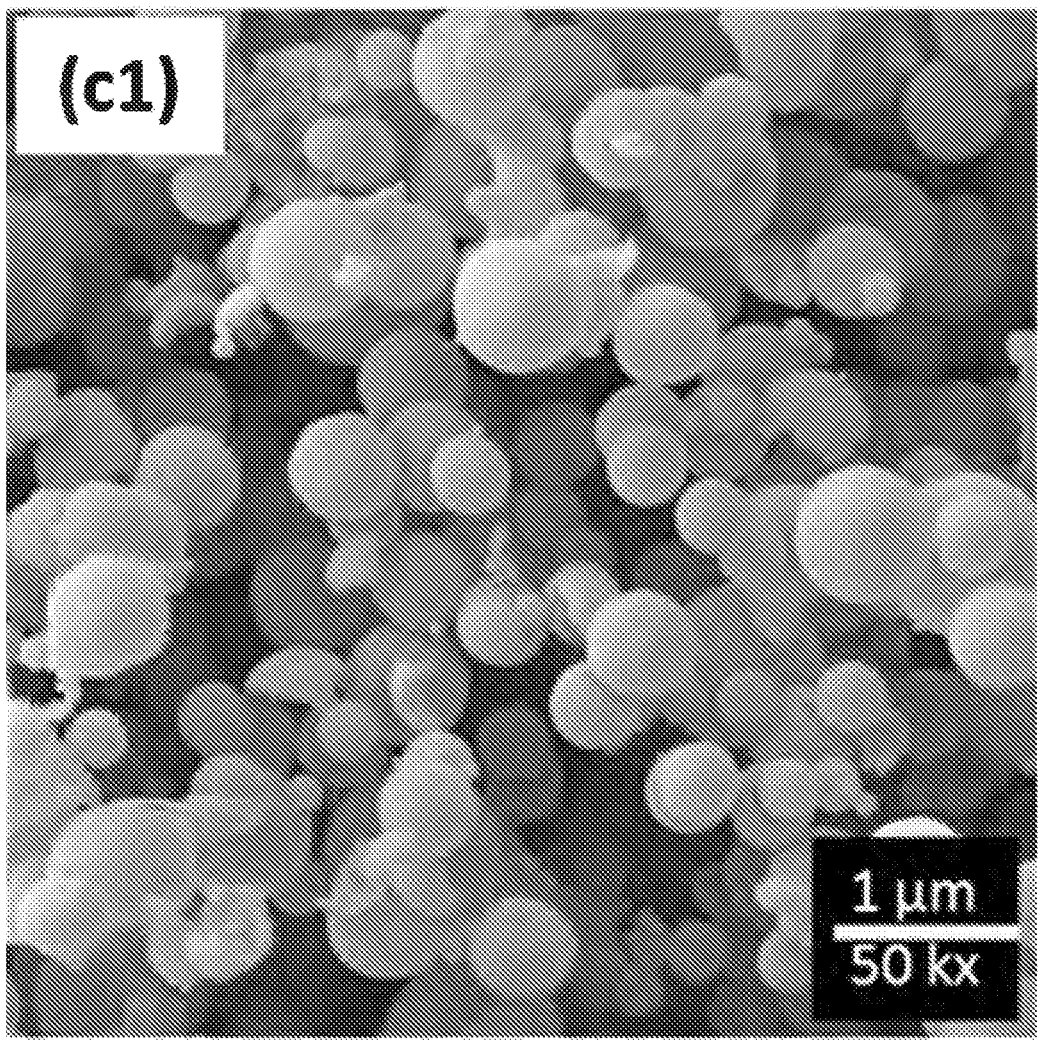
FIG. 7B shows a high resolution (50Kx) surface FESEM image of a $CaTiO_3$—$TiO_2$ thin film deposited on an FTO glass substrate at a temperature of 600° C.

The surface and cross sectional FESEM images of CaTiO$_3$—TiO$_2$ composite oxide films developed at 500, 550 and 600° C. are presented in FIG. 4. The low resolution SEM images (FIGS. 5A, 6A, 7A) reveal that CaTiO$_3$—TiO$_2$ crystallites are homogeneously distributed on the substrate surface over all temperature ranges. The high resolution SEM images (FIGS. 5B, 6B, 7B) unveil the spherical shape of the CaTiO$_3$—TiO$_2$ crystallites which are regularly connected with each other and it has been observed that size, shape and texture of these spheroids are not significantly altered with increase in deposition temperature from 500 to 600° C. The average diameter of the CaTiO$_3$—TiO$_2$ particles have been measured in the size range of 0.3-1.8 µm.

Figure 5C:
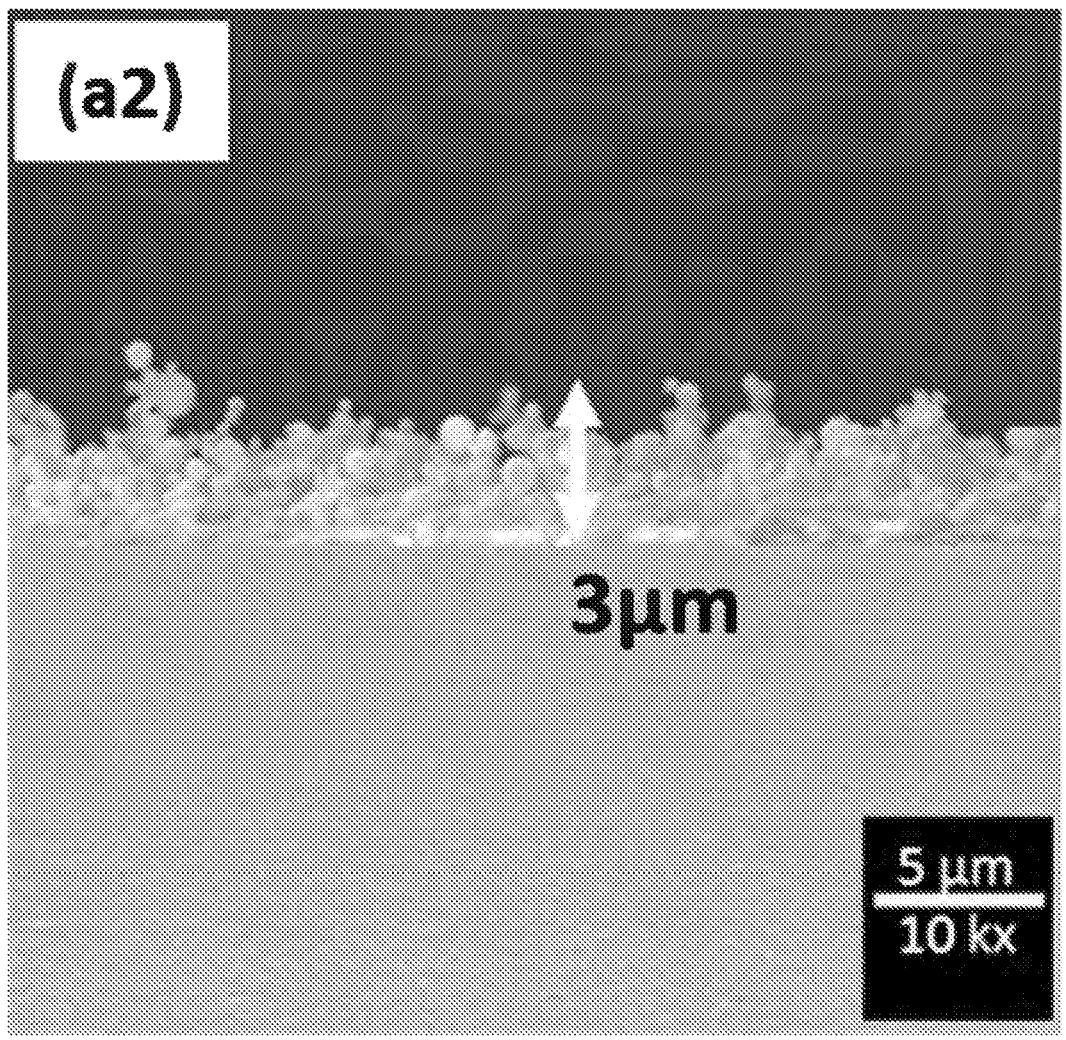
FIG. 5C shows a cross-sectional FESEM image of a $CaTiO_3$—$TiO_2$ thin film deposited on an FTO glass substrate at a temperature of 500° C.
Figure 6C:
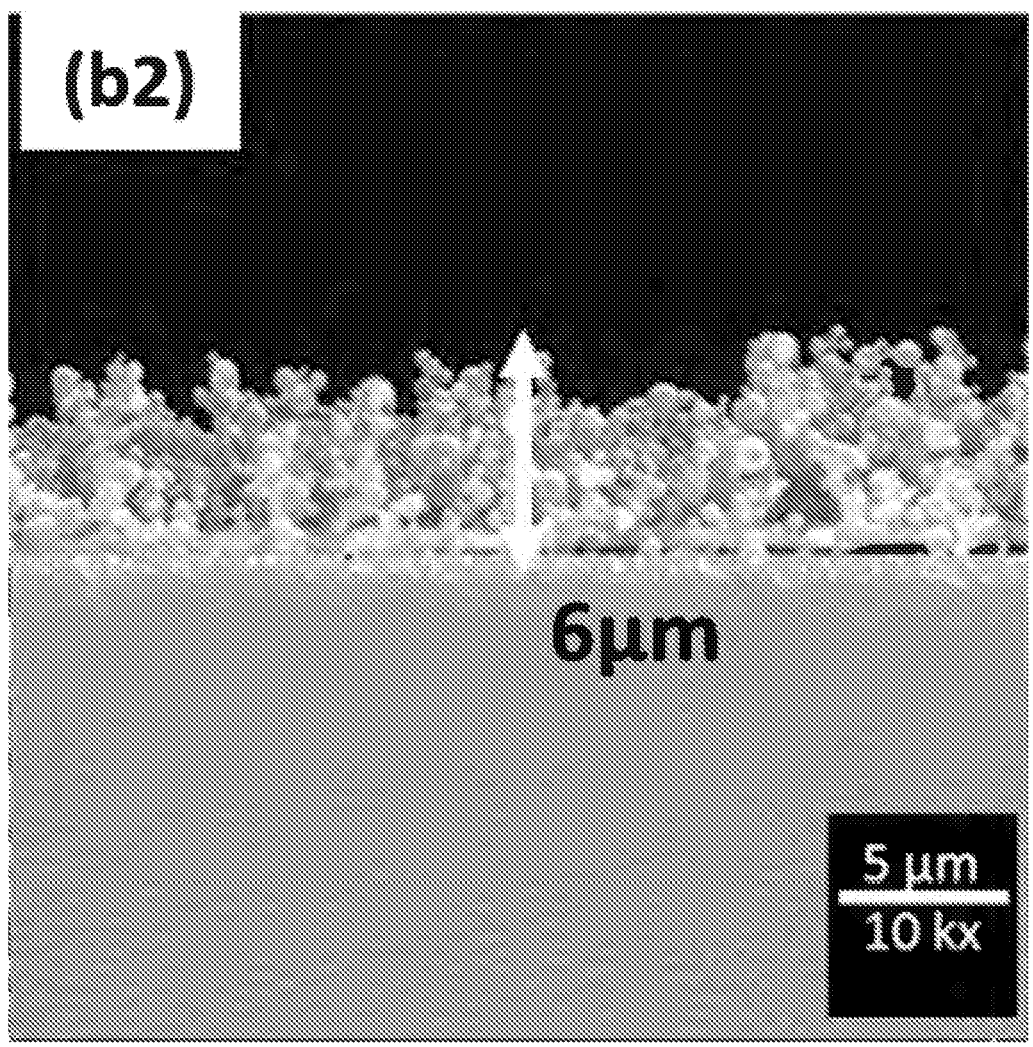
FIG. 6C shows a cross-sectional FESEM image of a $CaTiO_3$—$TiO_2$ thin film deposited on an FTO glass substrate at a temperature of 550° C.
Figure 7C:
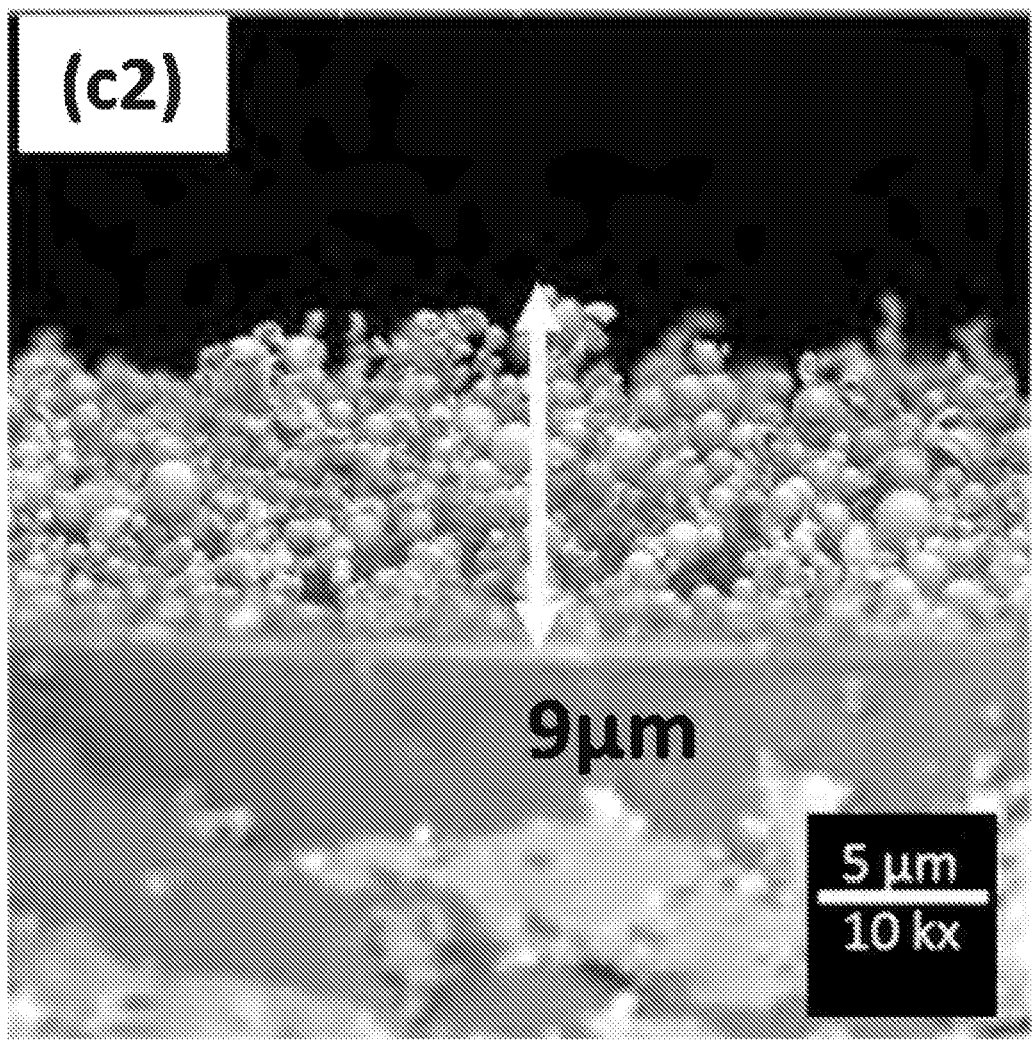
FIG. 7C shows a cross-sectional FESEM image of a $CaTiO_3$—$TiO_2$ thin film deposited on an FTO glass substrate at a temperature of 600° C.
Figure 8A:
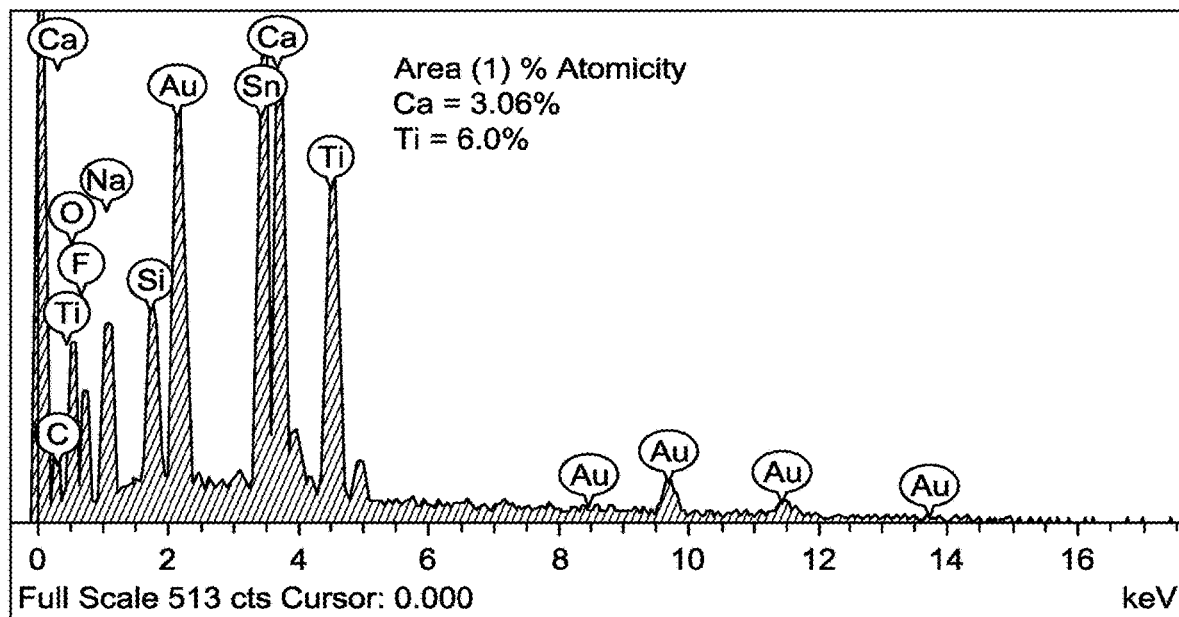
FIG. 8A shows the EDX spectra recorded from an area of $CaTiO_3$—$TiO_2$ film deposited at 500° C. on FTO substrate.
Figure 8B:
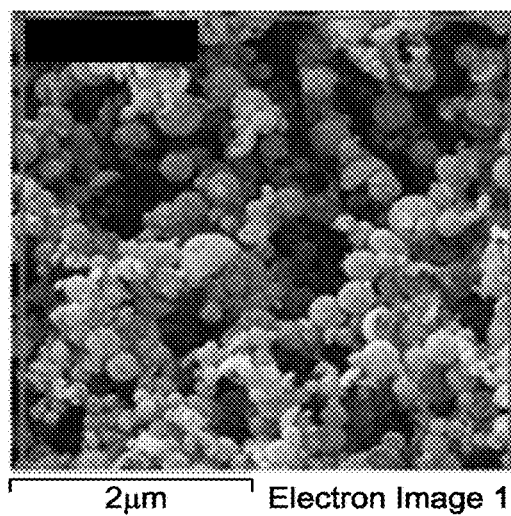
FIG. 8B shows an FESEM of the area of FIG. 8A.
Figure 8C:
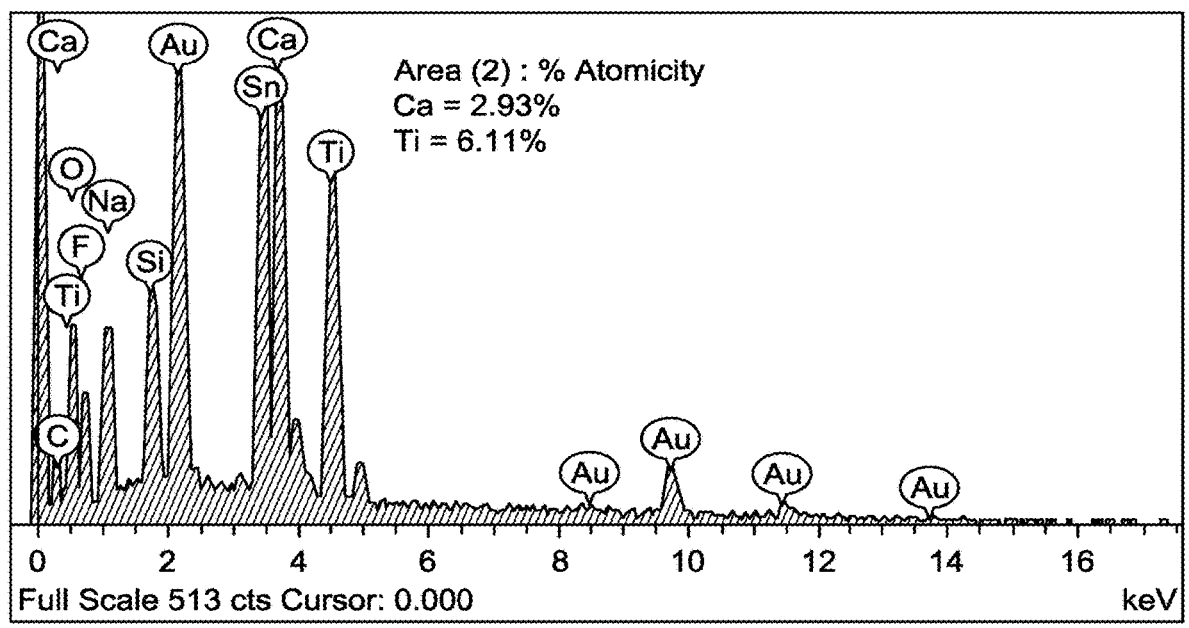
FIG. 8C shows the EDX spectra recorded from an area of $CaTiO_3$—$TiO_2$ film deposited at 500° C. on FTO substrate.
Figure 8D:
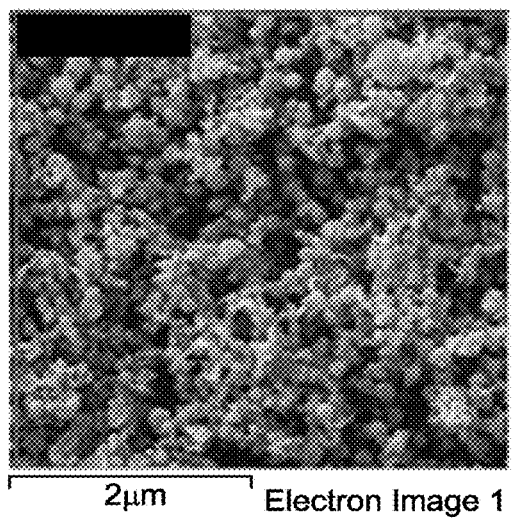
FIG. 8D shows an FESEM of the area of FIG. 8C.
Figure 8E:
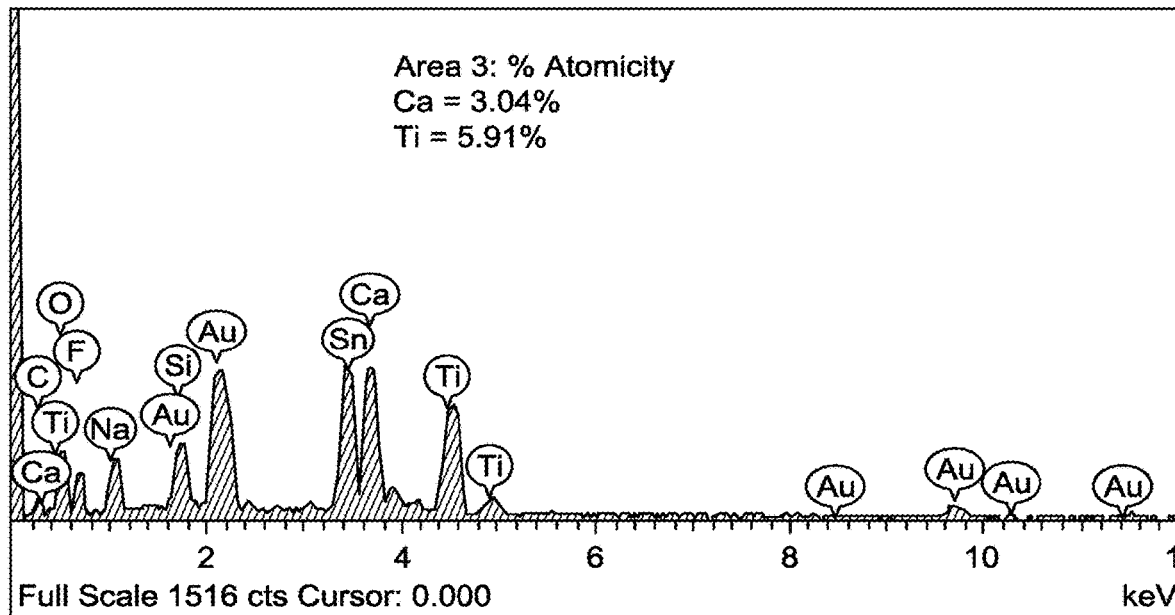
FIG. 8E shows the EDX spectra recorded from an area of $CaTiO_3$—$TiO_2$ film deposited at 500° C. on FTO substrate.
Figure 8F:
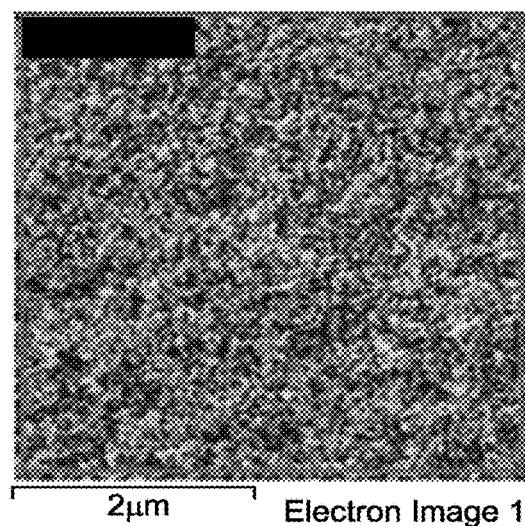
FIG. 8F shows an FESEM of the area of FIG. 8E.
Figure 8G:
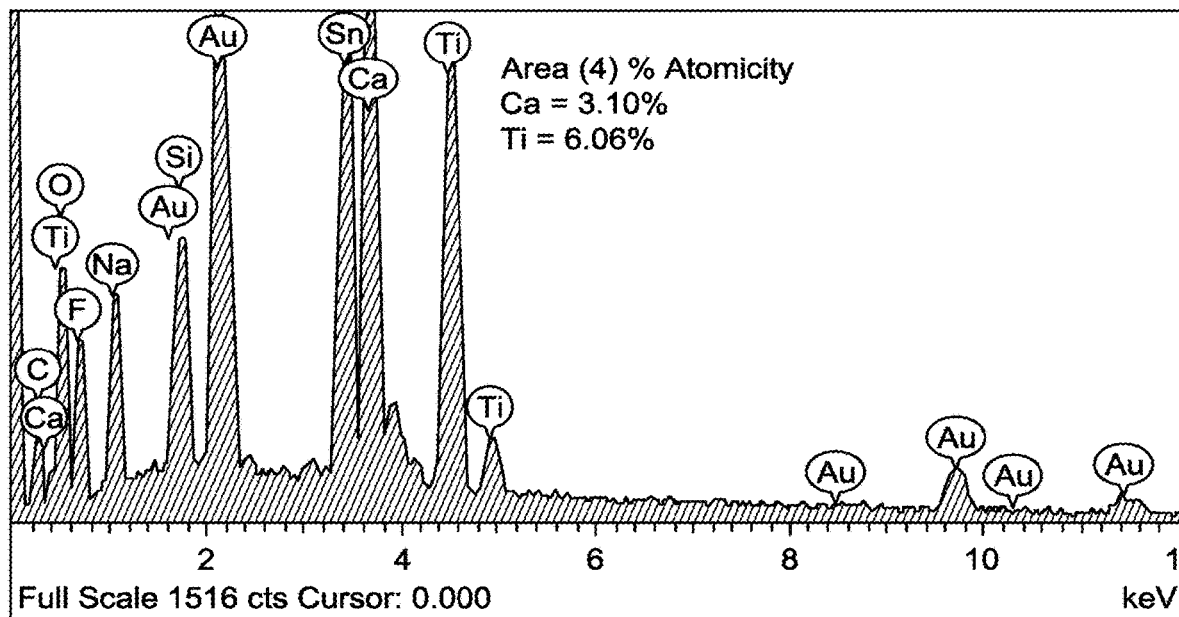
FIG. 8G shows the EDX spectra recorded from an area of $CaTiO_3$—$TiO_2$ film deposited at 500° C. on FTO substrate.
Figure 8H:
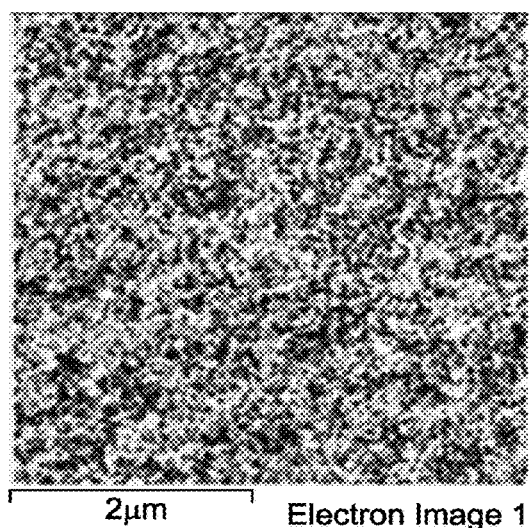
FIG. 8H shows an FESEM of the area of FIG. 8G.
Figure 9A:
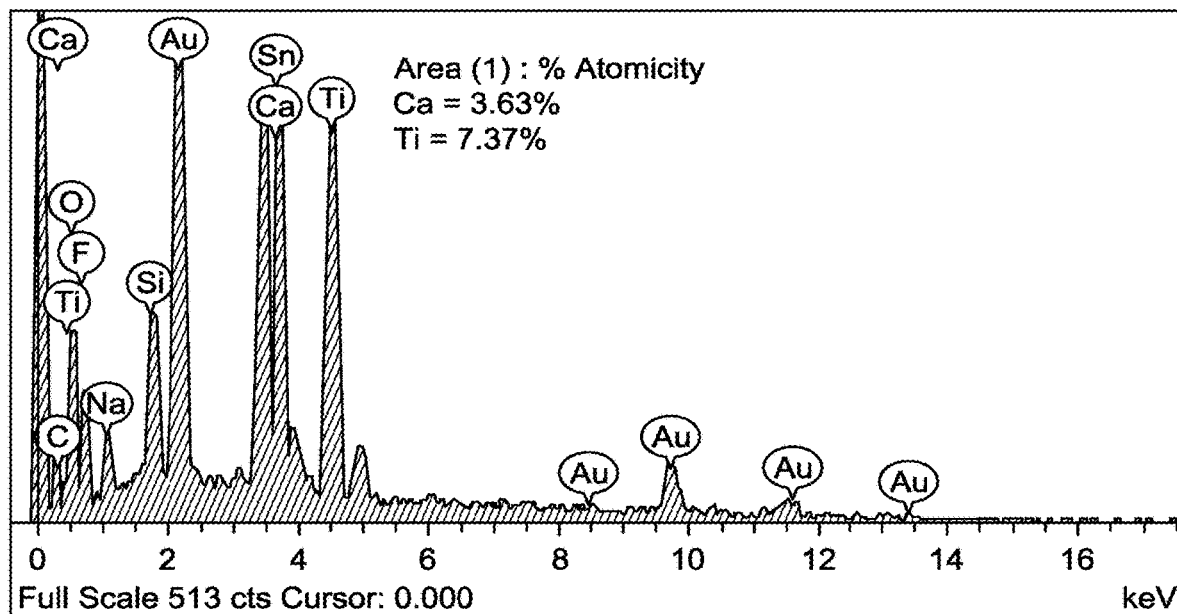
FIG. 9A shows the EDX spectra recorded from an area of $CaTiO_3$—$TiO_2$ film deposited at 550° C. on FTO substrate.
Figure 9B:
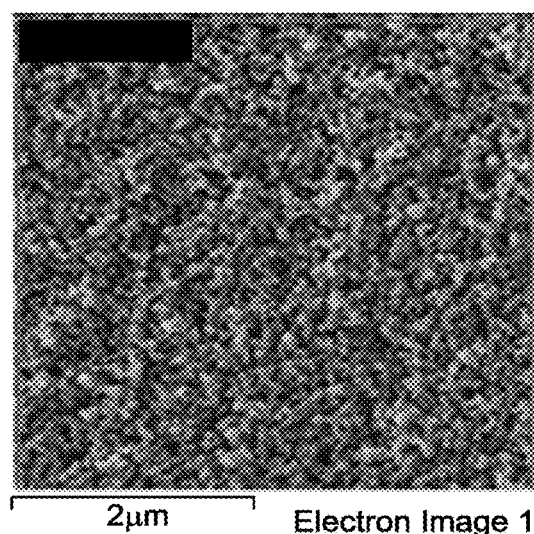
FIG. 9B shows an FESEM of the area of FIG. 9A.
Figure 9C:
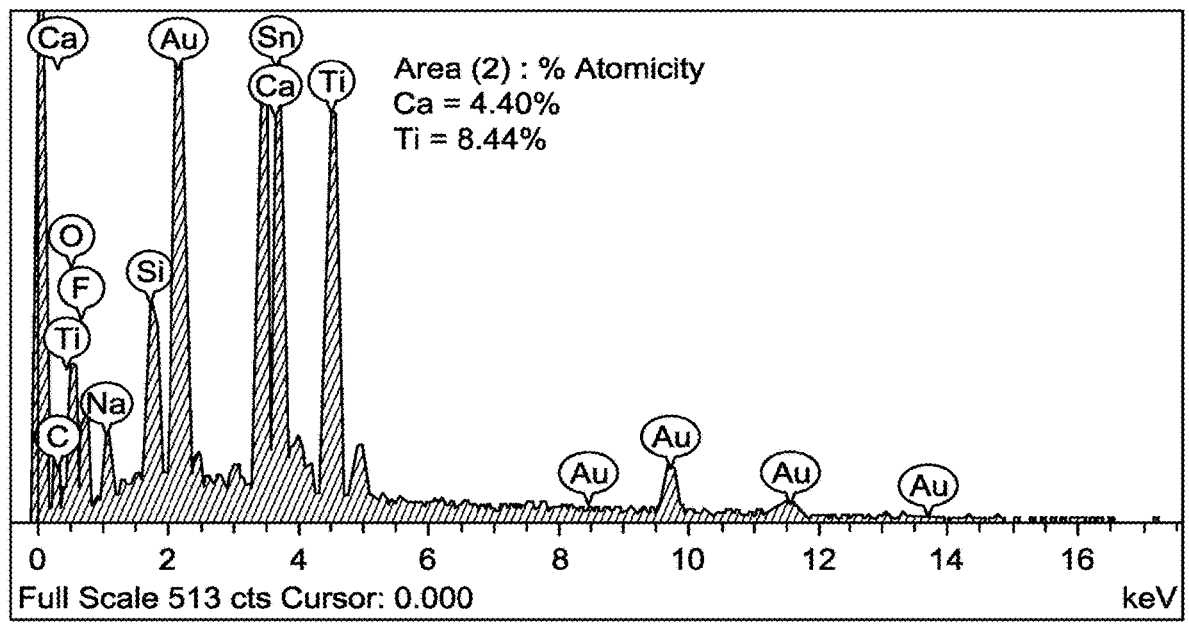
FIG. 9C shows the EDX spectra recorded from an area of $CaTiO_3$—$TiO_2$ film deposited at 550° C. on FTO substrate.
Figure 9D:
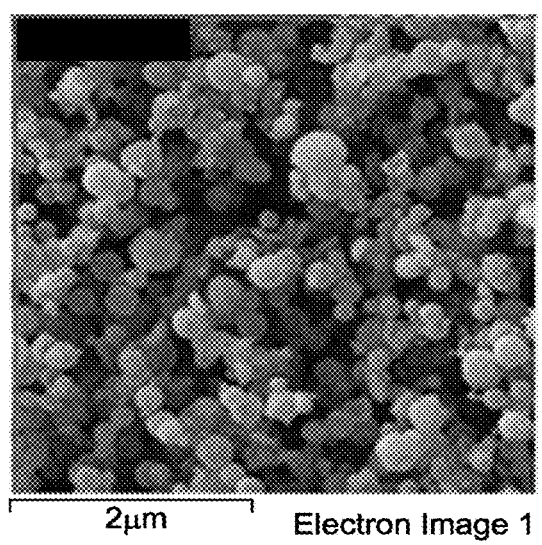
FIG. 9D shows an FESEM of the area of FIG. 9C.
Figure 9E:
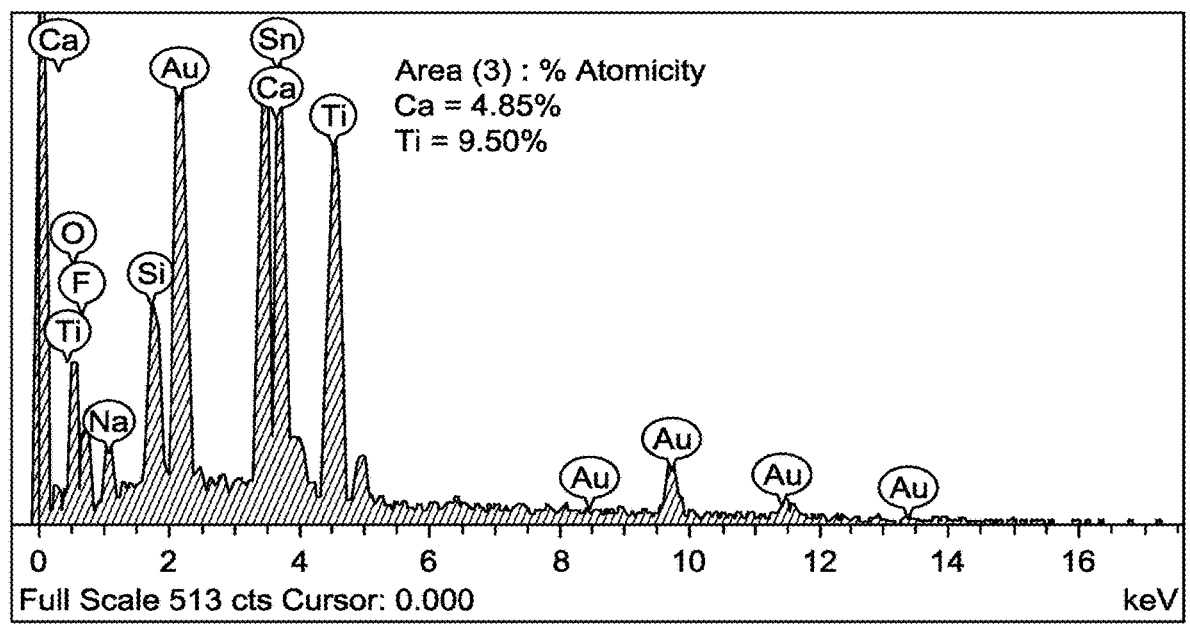
FIG. 9E shows the EDX spectra recorded from an area of $CaTiO_3$—$TiO_2$ film deposited at 550° C. on FTO substrate.
Figure 9F:
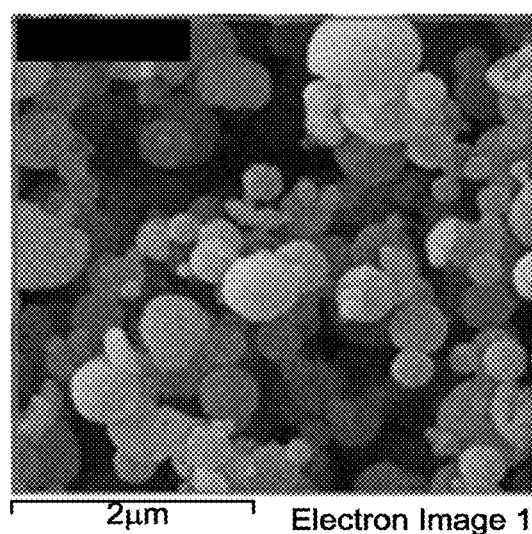
FIG. 9F shows an FESEM of the area of FIG. 9E.
Figure 9G:
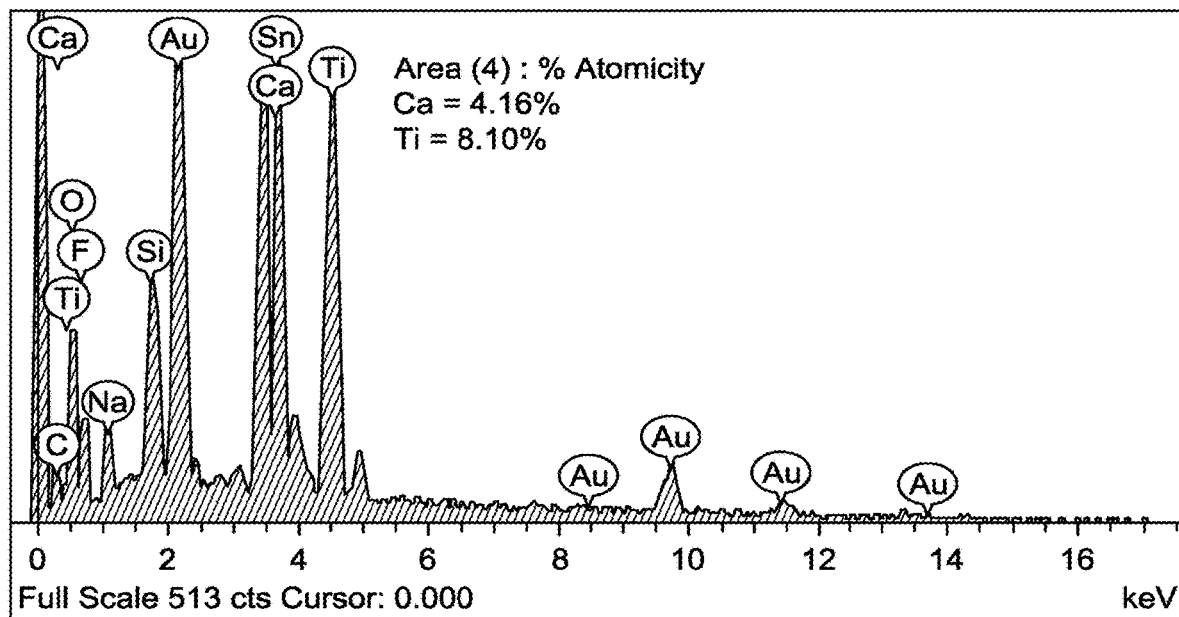
FIG. 9G shows the EDX spectra recorded from an area of CaTiO$_3$—TiO$_2$ film deposited at 550° C. on FTO substrate.
Figure 9H:
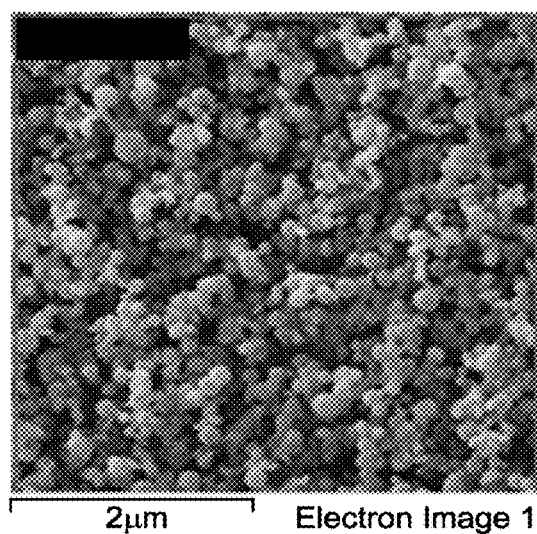
FIG. 9H shows an FESEM of the area of FIG. 9G.
Figure 10A:
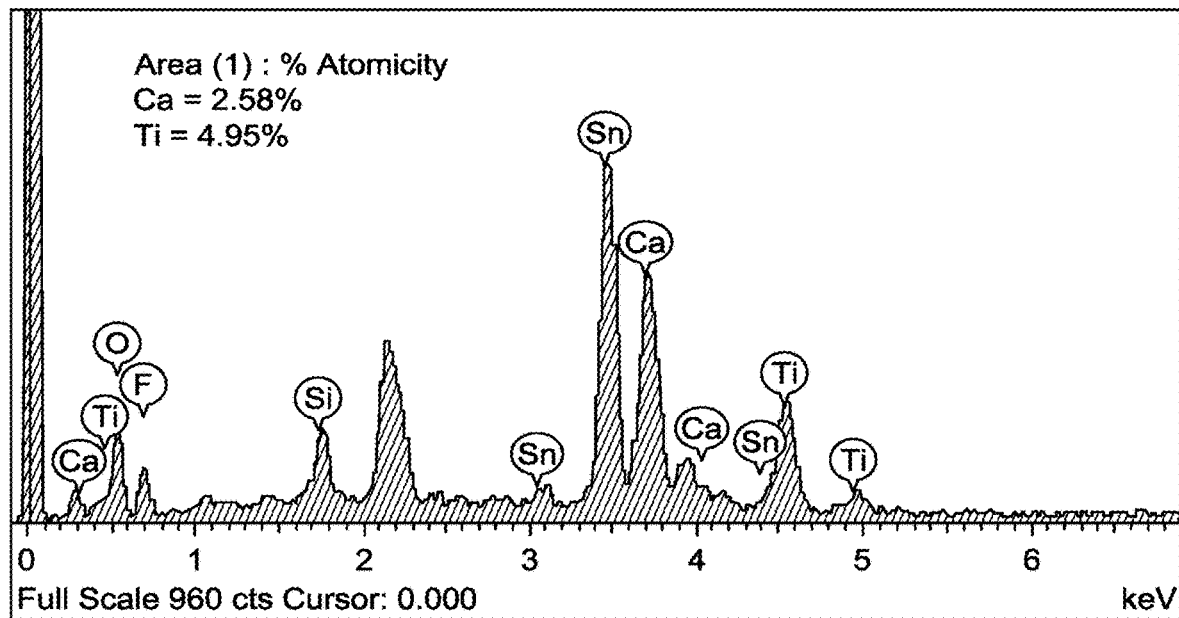
FIG. 10A shows the EDX spectra recorded from an area of CaTiO$_3$—TiO$_2$ film deposited at 600° C. on FTO substrate.
Figure 10B:
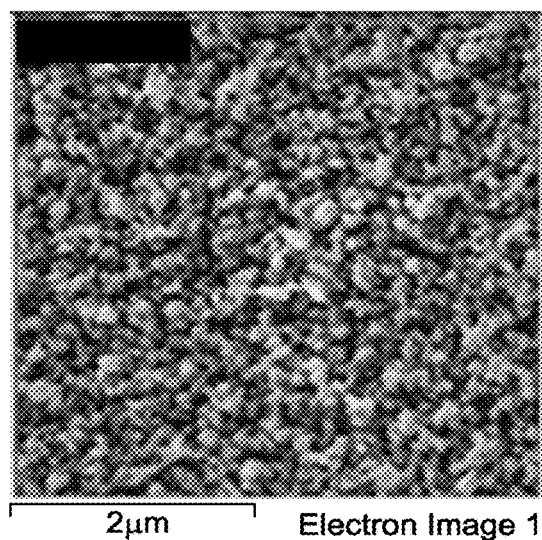
FIG. 10B shows an FESEM of the area of FIG. 10A.
Figure 10C:
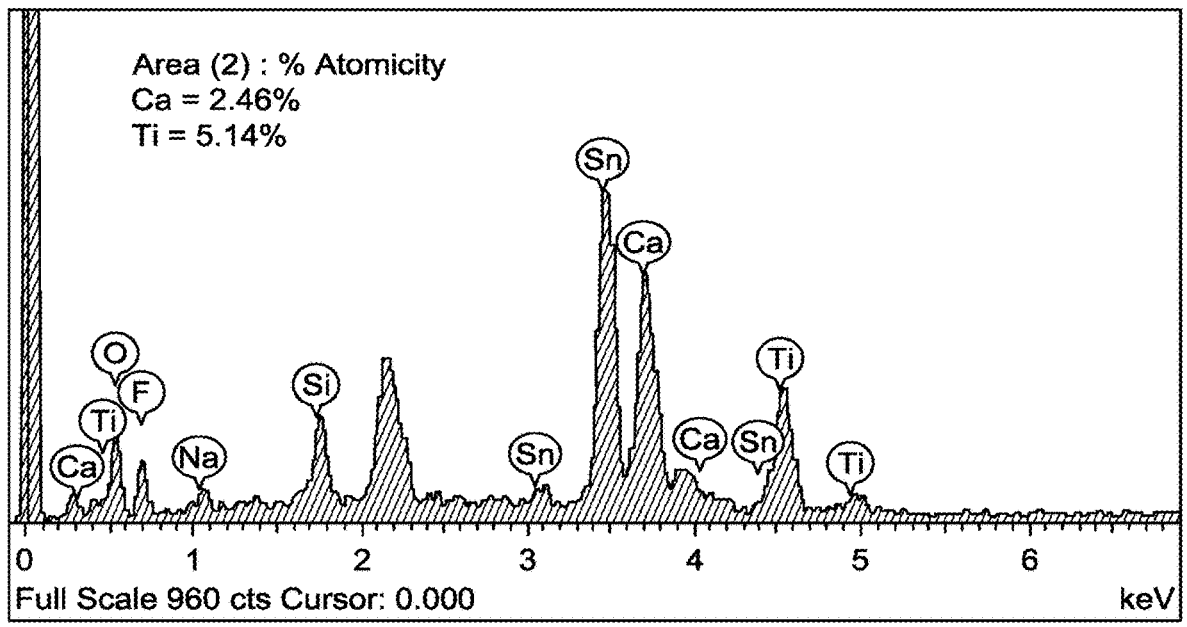
FIG. 10C shows the EDX spectra recorded from an area of CaTiO$_3$—TiO$_2$ film deposited at 600° C. on FTO substrate.
Figure 10D:
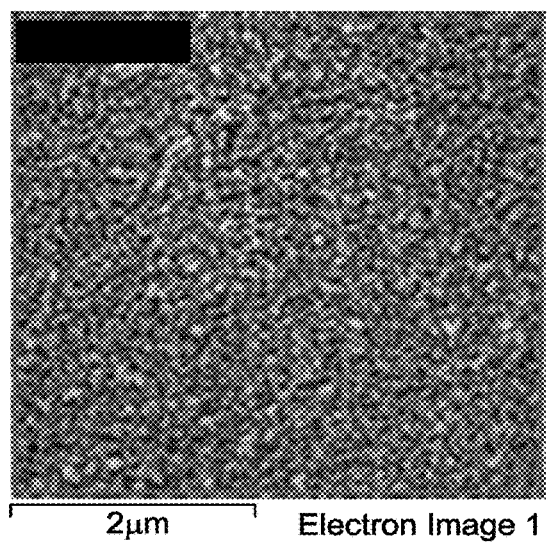
FIG. 10D shows an FESEM of the area of FIG. 10C.
Figure 10E:
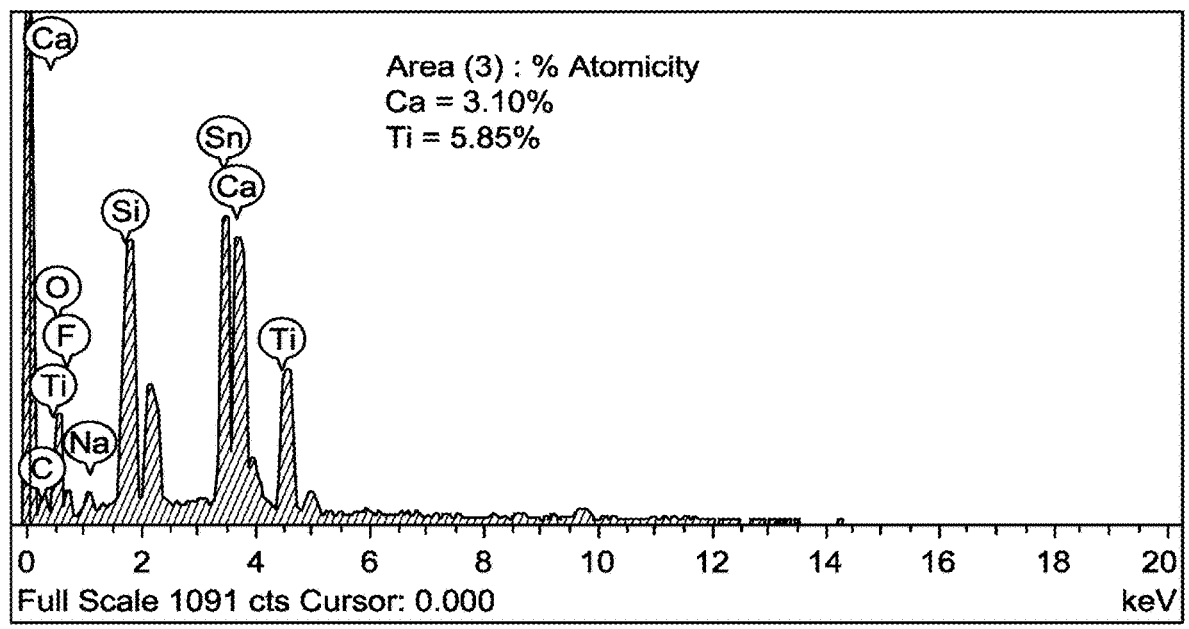
FIG. 10E shows the EDX spectra recorded from an area of CaTiO$_3$—TiO$_2$ film deposited at 600° C. on FTO substrate.
Figure 10F:
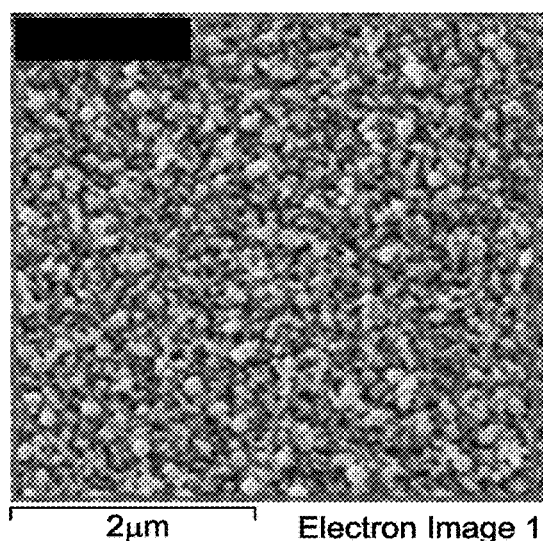
FIG. 10F shows an FESEM of the area of FIG. 10E.
Figure 10G:
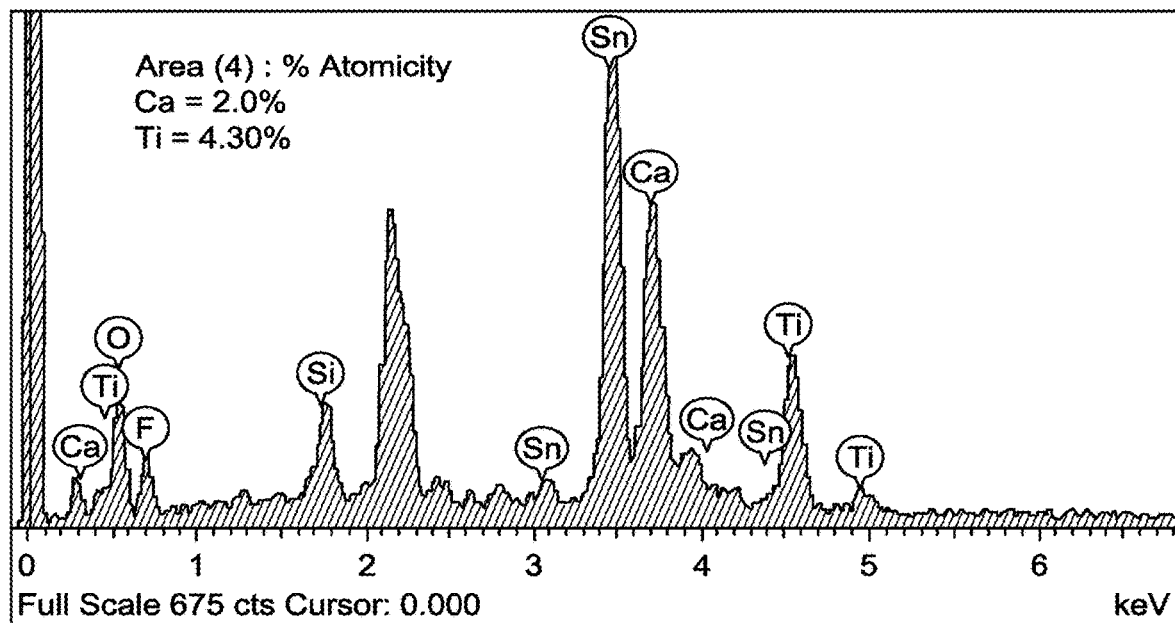
FIG. 10G shows the EDX spectra recorded from an area of CaTiO$_3$—TiO$_2$ film deposited at 600° C. on FTO substrate.
Figure 10H:
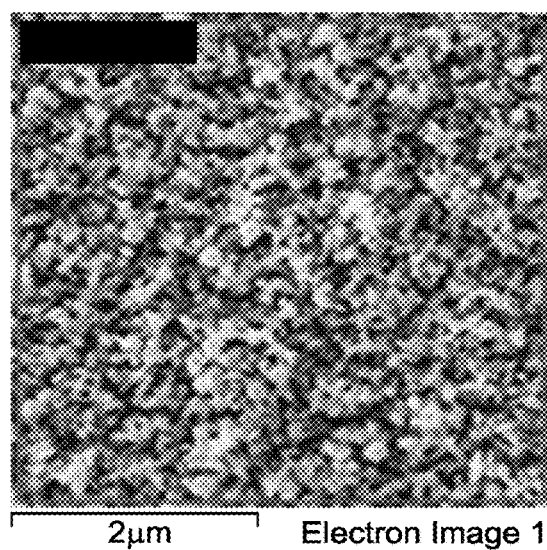
FIG. 10H shows an FESEM of the area of FIG. 10G.
Figure 11A:
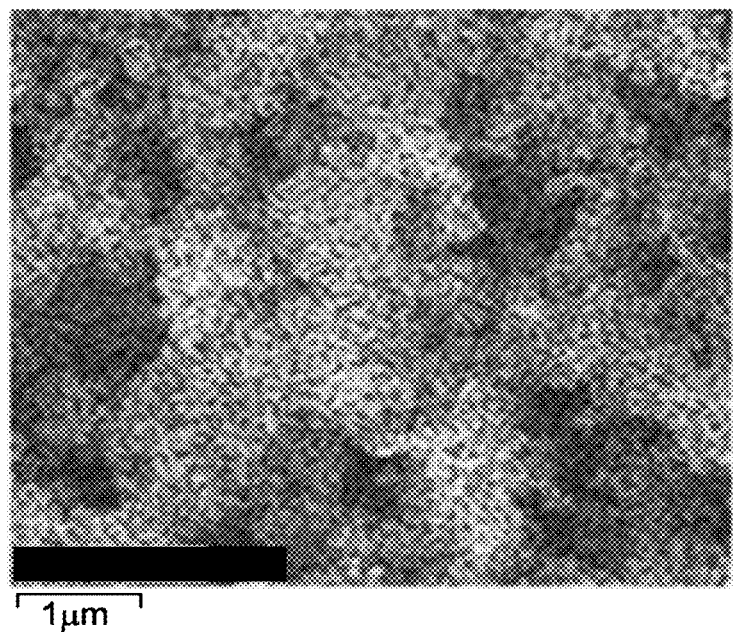
FIG. 11A is an FESEM image with overlaid EDX elemental map showing the combined distribution of Ca, Ti, and O atoms in a CaTiO$_3$—TiO$_2$ composite film deposited at 500° C.
Figure 11B:
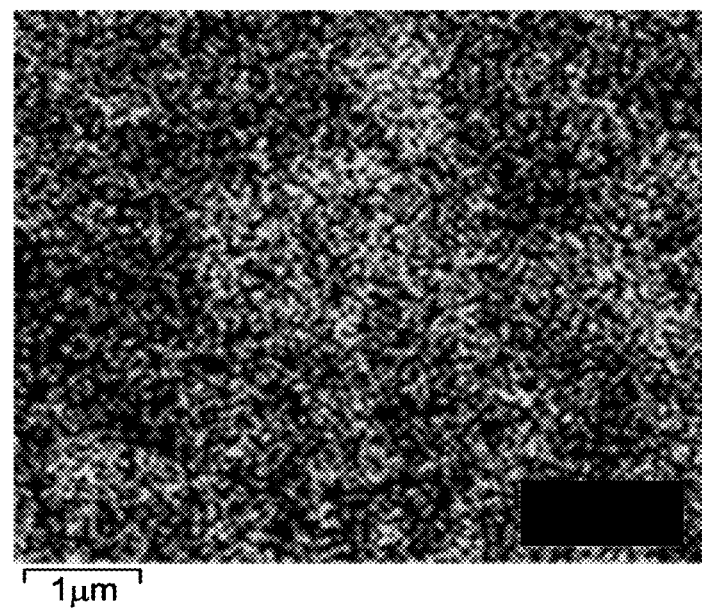
FIG. 11B is the EDX elemental map of FIG. 11A showing only the distribution of Ti atoms.
Figure 11C:
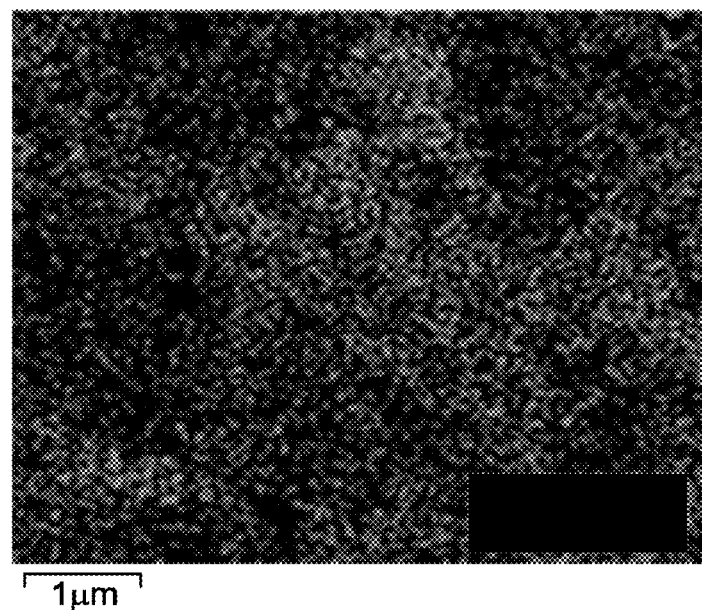
FIG. 11C is the EDX elemental map of FIG. 11A showing only the distribution of Ca atoms.
Figure 11D:
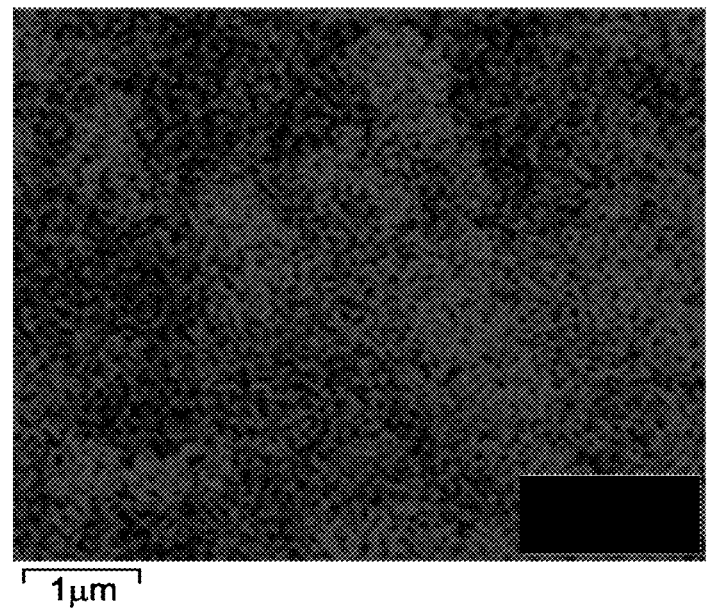
FIG. 11D is the EDX elemental map of FIG. 11A showing only the distribution of 0 atoms.
Figure 12A:
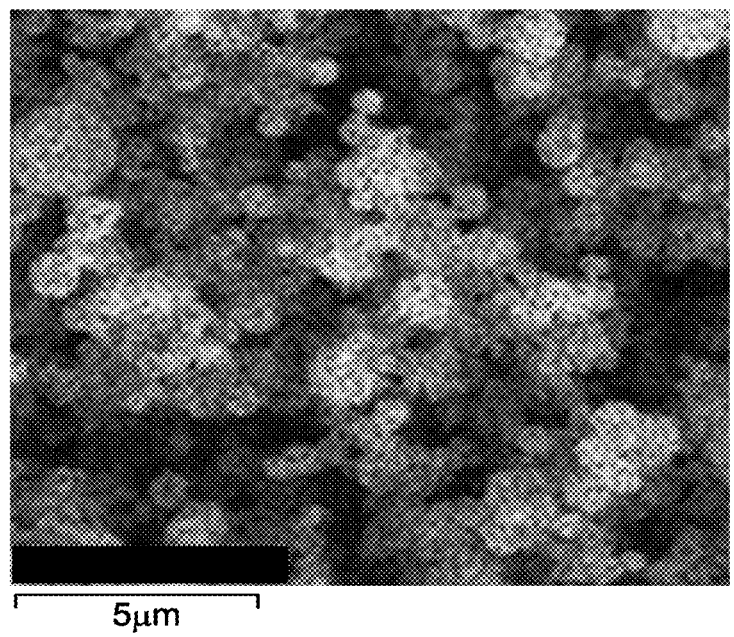
FIG. 12A is an FESEM image with overlaid EDX elemental map showing the combined distribution of Ca, Ti, and O atoms in a CaTiO$_3$—TiO$_2$ composite film deposited at 550° C.
Figure 12B:
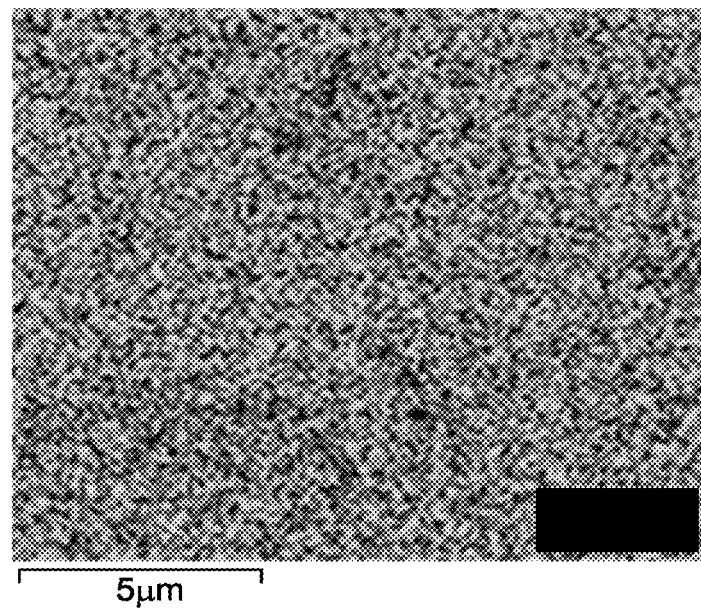
FIG. 12B is the EDX elemental map of FIG. 12A showing only the distribution of Ti atoms.
Figure 12C:
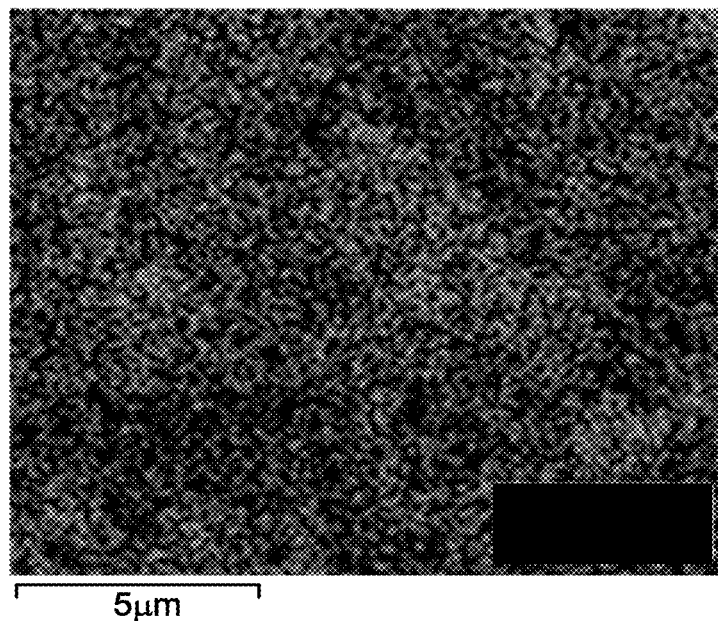
FIG. 12C is the EDX elemental map of FIG. 12A showing only the distribution of Ca atoms.
Figure 12D:
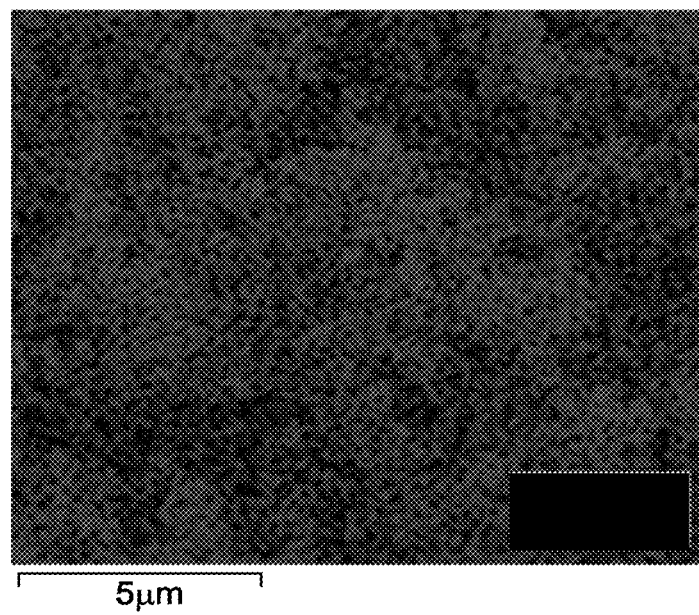
FIG. 12D is the EDX elemental map of FIG. 12A showing only the distribution of 0 atoms.
Figure 13A:
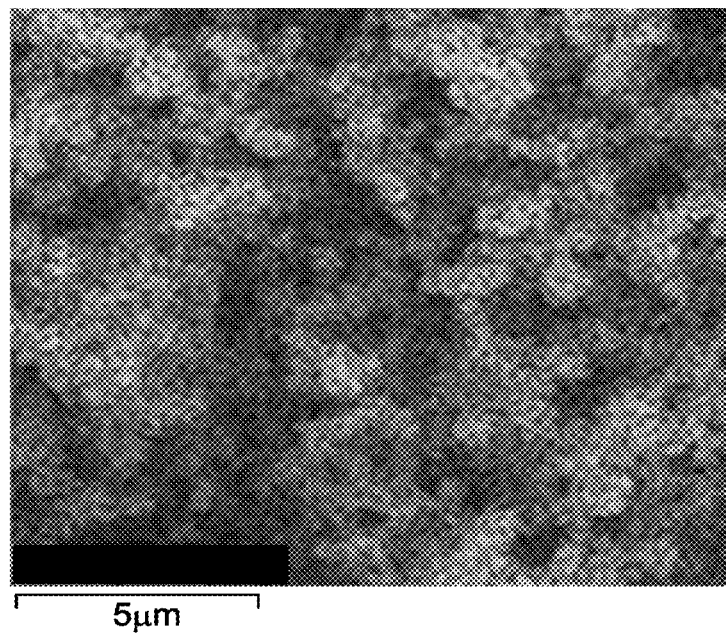
FIG. 13A is an FESEM image with overlaid EDX elemental map showing the combined distribution of Ca, Ti, and O atoms in a CaTiO$_3$—TiO$_2$ composite film deposited at 600° C.
Figure 13B:
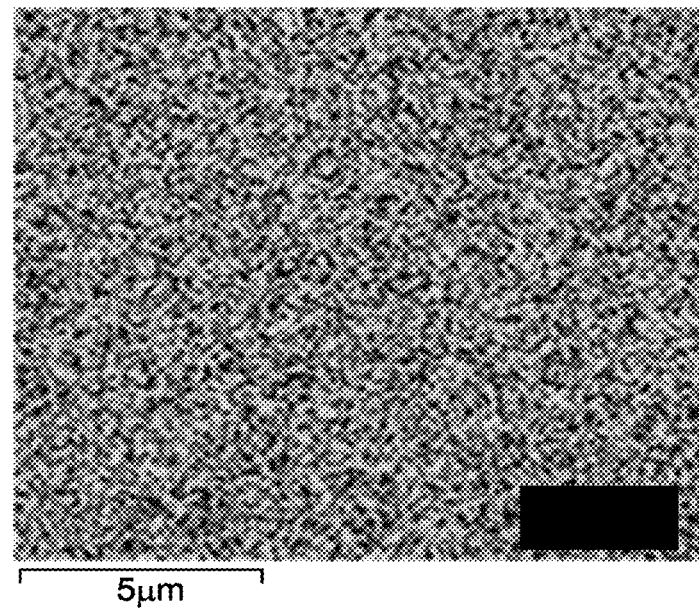
FIG. 13B is the EDX elemental map of FIG. 13A showing only the distribution of Ti atoms.
Figure 13C:
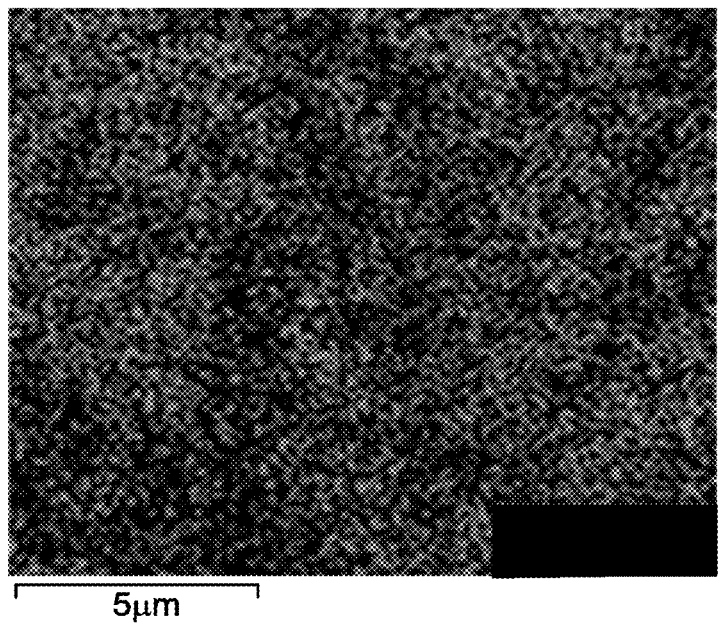
FIG. 13C is the EDX elemental map of FIG. 13A showing only the distribution of Ca atoms.
Figure 13D:
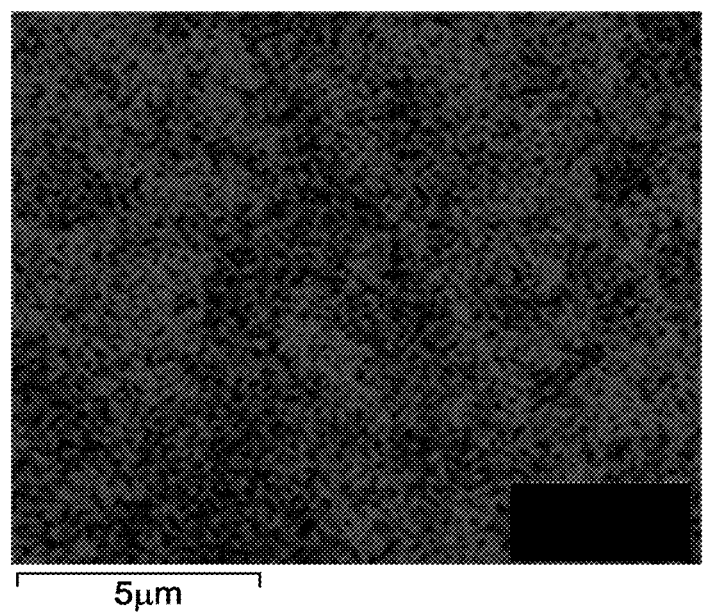
FIG. 13D is the EDX elemental map of FIG. 13A showing only the distribution of 0 atoms.

However, SEM cross sectional views, FIGS. 5C, 6C, 7C, depict the variation in film thickness as a function of varying substrate temperature. The CaTiO$_3$—TiO$_2$ film developed at 500° C. displayed a layer of spheroid particles of thickness around 3.0 µm which almost become double (≈6.0 µm) when temperature increased to 550° C., suggesting that film growth rates become better with rise in the deposition temperature. The nucleation and growth of spherical particles further enhances with increasing deposition temperature up to 600° C. A layer of spheroid objects can be clearly seen on the surface with an average thickness of 9.0 µm.

Energy dispersive X-ray analysis (EDX) is used to confirm the elemental composition and purity of all the composite films. The EDX spectra (FIGS. 8A-8H, 9A-9H, and 10A-10H) demonstrate the atomic ratio of Ca to Ti is about 1:2, confirming the formation of 1:1 for CaTiO$_3$: TiO$_2$ composite material. EDX patterns also indicate a uniform concentration of Ca and Ti in all regions examined, indicating that CaTiO$_3$ and TiO$_2$ phases are uniformly distributed. The various signals resulted from substrate elements (i.e., Sn, Si, Na, F) and Au-coating are not excluded from EDX spectra. Further, the composite nature of CaTiO$_3$—TiO$_2$ films was established from EDX mapping (FIGS. 11A-11D, 12A-12D, 13A-13D) indicating that calcium, titanium, and oxygen atoms are evenly distributed throughout the films matrices, which confirms the composite nature of all films.

Example 12

Results and Discussion—XPS Analysis

In order to further confirm the elemental composition and the chemical state of CaTiO$_3$—TiO$_2$ composite, XPS measurements were carried out on the film fabricated at 600° C. and XPS spectra are illustrated in FIGS. 14A-14D. The survey spectrum, (FIG. 14A), reveals that Ca, Ti, and O are major elements present on the film surface and Ca/Ti atomic ratio was found to be 1:2 that is consistent with EDX results.

Figure 14A:
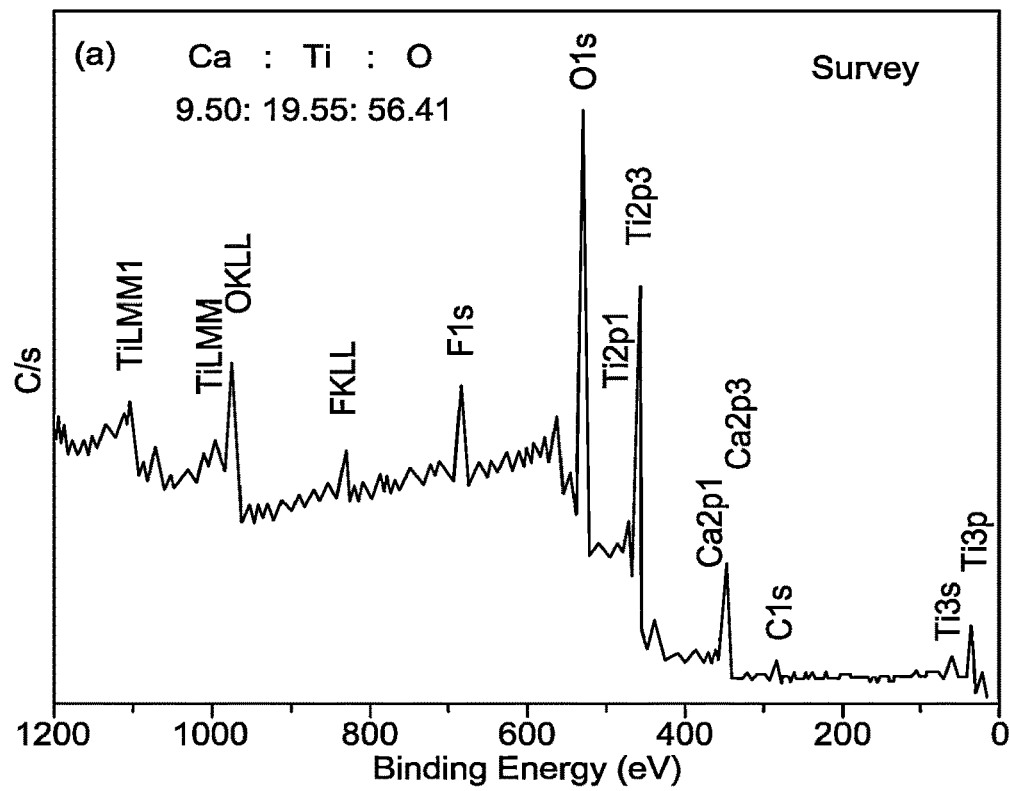
FIG. 14A is an XPS survey scan spectrum of CaTiO$_3$—TiO$_2$ composite film deposited at 600° C.
Figure 14B:
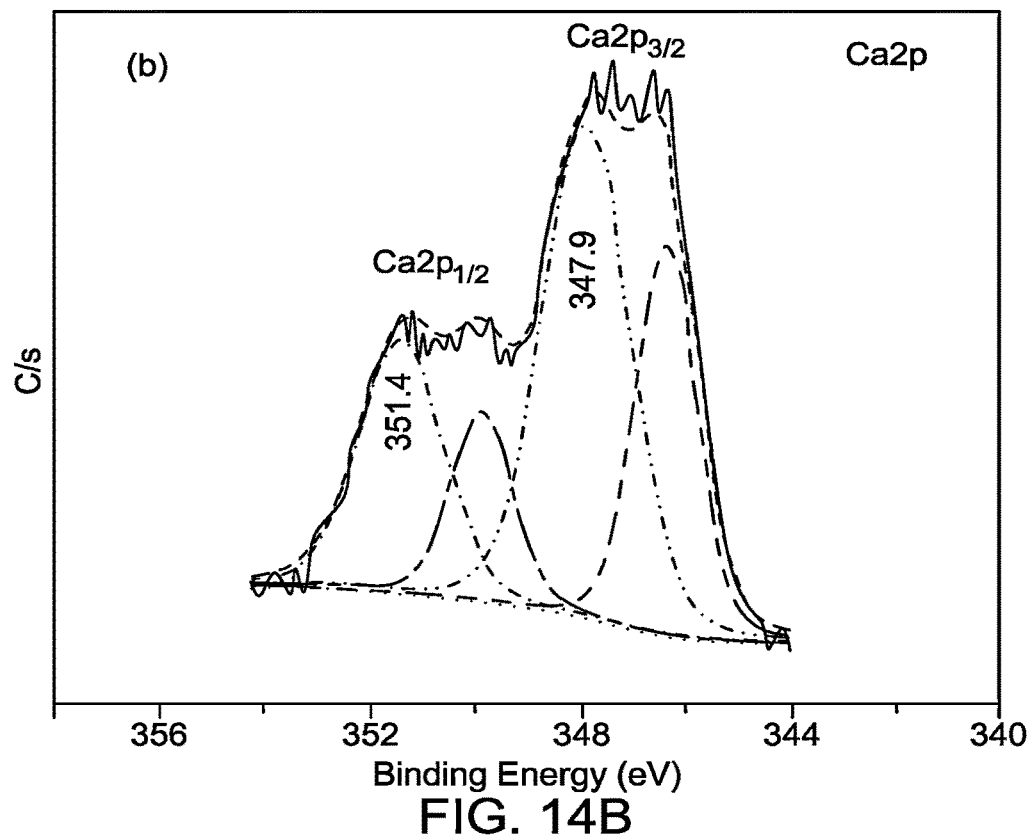
FIG. 14B is a high resolution XPS spectrum of the film of FIG. 14A for Ca 2p.
Figure 14C:
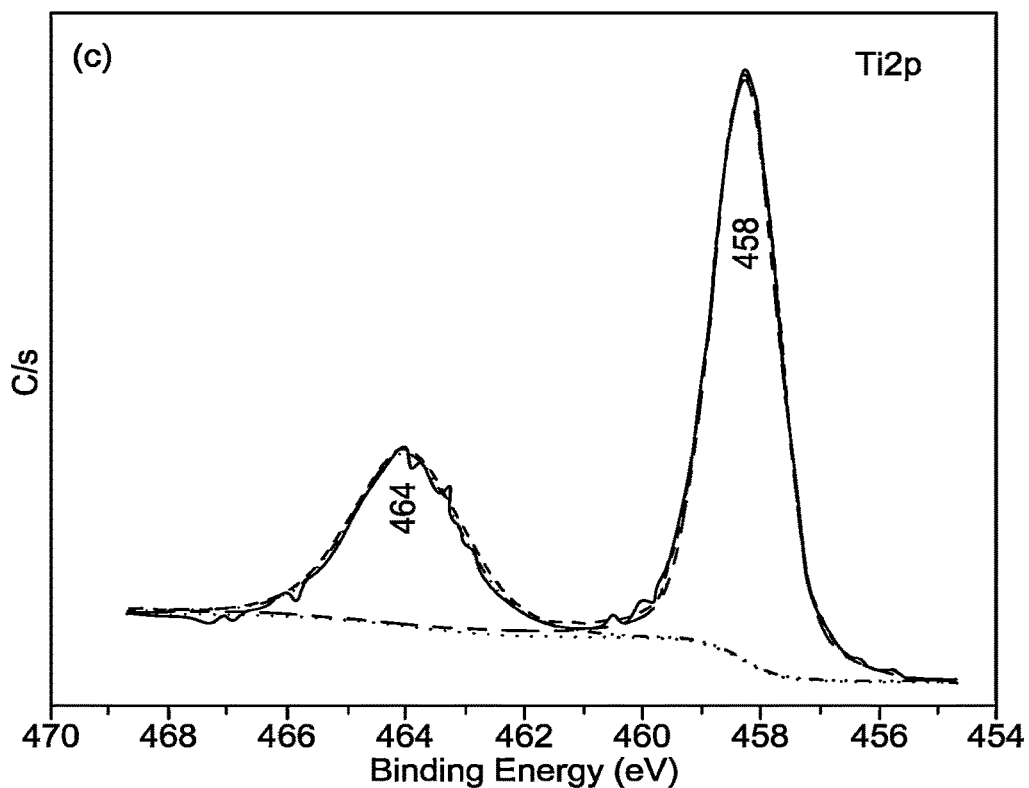
FIG. 14C is a high resolution XPS spectrum of the film of FIG. 14A for Ti 2p.
Figure 14D:
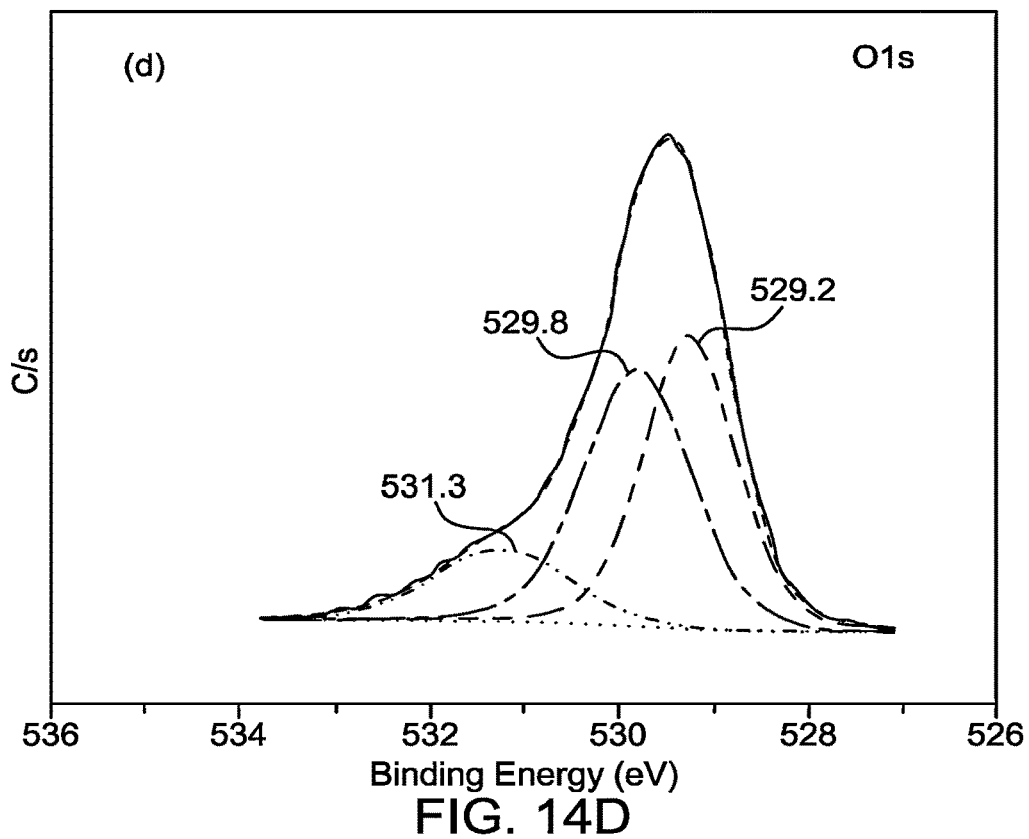
FIG. 14D is a high resolution XPS spectrum of the film of FIG. 14A for O 1s.

The high resolution XPS spectrum of Ca (FIG. 14B) displays two peaks located at about 346.0 eV and 351.0 eV corresponding to the Ca2p3/2 and Ca2p1/2, respectively and represents the chemical state of $Ca^{2+}$. See D. Wei, Y. Zhou, D. Jia and Y. Wang, J. Biomed. Mater. Res. B Appl. Biomater. 84, 444-451 (2008), incorporated herein by reference in its entirety. The double peak can be de-convoluted from the curve fitting into four sub peaks at 346.3, 347.9, 349.9 and 351.4 eV, FIG. 14B. These results suggest the presence of $CaTiO_3$ (347.9 eV) with some $CaCO_3$ (349.9 eV) and these data are in accordance with reported data for $CaTiO_3$. See S.-W. Lee, L. Lozano-Sanchez, V. Rodriguez-Gonzalez, J. Hazard. Mater. 263, 20-27 (2013), incorporated herein by reference in its entirety. The XPS spectrum of Ti (FIG. 14C) shows two main peaks at 458.0 eV and 464.0 eV that can be referred to the Ti 2p3/2 and Ti 2p1/2, respectively, confirming the presence of $Ti^{4+}$ in $CaTiO_3$—$TiO_2$ composite oxides. See D. Boukhvalov, D. Korotin, A. Efremov, E. Kurmaev, C. Borchers, 1. Zhidkov, D. Gunderov, R. Valiev, N. Gavrilov, S. Cholakh, Phys. Status Solidi B 252, 748-754 (2015), incorporated herein by reference in its entirety. In FIG. 14D, the 0 is profile can be fitted to two symmetrical peaks at 529.2 and 529.8 eV, accredited to Ca—O and Ti—O, respectively. The small peaks at 531.1 eV can be assigned to the chemisorbed oxygen caused by the surface hydroxyl (OH). See X-J. Huang et al. (2016).

Example 13

Results and Discussion—Optical Properties

Figure 15A:
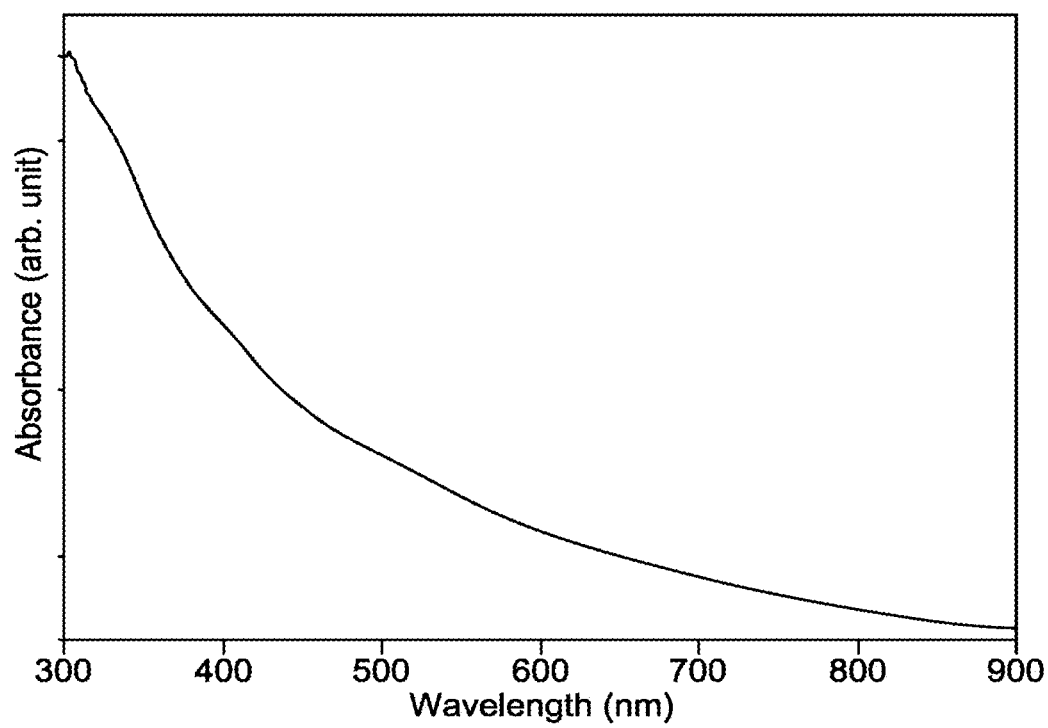
FIG. 15A is a UV-Visible absorption spectrum of CaTiO$_3$—TiO$_2$ composite, deposited at 600° C. by AACVD.

The optical bandgap ($E_g$) of $CaTiO_3$—$TiO_2$ composite films grown at 600° C. was investigated by UV-Visible absorption spectrophotometry. UV-visible absorption spectrum (FIG. 15A) of $CaTiO_3$—$TiO_2$ display a steep absorption in the wavelength region of 300-470 nm. The optical band gap of the composite films has been graphically determined from Tauc's formula valid for direct bandgap semiconductors (i.e., $\alpha h v = A(h v - E_g)^{1/2}$) where A is a constant, $\alpha$ is the absorption coefficient, hv is the photon energy, and $E_g$ is the band gap energy).

Figure 15B:
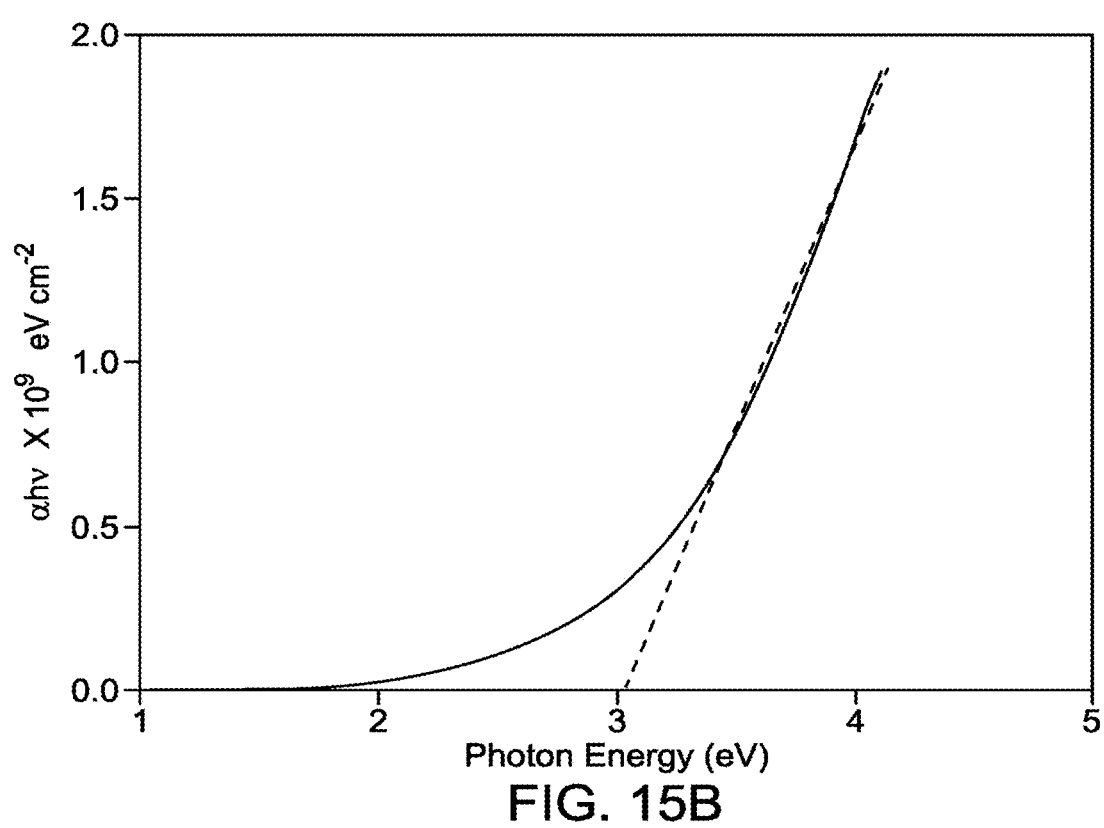
FIG. 15B the corresponding Tauc's plot of $(\alpha h\nu)^2$ vs. E/eV for the spectrum of FIG. 15A.

FIG. 15B shows the corresponding Tauc's plot between $(\alpha h v)^2$ versus $E_g$. A direct band gap value for composite oxide film is derived as 3.0 eV from the extrapolated straight lines to the X axis of $E_g$ at $\alpha=0$. The bandgaps for perovskite $CaTiO_3$ and anatase $TiO_2$ are reported to be 3.5 eV and 3.2 eV respectively. See H. Mizoguchi, K. Ueda, M. Orita, S.-C. Moon, K. Kajihara, M. Hirano, H. Hosono, Mater. Res. Bull. 37, 2401-2406 (2002); and D. O. Scanlon, C. W. Dunnill, J. Buckeridge, S. A. Shevlin, A. J. Logsdail, S. M. Woodley, C. R. A. Catlow, M. J. Powell, R. G. Palgrave, I. P. Parkin, Nat. Mater. 12, 798-801 (2013), each incorporated herein by reference in their entirety. The optical measurements of $CaTiO_3$—$TiO_2$ composite film show that incorporation of $TiO_2$ into perovskite $CaTiO_3$ leads to a red shift in the optical response and a concomitant reduction of 0.5 eV in $E_g$ of $CaTiO_3$. It is well established that coupling of two semiconductors results in contraction of optical bandgap due to the synergic effect of the two components present in the composite. See F. Hu and W. Chen, Electrochem. Commun. 13, 955-958 (2011); and M. A. Mansoor, M. Mazhar, M. Ebadi, H. N. Ming, M. A. M. Teridi, L. K. Mun, New J. Chem. 40, 5177-5184 (2016), each incorporated herein by reference in their entirety. The positive effect of synergic cooperation is commonly explained by the opinion that, in the new equilibrium Fermi energy level of the $CaTiO_3$—$TiO_2$ composite, the photo excited electron on the conduction band of $CaTiO_3$ are readily transferred into the $TiO_2$ particles. The accumulation of excess electrons in $TiO_2$ diminishes the recombination of photo-induced electrons and holes and thus, improves the photocatalytic activity of the films. Similar synergistic effects of $TiO_2$ with $SrTiO_3$ and $BaTiO_3$ have been previously reported for their enhanced photocatalytic efficiencies. See S. E. Stanca, R. Müller, M. Urban, A. Csaki, F. Froehlich, C. Krafft, J. Popp, W. Fritzsche, Catal. Sci. Technol. 2, 1472-1479 (2012); and J. Ng, S. Xu, X. Zhang, H. Y. Yang and D. D. Sun, Adv. Funct. Mater. 20, 4287-4294 (2010), each incorporated herein by reference in their entirety.

Example 13

Results and Discussion—Photoelectrochemical Performance

Figure 16A:
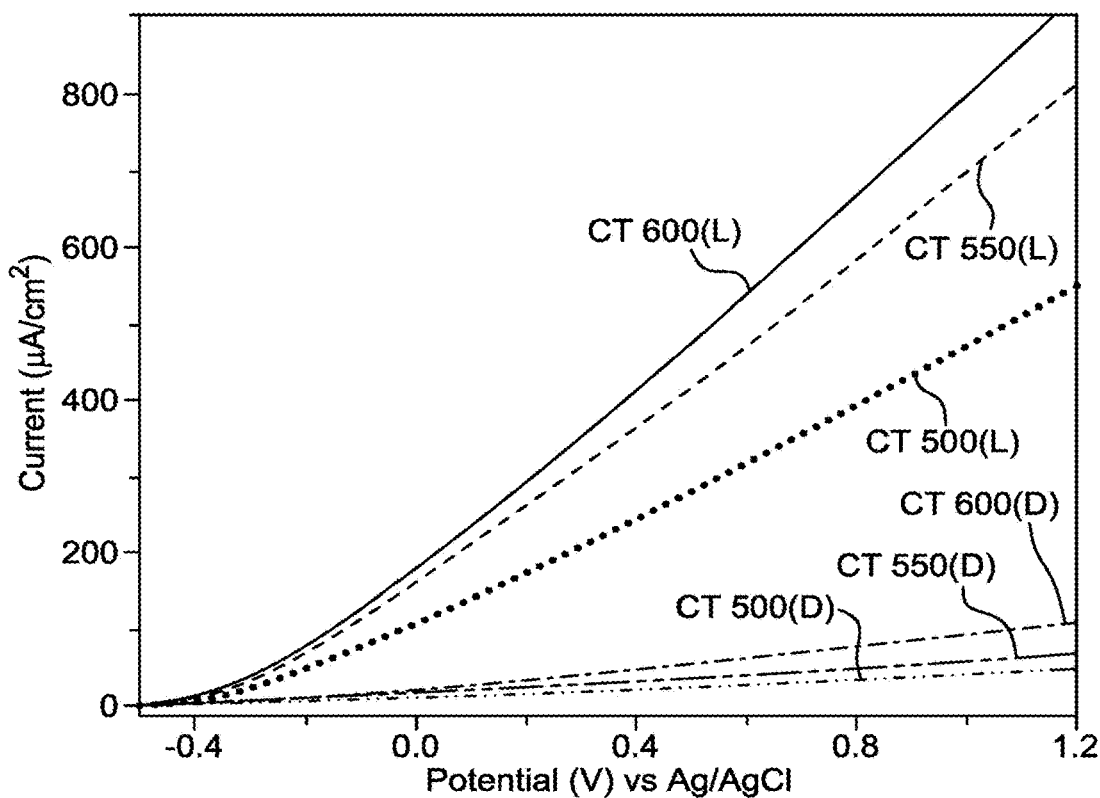
FIG. 16A shows LSV curves for CaTiO$_3$—TiO$_2$ electrodes deposited at 500, 550 and 600° C. in 1M NaOH under dark and simulated AM 1.5 illumination of 100 mWcm$^{-2}$.

To evaluate the photoelectrochemical (PEC) behavior of the $CaTiO_3$—$TiO_2$ (CT) composite, the films were employed as photoanodes in a 3-arm cell. A Pt counter electrode with 1 M NaOH as an electrolyte were employed, and all $CaTiO_3$—$TiO_2$ electrodes (CT-500, CT-550, and CT-600) were illuminated with simulated sunlight, (100 mW xenon lamp equipped with AM 1.5 filters). The current density-voltage (J-V) characteristics of $CaTiO_3$—$TiO_2$ electrodes as recorded in dark (D) and light (L) conditions are shown in FIG. 16A. The dark current coming from each electrode at −0.4 V to +0.7 V (vs. Ag/AgCl) was almost negligible. A prompt photocurrent response in all cases is observed after the illumination, however, the magnitude of photocurrent varied depending upon the deposition temperature. Notably, the CT-600 electrode deposited at 600° C. exhibited highest photocurrent of 610 $\mu A$ $cm^{-2}$ at 0.7 V compared to the CT-550 and CT-500 electrodes, which produced photocurrent densities of 530 and 370 $\mu A$ $cm^{-2}$, respectively. This reflects that deposition temperature is a significant factor influencing the photocurrent density of the film electrode which ultimately affects the structural properties of the $CaTiO_3$—$TiO_2$ electrodes such as crystallinity, surface morphology, and thickness. It is evident from XRD and SEM (surface and cross-sectional) results that CT-600 electrode exhibits higher crystallinity and a denser layer (~9 $\mu m$) of microspherical particles (FIG. 7C) than the other two electrodes (CT-550 and CT-500) which are relatively less crystalline and thinner (~6 $\mu m$ and ~3 $\mu m$, respectively). The improved crystalline pattern of CT 600 eliminates the distortion and poor lattice mismatching between particle-particle or particle-conducting layer connection and develops better linkage between $CaTiO_3$—$TiO_2$ crystallites that lead to a reduction in the recombination and improved charge transport properties in the electrode, thus exhibiting better PEC performance. It is well known that the electrode fabrication method has a strong effect on the crystalline structure and morphology of the composite film system and thus the performance of the PEC cells. See W. Wang, M. O. Tadé, Z. Shao, Chem. Soc. Rev. 44, 5371-5408 (2015), incorporated herein by reference in its entirety.

Figure 16B:
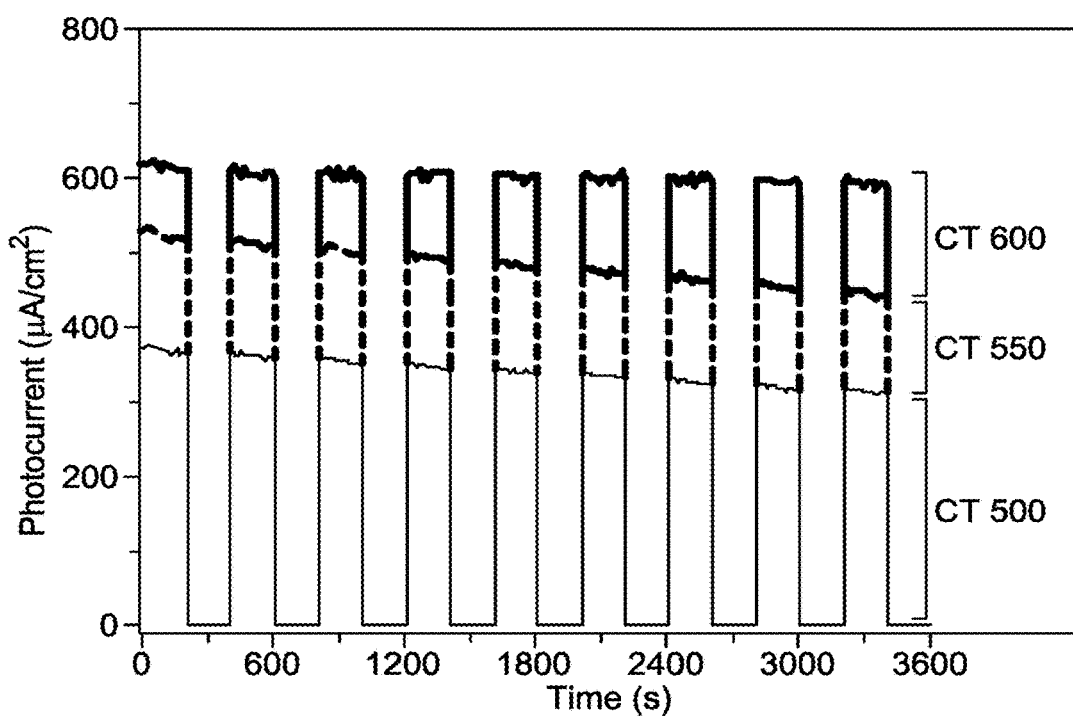
FIG. 16B shows transient photocurrent responses recorded for CaTiO$_3$—TiO$_2$ electrodes deposited at 500, 550 and 600° C. in 1M NaOH under dark and simulated AM 1.5 illumination of 100 mWcm$^{-2}$.

To further confirm that photoresponses of $CaTiO_3$—$TiO_2$ electrodes are due to the absorption of light, choronoamperometric 1-t studies were carried out under the white light illumination of 100 $mW/cm^2$ with an on-off illumination cycle of 200 s and a bias potential of +0.7 V (vs. Ag/AgCl)). FIG. 16B illustrates that all $CaTiO_3$—$TiO_2$ photoanodes were able to sustain and replicate their photocurrents during long term continuous on-off illumination for 1 h without any noticeable deterioration in photocurrent which reveals their excellent stabilities during the photo-induced electrochemical process. Additionally, the transient photocurrent values recoded for CT-500 (372 µA cm$^{-2}$), CT 550 (527 µA cm$^{-2}$) and CT-600 (610 µA cm$^{-2}$) correspond well with their linear sweep voltametry results, thus strengthening the photoelectrocatalytic performance of the CaTiO$_3$—TiO$_2$ electrodes.

Figure 17A:
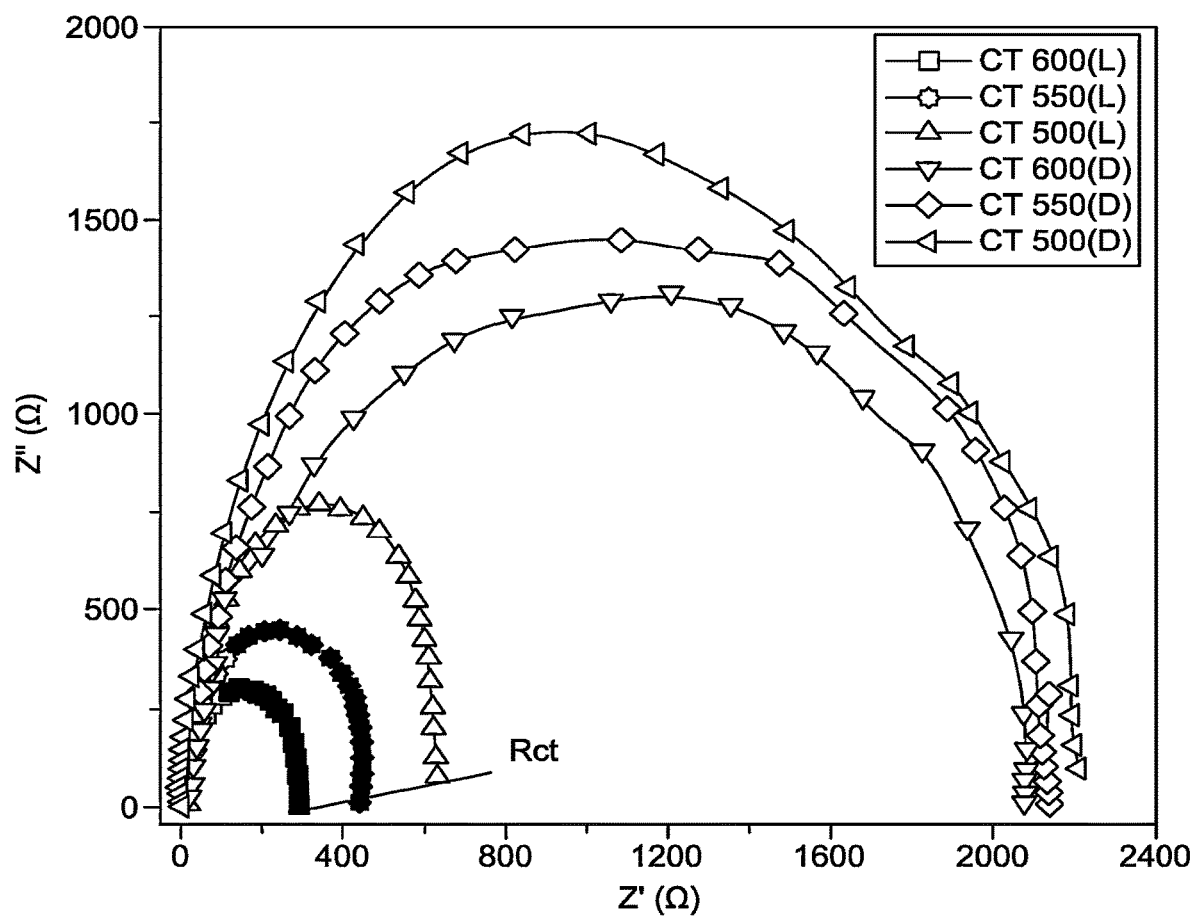
FIG. 17A shows EIS Nyquist plots for the CaTiO$_3$—TiO$_2$ films fabricated at different temperatures and in light and dark conditions.

Electrochemical impedance spectroscopy (EIS) was also performed to probe the resistivity of the electrode materials and the interfacial properties between the electrode and the electrolyte over a frequency from 10 kHz to 0.1 Hz in the presence of 0.1M NaOH. FIG. 17A shows the EIS Nyquist plot of CaTiO$_3$—TiO$_2$ electrodes measured in dark and illumination conditions. In the Nyquist plot, the arc of a semicircle at high frequency range represents the typical charge-transfer process, and the diameter of the semicircle reflects the charge-transfer resistance ($R_{ct}$).

As shown in FIG. 17A, the diameter of all CaTiO$_3$—TiO$_2$ electrodes was much larger in the dark offering higher $R_{ct}$ which inhibits the charge transfer process across the electrode-electrolyte interface. However in presence of light, the Nyquist curves of all CaTiO$_3$—TiO$_2$ electrodes are considerably reduced in size, indicating lowering of $R_{ct}$ that facilitate the fast mobility of electron by reducing the recombination of electron-hole pairs. The $R_{ct}$ values measured from Nyquist plots are listed in Table 3. Moreover, the Table 5 compares the $R_{ct}$ values of three CT (L) electrodes and reveals that influence of illumination on CT-600 electrode is more pronounced and results in lowest $R_{ct}$ value representing the efficient rather enhanced charge separation and transfer across the interface. Moreover, it reduces the possibility of charge recombination at the surface of the CT-600 electrode.

Consequently, the EIS findings are completely in agreement with voltammetry results and further endorse the PEC capabilities of CaTiO$_3$—TiO$_2$ electrodes.

TABLE 5

Charge transfer resistance, maximum frequency and recombination lifetime calculated for CaTiO$_3$—TiO$_2$ film electrodes fabricated at different indicated temperatures via AACVD.

| Film electrode | $R_{ct}$ (ohm) | $f_{max}$ (Hz) | $\tau_n$ (msec) |
| --- | --- | --- | --- |
| CT 500 (D) | 2208 | 265.4 | 0.59 |
| CT 500 (L) | 442 | 16.2 | 9.81 |
| CT 550 (D) | 2140 | 157.6 | 1.00 |
| CT 550 (L) | 442 | 1.96 | 81.1 |
| CT 600 (D) | 2078 | 137.9 | 1.11 |
| CT 600 (L) | 295 | 0.5 | 318 |

$R_{ct}$-Charge transfer resistance;
$f_{max}$-Maximum frequency;
$\tau_n$-recombination ifetime.

Figure 17B:
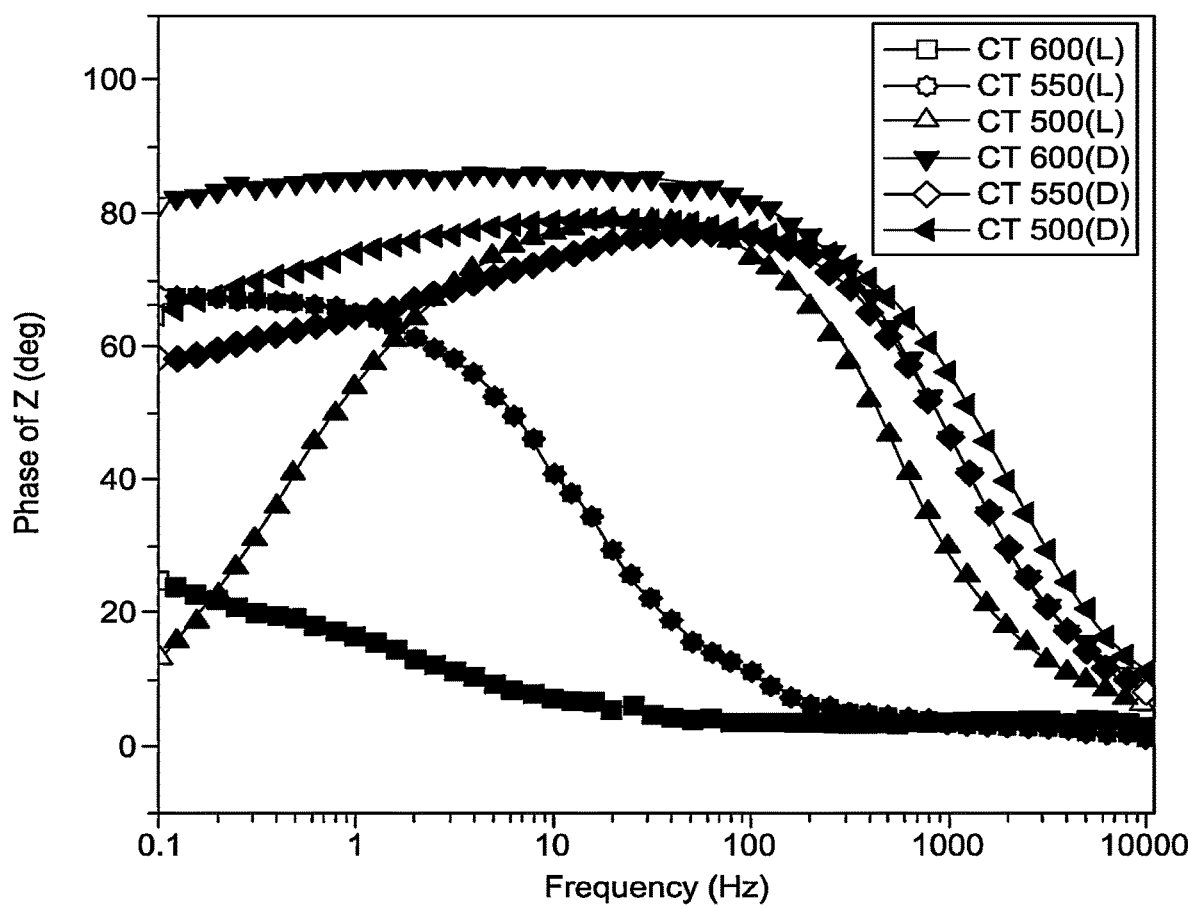
FIG. 17B shows Bode phase plots observed for the CaTiO$_3$—TiO$_2$ films fabricated at different temperatures using a frequency range of 0.1 Hz-10 kHz both in dark and light conditions.

The charge-transfer diffusion properties of CaTiO$_3$—TiO$_2$ electrodes can be further established by recording the frequency dependent phase angle plots (Bode plot) in dark and light conditions (FIG. 17B). In presence of light, the characteristic frequency peak ($f_{max}$) of all CaTiO$_3$—TiO$_2$ films are observed to shift towards low frequency region (0.1 Hz) (Table 3), suggesting the fast and facile electron-transfer behavior of all CT electrodes. Further, the low resistance of CT-600 under light exhibits peak shift more towards the low frequency region in the Bode plot (Table 3, FIG. 17B). Under illumination, the phase angle of the plot at higher frequency is less than 90° and there is lesser log z value in low frequency range of 1-100 Hz. This suggests that the electrode does not behave as an ideal capacitor.

The $f_{max}$ observed for each CaTiO$_3$—TiO$_2$ electrode can be used to determine the electron recombination lifetime ($\tau_n$) using the following equation:

$$\tau_n = 1/2\pi d_{max}$$

This defines the lifetime of charge carrier inside the bulk of the electrode material and higher $\tau_n$ value corresponds to the longer lifespan of the charge carrier. The calculated $\tau_n$ values for all CaTiO$_3$—TiO$_2$ electrodes in absence and presence of light are shown in Table 3. The data depicts that the lifetime of charge carriers corresponding to CaTiO$_3$—TiO$_2$ electrodes is prolonged effectively under light compared to dark conditions. The r value is highest as calculated for CT-600 (L) which in turn confirms the production of highest current density in it. Thus, the CaTiO$_3$—TiO$_2$ electrode made at 600° C. shows smaller interface impedance, higher photocurrent density, and better charge transportation properties as compared to the electrodes prepared at 500 and 550° C.

Figure 18:
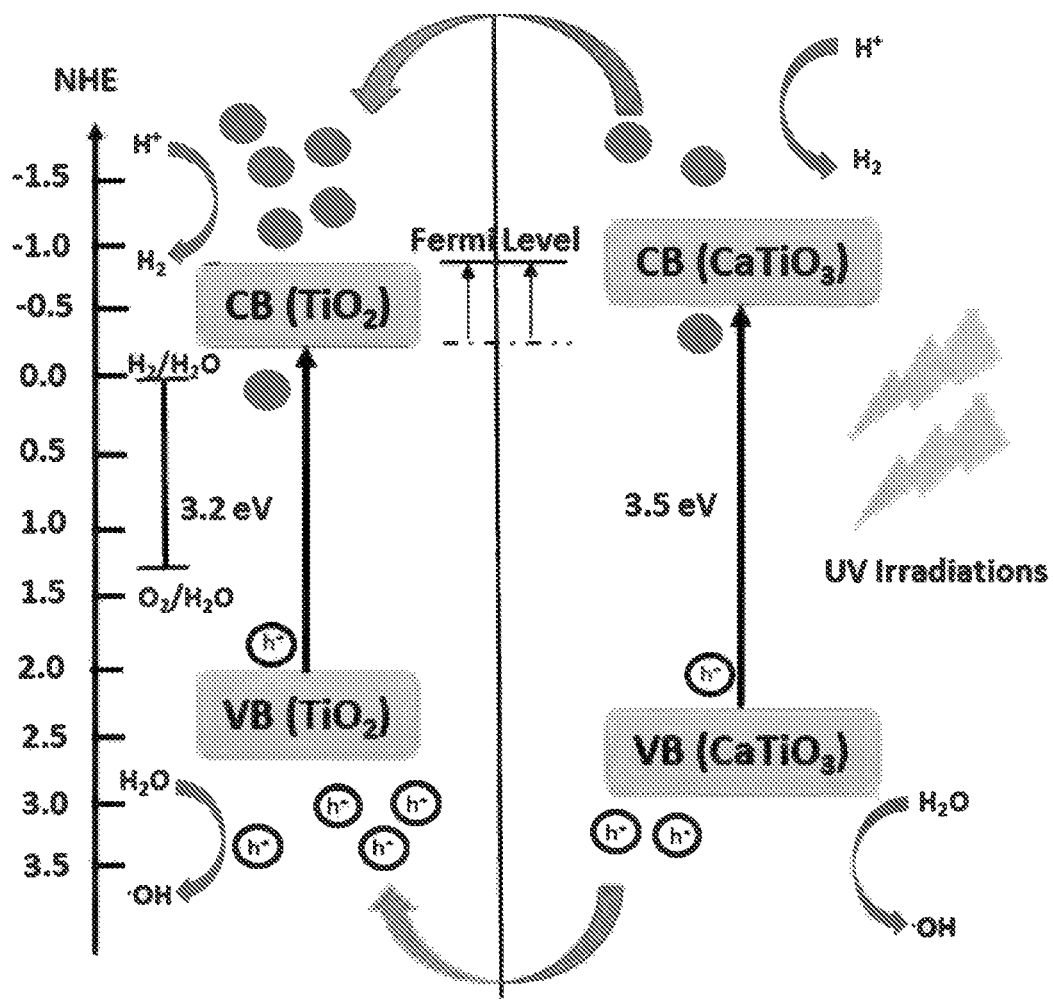
FIG. 18 shows a schematic representation of band positions and the spatial separation of light-generated interparticle charges during photocatalytic activation of CaTiO$_3$—TiO$_2$ with a negative shift in its Fermi level.

The PEC results of CaTiO$_3$—TiO$_2$ composite oxide have been compared with other calcium titanate based materials. The photocurrent density of 610 µA cm$^{-2}$ and electrochemical stability of 1 hour observed in the current studies is several time higher than the pristine CaTiO$_3$ (1.2 µAcm$^{-2}$) and Zr-doped CaTiO$_3$ (100 µAcm$^{-2}$) electrodes. See X. Yan, X. Huang, Y. Fang, Y. Min, Z. Wu, W. Li, J. Yuan, L. Tan, Int. J. Electrochem. Sci. 9, 5155-5163 (2014); and X.-j. Huang et al. (2016), each incorporated herein by reference in their entirety. The other Ag—CaTiO$_3$ and CaTiO$_3$-graphene composites were investigated for photocatalysis of organic molecules and are not relevant to the present work. See S.-W. Lee et al. (2013), and T. Xian et al. (2014). The higher photo-response of CaTiO$_3$—TiO$_2$ composite is attributed to better separation and transportation of photo-induced holes and electrons at the junction and this mechanism is depicted in FIG. 18. The bandgaps of anatase TiO$_2$ (3.2 eV) and perovskite CaTiO$_3$ (3.5 eV) are aligned in such manner that incident UV light can simultaneously activate both semiconductor materials. Upon illumination, electrons from VBs of CaTiO$_3$ and TiO$_2$ are excited and successively promoted to their respective CBs, leaving behind holes. These holes then perform oxidation at semiconductor/electrolyte junction. See M. Veith, M. Haas and V. Huch, Chem. Mater. 17, 95-101 (2005), incorporated herein by reference in its entirety. Since the CB of TiO$_2$ is ~0.3V more positive, the promoted electrons from the CB of CaTiO$_3$ are shifted there. See S.-W. Lee et al. (2013). The accumulation of excess electrons in TiO$_2$ causes a negative shift in its Fermi levels. In a previous photocatalytic investigation based on titanium-oxide-based composite of perovskite like structure, it was argued that the electrons flow to the CB of TiO$_2$ through a pn-junction. A pn-junction is an interface where the p-type acceptor compound (CaTiO$_3$) and n-type donor compound (TiO$_2$) connect electronically. See M. Ueda, S. Otsuka-Yao-Matsuo Sci. Technol. Adv. Mater. 5, 187-193 (2004); and T. Omaha, S. Otsuka-Yao-Matsuo, J. Photochem. Photobiol. 156, 243-248 (2003), each incorporated herein by reference in their entirety. The charge flow through the pn-junction may form highly reduced states of CaTiO$_3$—TiO$_2$ that are stable even under oxygen saturated conditions by inducing an efficient spatial separation of the photogenerated interparticle charges. This in turn improves the photocatalytic water splitting performance. See M. Ueda et al.

(2004); and Z. Jin, X. Zhang, Y. Li, S. Li, G. Lu, Catal. Commun. 8, 1267-1273 (2007), each incorporated herein by reference in their entirety. The Fermi levels of the undoped, intrinsic n-type $TiO_2$ semiconductor lies at the minimum of its CB range. The coupling of $CaTiO_3$ elevates Fermi energy levels to assume a more negative redox potential compared to $H^+/H_2$ (0 V vs. NHE). Thus an overall higher work function is shown for water reduction reactions. See Z. Jin et al. (2007); and A. Kudo, Y. Miseki, Chem. Soc. Rev. 38, 253-278 (2009), each incorporated herein by reference in their entirety. The negative shift in Fermi level is indicative of a large accumulation of electrons at the heterojunctions of $TiO_2$ and $CaTiO_3$, reflecting a decrease in recombination of charges. See J. Zhang, J. H. Bang, C. Tang, P. V. Kamat, ACS Nano 4, 387-395 (2009), incorporated herein by reference in its entirety. For efficient water splitting to produce $H_2$, the CB level should be sufficiently higher (more negative) than the reduction potential of $H_2O$. The theoretical minimum bandgap for water splitting has been calculated to be 1.23 eV. See A. Kudo, H. Kato and I. Tsuji, Chem. Lett. 33, 1534-1539 (2004), incorporated herein by reference in its entirety. It is expected that the $CaTiO_3$—$TiO_2$ composite can optimize light harvesting abilities with the incorporation of anatase and perovskite crystallites.

In the present work, photoelectrochemical water splitting has been demonstrated over robust and stable $CaTiO_3$—$TiO_2$ composite electrodes which have been developed through solution processed AACVD approach utilizing a mixture of $[Ca_2(TFA)_3(OAc))(^iPrOH)(H_2O)(THF)_3]$ and $Ti((CH_3)_2CHO)_4$ as dual source precursors. It has been found that the incorporation of $TiO_2$ into perovskite $CaTiO_3$ leads to decrease in the optical bandgap from 3.5 to 3.0 eV while reducing the possibility of $e^-$-$h^+$ recombination, thereby enhancing photocatalytic activity. The PEC experiments on $CaTiO_3$—$TiO_2$ electrodes at 0.7 V vs. Ag/AgCl/3M KCl under simulated solar irradiation of AM 1.5G (100 mW/cm$^2$) show maximum anodic photocurrent density of 610 µA/cm$^2$ in 1M NaOH. This enhanced activity of the composite film fabricated at 600° C. is further supported by EIS results that show a maximum frequency peak below 0.1 Hz. These results demonstrate efficient photocatalytic cleavage of water using novel $CaTiO_3$—$TiO_2$ composite films prepared through CVD methods. Such unique and efficient composite materials may find application in solar energy harvesting via photoelectrochemical cells.

The invention claimed is:

1. An electrochemical water splitting cell, comprising:
    a composite thin film electrode, comprising:
        a transparent conducting substrate, and
        a $CaTiO_3$—$TiO_2$ layer having an average thickness of 2-12 µm adjacent the transparent conducting substrate, the $CaTiO_3$—$TiO_2$ layer comprising crystalline $CaTiO_3$—$TiO_2$ particles having an average diameter of 0.2-2.2 µm,
        wherein the $CaTiO_3$—$TiO_2$ layer comprises 25-87 wt % $CaTiO_3$ and 13-75 wt % $TiO_2$, each relative to a total weight of the $CaTiO_3$—$TiO_2$ layer;
    a counter electrode comprising one or more metals or carbon; and
    an aqueous electrolyte solution in contact with both electrodes.

2. The electrochemical water splitting cell of claim 1, wherein the $CaTiO_3$—$TiO_2$ layer comprises 80-85 wt % $CaTiO_3$ and 15-20 wt % $TiO_2$, each relative to a total weight of the $CaTiO_3$—$TiO_2$ layer.

3. The electrochemical water splitting cell of claim 1, wherein the crystalline $CaTiO_3$—$TiO_2$ particles are substantially spherical.

4. The electrochemical water splitting cell of claim 1, wherein the $TiO_2$ is in anatase phase.

5. The electrochemical water splitting cell of claim 1, wherein the composite thin film electrode has a direct band gap value in a range of 2.5-3.5 eV.

6. The electrochemical water splitting cell of claim 1, wherein the transparent conducting substrate is selected from the group consisting of ITO, FTO, AZO, GZO, IZO, IZTO, IAZO, IGZO, IGTO, and ATO.

7. The electrochemical water splitting cell of claim 1, wherein the transparent conducting substrate has a sheet resistance in a range of 1-40 $\Omega sq^{-1}$.

8. The electrochemical water splitting cell of claim 1, wherein the electrolyte solution comprises water and an inorganic base having a concentration of 0.5-1.5 M.

9. The electrochemical water splitting cell of claim 1, wherein the composite thin film electrode has a current density of 0.45-0.8 mA/cm$^2$ when the electrodes are subjected to a bias potential of 0.6-0.8 V and an illumination of 80-150 mW/cm$^2$.

10. The electrochemical water splitting cell of claim 1, wherein the composite thin film electrode has a charge transfer resistance in a range of 200-400$\Omega$ when subjected to an illumination of 80-150 mW/cm$^2$.

* * * * *